(12) United States Patent
Kawamura

(10) Patent No.: US 10,418,328 B2
(45) Date of Patent: Sep. 17, 2019

(54) SEMICONDUCTOR DEVICE AND METHOD OF MANUFACTURING THE SAME

(71) Applicant: Renesas Electronics Corporation, Tokyo (JP)

(72) Inventor: Takeshi Kawamura, Tokyo (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 0 days.

(21) Appl. No.: 16/033,962

(22) Filed: Jul. 12, 2018

(65) Prior Publication Data

US 2018/0323149 A1 Nov. 8, 2018

Related U.S. Application Data

(60) Continuation of application No. 15/092,151, filed on Apr. 6, 2016, now Pat. No. 10,049,984, which is a (Continued)

(51) Int. Cl.
*H01L 23/528* (2006.01)
*H01L 23/535* (2006.01)
(Continued)

(52) U.S. Cl.
CPC .......... *H01L 23/535* (2013.01); *H01L 21/022* (2013.01); *H01L 21/02126* (2013.01); *H01L 21/28518* (2013.01); *H01L 21/28568* (2013.01); *H01L 21/31055* (2013.01); *H01L 21/31111* (2013.01); *H01L 21/76802* (2013.01); *H01L 21/76805* (2013.01); *H01L 21/76834* (2013.01); *H01L 21/76843* (2013.01);
(Continued)

(58) Field of Classification Search
CPC .......................... H01L 23/535; H01L 29/66477
USPC ........................................ 257/197, 758, 781
See application file for complete search history.

(56) References Cited

U.S. PATENT DOCUMENTS

| 6,130,449 A | 10/2000 | Matsuoka et al. |
| 2004/0192032 A1 | 9/2004 | Ohmori et al. |

(Continued)

FOREIGN PATENT DOCUMENTS

| CN | 101661900 A | 3/2010 |
| JP | 09-283623 A | 10/1997 |

(Continued)

OTHER PUBLICATIONS

Communication dated Jun. 30, 2017 from the State Intellectual Property Office of the P.R.C.in counterpart application No. 201510361964.3.
(Continued)

*Primary Examiner* — Long K Tran
(74) *Attorney, Agent, or Firm* — Sughrue Mion, PLLC

(57) ABSTRACT

An upper surface of a plug (PL1) is formed so as to be higher than an upper surface of an interlayer insulating film (PIL) by forming the interlayer insulating film (PIL) on a semiconductor substrate (1S), completing a CMP method for forming the plug (PL1) inside the interlayer insulating film (PIL), and then, making the upper surface of the interlayer insulating film (PIL) to recede. In this manner, reliability of connection between the plug (PL1) and a wiring (W1) in a vertical direction can be ensured. Also, the wiring (W1) can be formed so as not to be embedded inside the interlayer insulating film (PIL), or a formed amount by the embedding can be reduced.

12 Claims, 59 Drawing Sheets

Related U.S. Application Data continuation of application No. 14/683,788, filed on Apr. 10, 2015, now Pat. No. 9,337,016, which is a division of application No. 13/704,113, filed as application No. PCT/JP2010/060050 on Jun. 14, 2010, now Pat. No. 9,030,014.

(51) Int. Cl.

| | | |
|---|---|---|
| H01L 21/768 | (2006.01) | |
| H01L 21/8234 | (2006.01) | |
| H01L 23/532 | (2006.01) | |
| H01L 29/78 | (2006.01) | |
| H01L 23/48 | (2006.01) | |
| H01L 21/02 | (2006.01) | |
| H01L 21/3105 | (2006.01) | |
| H01L 21/311 | (2006.01) | |
| H01L 21/66 | (2006.01) | |
| H01L 29/66 | (2006.01) | |
| H01L 21/285 | (2006.01) | |
| H01L 23/485 | (2006.01) | |

(52) U.S. Cl.
CPC .. *H01L 21/76852* (2013.01); *H01L 21/76889* (2013.01); *H01L 21/76895* (2013.01); *H01L 21/76897* (2013.01); *H01L 21/823475* (2013.01); *H01L 22/26* (2013.01); *H01L 23/481* (2013.01); *H01L 23/5283* (2013.01); *H01L 23/53238* (2013.01); *H01L 23/53266* (2013.01); *H01L 23/53295* (2013.01); *H01L 29/66477* (2013.01); *H01L 29/7833* (2013.01); *H01L 21/76885* (2013.01); *H01L 23/485* (2013.01); *H01L 2924/0002* (2013.01)

(56) References Cited

U.S. PATENT DOCUMENTS

| | | |
|---|---|---|
| 2006/0270218 A1 | 11/2006 | Park |
| 2010/0052062 A1 | 3/2010 | Fukui et al. |

FOREIGN PATENT DOCUMENTS

| | | |
|---|---|---|
| JP | 2000-114259 A | 4/2000 |
| JP | 2001-085516 A | 3/2001 |
| JP | 2002-319619 A | 10/2002 |
| JP | 2003-347279 | 12/2003 |
| JP | 2004-158832 A | 6/2004 |
| JP | 2005-123327 A | 5/2005 |
| JP | 2006-073635 A | 3/2006 |
| JP | 2006-339623 A | 12/2006 |
| JP | 2008-205032 A | 9/2008 |
| TW | 201013779 A1 | 4/2010 |
| WO | 99/50903 A1 | 10/1999 |

OTHER PUBLICATIONS

Communication dated Aug. 25, 2016 from the Taiwanese Intellectual Property Office in counterpart application No. 104136057.
Communication dated Aug. 15, 2014, from the State Intellectual Property Office of the People's Republic of China in counterpart Chinese Application No. 201080067421.6.
International Search Report of PCT/JP2010/060050 dated Jul. 20, 2010.
Japanese Office Action dated Mar. 4, 2014 in corresponding Japanese Patent Application No. 2012-520181.

SEMICONDUCTOR DEVICE AND METHOD OF MANUFACTURING THE SAME

This is a Continuation of U.S. application Ser. No. 15/092,151, filed Apr. 6, 2016, which is a Continuation of U.S. application Ser. No. 14/683,788 filed on Apr. 10, 2015, which is a divisional application based upon U.S. patent application Ser. No. 13/704,113 filed Dec. 13, 2012, which is a National Stage Entry of International Application No. PCT/JP2010/060050 filed Jun. 14, 2010, the contents of all of which are incorporated herein by reference in their entirety.

TECHNICAL FIELD

The present invention relates to a semiconductor device and a method of manufacturing the same, and, more particularly, the present invention relates to a semiconductor device having the lowermost-layer wiring formed as a buried wiring and relates to a method of manufacturing the same.

BACKGROUND ART

Along with demands for microfabrication, high integration, and high speed of a semiconductor device, it is required to reduce a wiring resistance, reduce an inter-wiring capacitance, and improve reliability of a wiring. For the reduction of the wiring resistance, a copper (Cu) wiring having a lower resistance than that of a conventional aluminum (Al) alloy is used.

For the reduction of the inter-wiring capacitance, instead of conventional silicon oxide ($SiO_2$), an insulating film having a lower dielectric constant than that of the silicon oxide (hereinafter, which is referred to as a low dielectric constant film) is used as an interlayer insulating film of the wiring.

Japanese Patent Application Laid-Open Publication No. 2004-158832 (Patent Document 1) discloses a technique related to a multilayered wiring using a SiOC film as the low dielectric constant film for the interlayer insulating film.

Meanwhile, in a viewpoint of ensuring reliability of connection between a plug and a wiring, the following techniques are disclosed.

Japanese Patent Application Laid-Open Publication No. 2006-339623 (Patent Document 2) discloses a technique for preventing occurrence of voids upon forming a metal layer 104 by selectively etching an interlayer insulating film 102 so that a surface of the uppermost portion of a contact plug 103 in the lowermost layer is lower than a surface of the uppermost portion of the interlayer insulating film 102, and then, forming the metal layer 104 on the interlayer insulating film 102.

Also, Japanese Patent Application Laid-Open Publication No. 2006-73635 (Patent Document 3) discloses a technique for forming a small upper portion of a contact 7 by processing a conductive material deposited on an interlayer insulating film 6.

PRIOR ART DOCUMENTS

Patent Documents

Patent Document 1: Japanese Patent Application Laid-Open Publication No. 2004-158832
Patent Document 2: Japanese Patent Application Laid-Open Publication 2006-339623
Patent Document 3: Japanese Patent Application Laid-Open Publication 2006-73635

DISCLOSURE OF THE INVENTION

Problems to be Solved by the Invention

In recent years, further microfabrication of a semiconductor device has been advanced, and it has been desired to improve performance thereof without various failures.

A preferred aim of the present invention is to improve electric performance of a semiconductor device, and, more particularly, is to reduce delay of a signal transmitted via a wiring.

Also, another preferred aim of the present invention is to improve reliability of a semiconductor device, and, more particularly, is to improve reliability of a wiring.

Further, still another preferred aim of the present invention is to improve electric performance of a semiconductor device and improve reliability of the semiconductor device, and, more particularly, is to reduce delay of a signal transmitted via a wiring and improve reliability of the wiring.

The above and other preferred aims and novel characteristics of the present invention will be apparent from the description of the present specification and the accompanying drawings.

Means for Solving the Problems

The typical ones of the inventions disclosed in the present application will be briefly described as follows.

A method of manufacturing a semiconductor device according to a typical embodiment includes: (a) a step of forming a first interlayer insulating film on a semiconductor substrate; (b) a step of forming a first contact hole in the first interlayer insulating film; and (c) after the step of (b), a step of forming a first conductive film on the semiconductor substrate so as to bury the first conductive film inside the first contact hole. Further, the method includes: (d) a step of removing the first conductive film outside the first contact hole so as to form a first plug made of the first conductive film; (e) after the step of (d), a step of making an upper surface of the first interlayer insulating film to recede so that the upper surface of the first interlayer insulating film is lower than an upper surface of the first plug; and (f) after the step of (e), a step of forming a second interlayer insulating film having a lower dielectric constant than that of silicon oxide, on the semiconductor substrate. Still further, the method includes: (g) a step of forming a first wiring trench in the second interlayer insulating film so that a part of the first plug is exposed and so that a lower surface thereof is lower than an upper surface of the first plug; (h) after the step of (g), a step of forming a second conductive film on the semiconductor substrate so as to bury the second conductive film inside the first wiring trench; and (i) a step of removing the second conductive film outside the first wiring trench so as to form a first wiring made of the second conductive film and connected to the first plug.

Also, a semiconductor device according to a typical embodiment includes: a first interlayer insulating film formed on a semiconductor substrate; a first plug formed inside the first interlayer insulating film; a second interlayer insulating film formed on the first insulating film and having a lower dielectric constant than that of silicon oxide; and a first buried wiring formed inside the second interlayer insulating film and connected to the first plug. And, an upper surface of the first plug is formed at a position higher than an upper surface of the first interlayer insulating film, and a lower surface of the first buried wiring is formed at a position lower than the upper surface of the first plug.

Effects of the Invention

The effects obtained by typical aspects of the present invention disclosed in the present application will be briefly described below.

In a semiconductor device of the present invention, electric performance of the semiconductor device can be improved. More particularly, delay of a signal transmitted via a wiring can be reduced.

Also, effects obtainable by other means will be briefly described below.

In a semiconductor device of the present invention, reliability thereof can be improved. More particularly, reliability of a wiring can be improved.

Further, in a semiconductor device of the present invention, electric performance of the semiconductor device can be improved, and besides, reliability of the semiconductor device can be improved. More particularly, delay of a signal transmitted via a wiring can be reduced, and besides, reliability of a wiring can be improved.

DESCRIPTION OF THE PREFERRED EMBODIMENTS

In the embodiments described below, the invention will be described in a plurality of sections or embodiments when required as a matter of convenience. However, these sections or embodiments are not irrelevant to each other unless otherwise stated, and the one relates to the whole or a part of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable. Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Also, the same components are denoted by the same reference symbols throughout the drawings for describing the embodiments in principle, and the repetitive description thereof is omitted. Note that hatching is used even in a plan view so as to make the drawings easy to see in some cases. Further, hatching is omitted even in a cross-sectional view so as to make the drawings easy to see in some cases.

Each of FIGS. 60 to 65 is a cross-sectional view of a principal part illustrating a step of manufacturing a semiconductor device studied by the present inventor as a comparative example. Hereinafter, with reference to FIGS. 60 to 65, the steps (steps P1 to P6) of manufacturing the semiconductor device studied by the present inventor as the comparative example will be described.

(Step P1)

Figure 60:
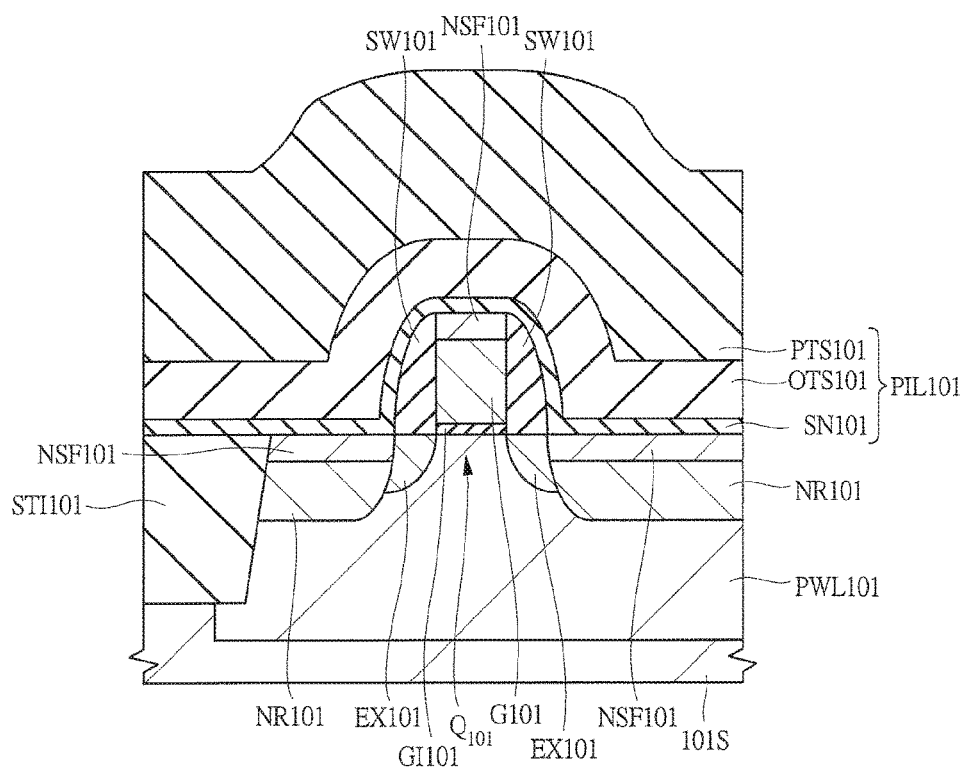
FIG. 60 is a cross-sectional view of a principal part of a semiconductor device as a comparative example studied by the present inventor, in a manufacturing step thereof.

First, as illustrated in FIG. 60, a MISFET $Q_{101}$ is formed on a main surface of a semiconductor substrate 101S by using a publicly-known method. More specifically, an element isolation region STI101, a p-type well PWL101, a gate insulating film GI101, a gate electrode G101, a shallow low-concentration n-type impurity diffusion region EX101, a sidewall SW101, a deep impurity diffusion region NR101, and a metal silicide layer NSF101 are sequentially formed. Then, an interlayer insulating film PIL101 is formed on the semiconductor substrate 101S so as to cover the MISFET $Q_{101}$. As illustrated in FIG. 60, the interlayer insulating film PIL101 is formed of a stacked film made of a silicon nitride film SN101, an $O_3$-TEOS film OTS101, and a plasma TEOS film PTS101 as an insulating film.

(Step 2)

Figure 61:
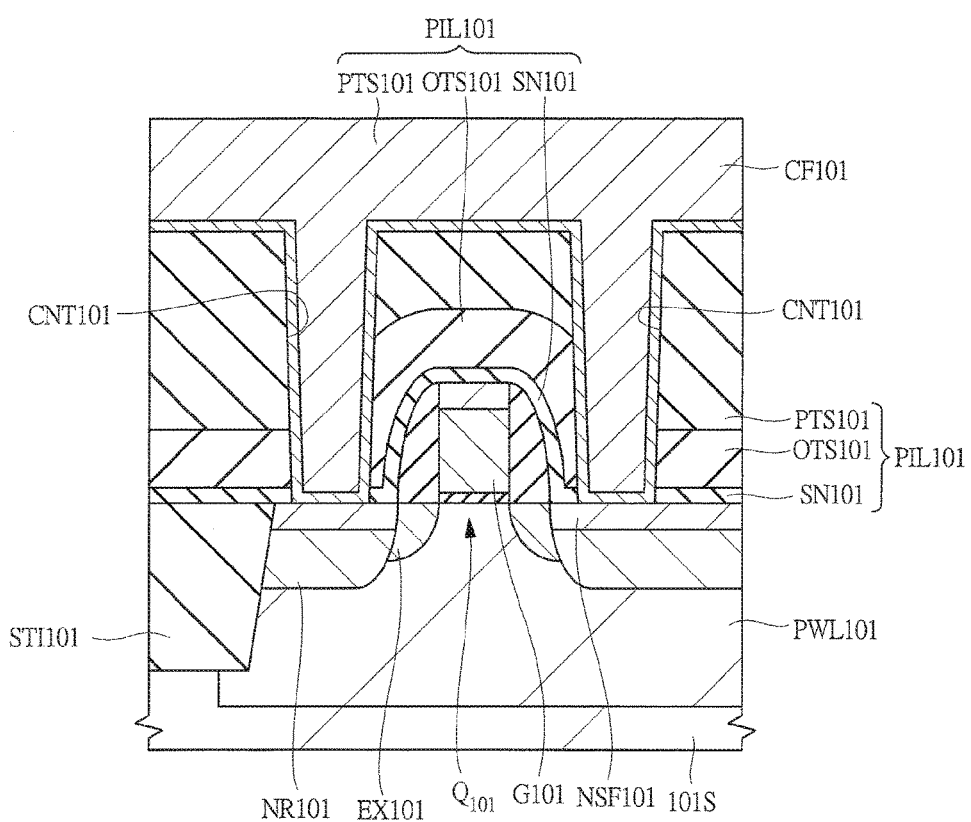
FIG. 61 is a cross-sectional view of the principal part of the semiconductor device as the comparative example in a manufacturing step thereof continued from FIG. 60.

Next, as illustrated in FIG. 61, a contact hole CNT101 is formed in the interlayer insulating film PIL101, and then, a conductive film CF101 is formed on the interlaying insulation PIL101 so that the conductive film CF101 is buried inside the contact hole CNT101.

(Step 3)

Figure 62:
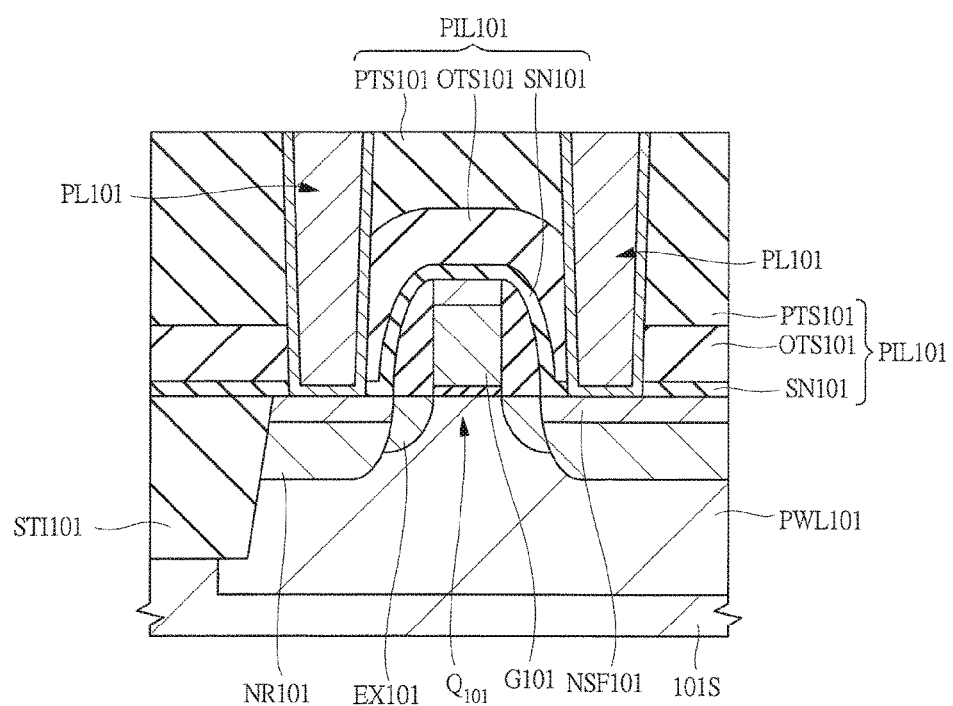
FIG. 62 is a cross-sectional view of the principal part of the semiconductor device as the comparative example in a manufacturing step thereof continued from FIG. 61.

Next, as illustrated in FIG. 62, an unnecessary portion of the conductive film CF101 formed outside the contact hole CNT101 is removed so that the interlayer insulating film PIL101 is exposed. By this step, a plug PL101 is formed. In this step, the plug PL101 is formed so that an upper surface of the plug PL101 is almost as high as an upper surface of the interlayer insulating film PIL101 or so that the height of the upper surface of the plug PL101 is lower than the height of the upper surface of the interlayer insulating film PIL101. FIG. 62 illustrates the case that the upper surface of the plug PL101 is formed almost as high as the upper surface of the interlayer insulating film PIL101.

(Step 4)

Figure 63:
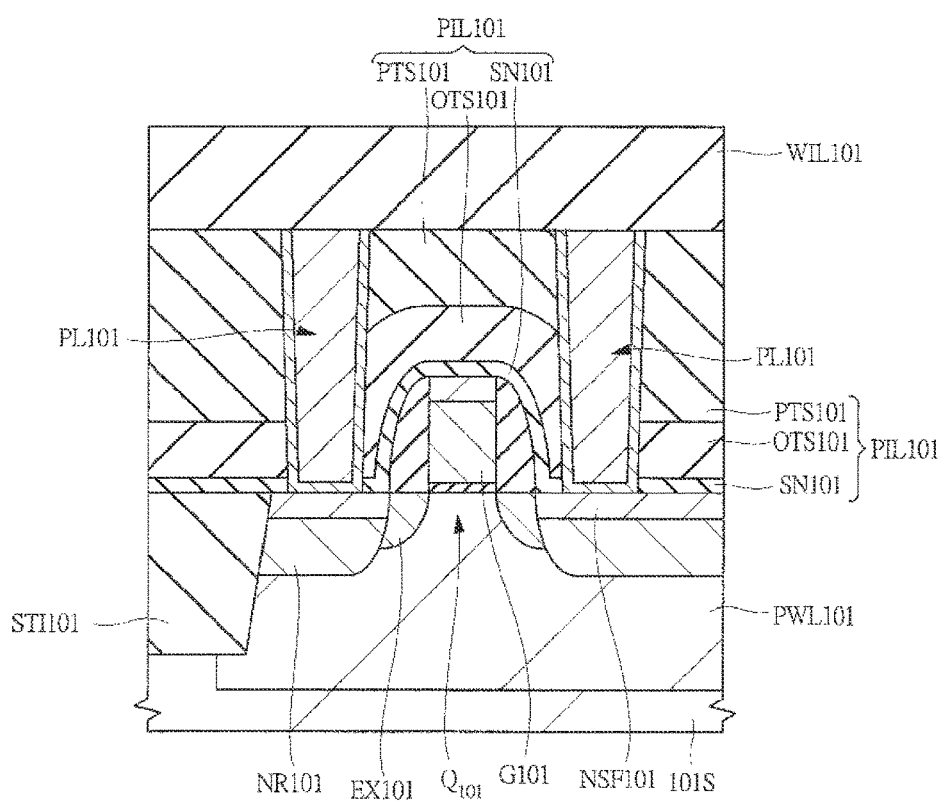
FIG. 63 is a cross-sectional view of the principal part of the semiconductor device as the comparative example in a manufacturing step thereof continued from FIG. 62.

Next, as illustrated in FIG. 63, an interlayer insulating film WIL101 is formed on the plug PL101 and the interlayer insulating film PIL101. The interlayer insulating film WIL101 is formed of a low dielectric constant film on purpose to reduce an inter-wiring capacitance of a wiring to be formed in a later step. A thickness of the interlayer insulating film WIL101 is, for example, 60 nm.

(Step 5)

Figure 64:
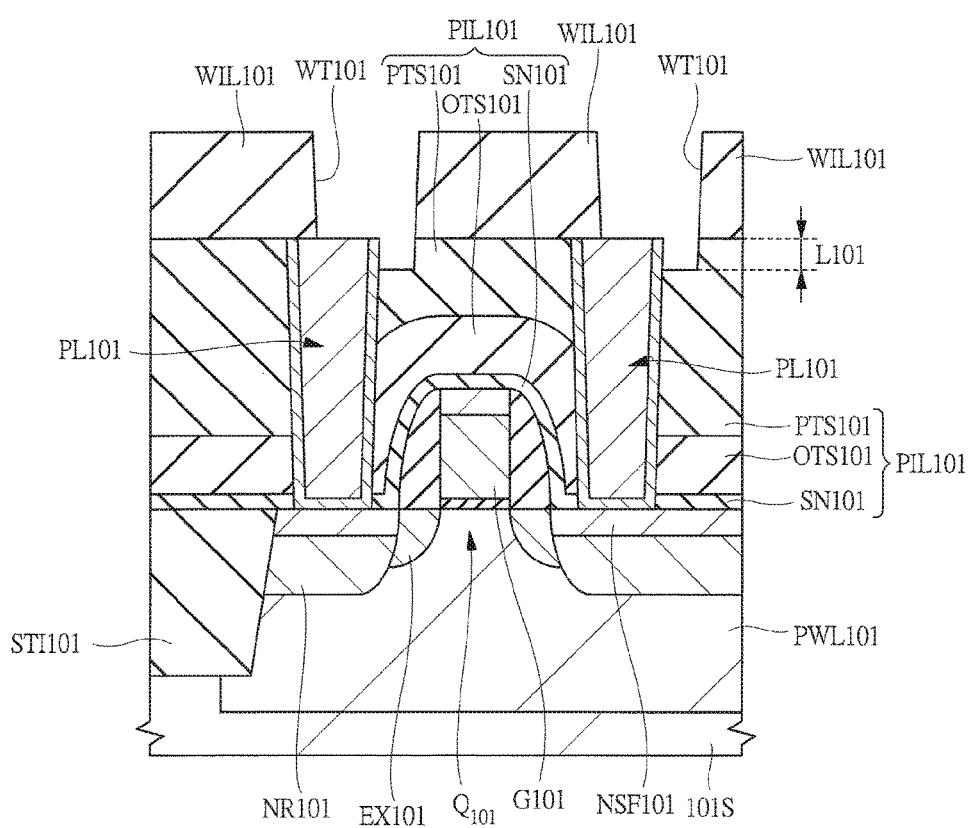
FIG. 64 is a cross-sectional view of the principal part of the semiconductor device as the comparative example in a manufacturing step thereof continued from FIG. 63.

Next, as illustrated in FIG. 64, by processing the interlayer insulating film WIL101 and the interlayer insulating film PIL101, a wiring trench WT101 for a buried wiring is formed inside the interlayer insulating film WIL101 and the interlayer insulating film PIL101. In the above-described step P3, the upper surface of the plug PL101 is formed almost as high as the upper surface of the interlayer insulating film PIL101 or formed lower than the upper surface of the interlayer insulating film PIL101. Therefore, in order to ensure a connection between a wiring (W101) to be formed in a later step and the plug PL101, the wiring trench WT101 is formed inside the interlayer insulating film PIL101 in a state of, for example, 30 nm embedded (buried) from the upper surface of the interlayer insulating film PIL101. That is, the lowermost surface of the wiring trench WT101 is formed at a position which is 30 nm lower than the upper surface of the plug PL101. A depth of the wiring trench WT101 is, for example, 90 nm. In FIG. 64, this embedding depth is illustrated as a length L101.

(Step 6)

Figure 65:
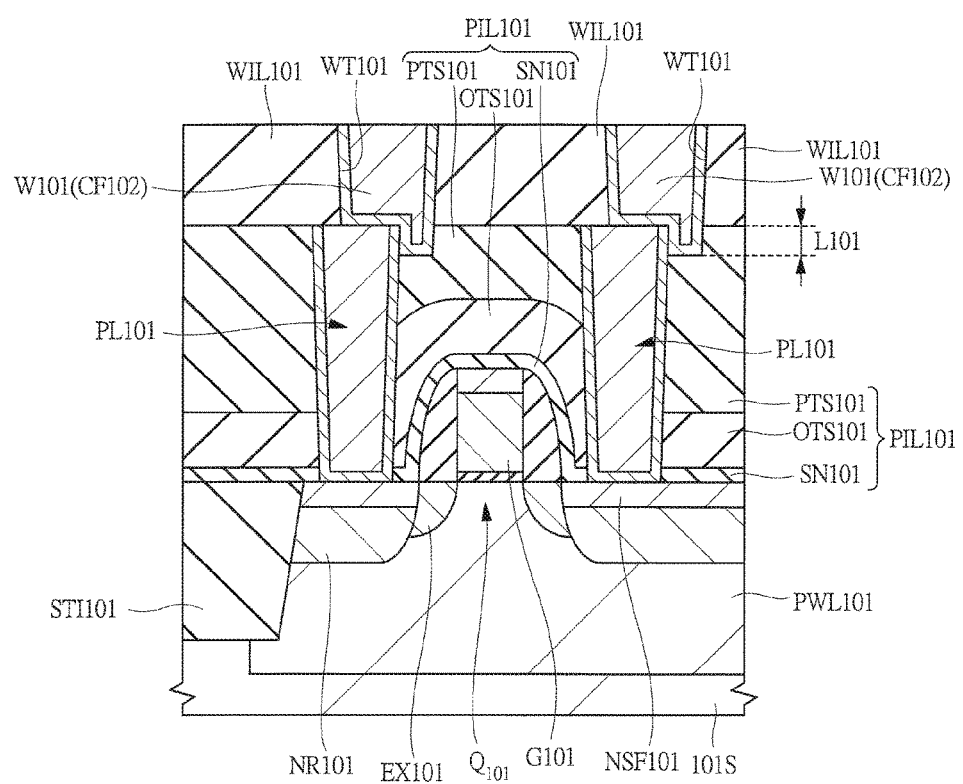
FIG. 65 is a cross-sectional view of the principal part of the semiconductor device as the comparative example in a manufacturing step thereof continued from FIG. 64.

Next, as illustrated in FIG. 65, a wiring W101 is formed by burying a conductive film CF102 into the wiring trench WT101. At this time, by the formation of the wiring trench WT101 inside the interlayer insulating film PIL101 so as to be embedded (buried) therein by the length L101 from the upper surface of the interlayer insulating film PIL101, the wiring W101 formed by burying the conductive film CF102 inside the wiring trench WT101 is also formed inside the interlayer insulating film PIL101 so as to be embedded (buried) therein by the length L101 from the upper surface of the interlayer insulating film PIL101. As a result, a connection between the wiring W101 and the plug PL101 is ensured by the length L101 in a direction perpendicular to the semiconductor substrate 101S. That is, in the manufacturing steps as the comparative example described with reference to FIGS. 60 to 65, the connection between the plug PL101 and the wiring W101 in a vertical direction is ensured by embedding (burying) the wiring trench WT101 (and the wiring W101 buried therein) inside the interlayer insulating film PIL101 by a length (=the length L101) required for ensuring the connection.

However, the present inventor has newly found out that the following problems arise in the manufacturing steps as described above (the manufacturing steps of the comparative example described with reference to FIGS. 60 to 65).

In spite of the fact that the interlayer insulating film WIL101 is formed of the low dielectric constant film, the wiring W101 is embedded (buried) inside the interlayer insulating film PIL101 which is not formed of a low dielectric constant film, by the length L101, and therefore, it is difficult to reduce the inter-wiring capacitance. Also, since the wiring W101 is embedded (buried) inside the interlayer insulating film PIL101 by the length L101, a distance between the wiring W101 and the MISFET $Q_{101}$ is shortened, and therefore, reliability between the wiring W101 and the gate electrode G101 of the MISFET $Q_{101}$ is reduced. Further, since the wiring W101 is embedded (buried) inside the interlayer insulating film PIL101 by the length L101, a distance between the wiring W101 and the $O_3$-TEOS film OTS101 is shortened. However, insulation properties of the $O_3$-TEOS film OTS101 are not excellent, and therefore, reliability of the wiring W101 is reduced by shortening the distance between the wiring W101 and the $O_3$-TEOS film OTS101. Still further, although not illustrated, the wiring trench tends to be formed by deeper embedding (that is, the wiring trench tends to be deeper) in a case that a wiring having a large wiring width is formed than a case that a wiring having a small wiring width is formed upon the formation of the wiring trench. Therefore, each of the above-described problems becomes more obvious.

Hereinafter, the invention made by the present inventor in consideration of the above-described problems will be specifically explained based on embodiments.

First Embodiment

A first embodiment is applied to, for example, a semiconductor device in which an n-channel-type MISFET (MISFET: Metal Insulator Semiconductor Field Effect Transistor) and a p-channel-type MISFET are formed on a semiconductor substrate (semiconductor wafer) 1S, and to a method of manufacturing the same. The semiconductor device and the method of manufacturing the same of the first embodiment will be explained with reference to the drawings.

Figure 1:
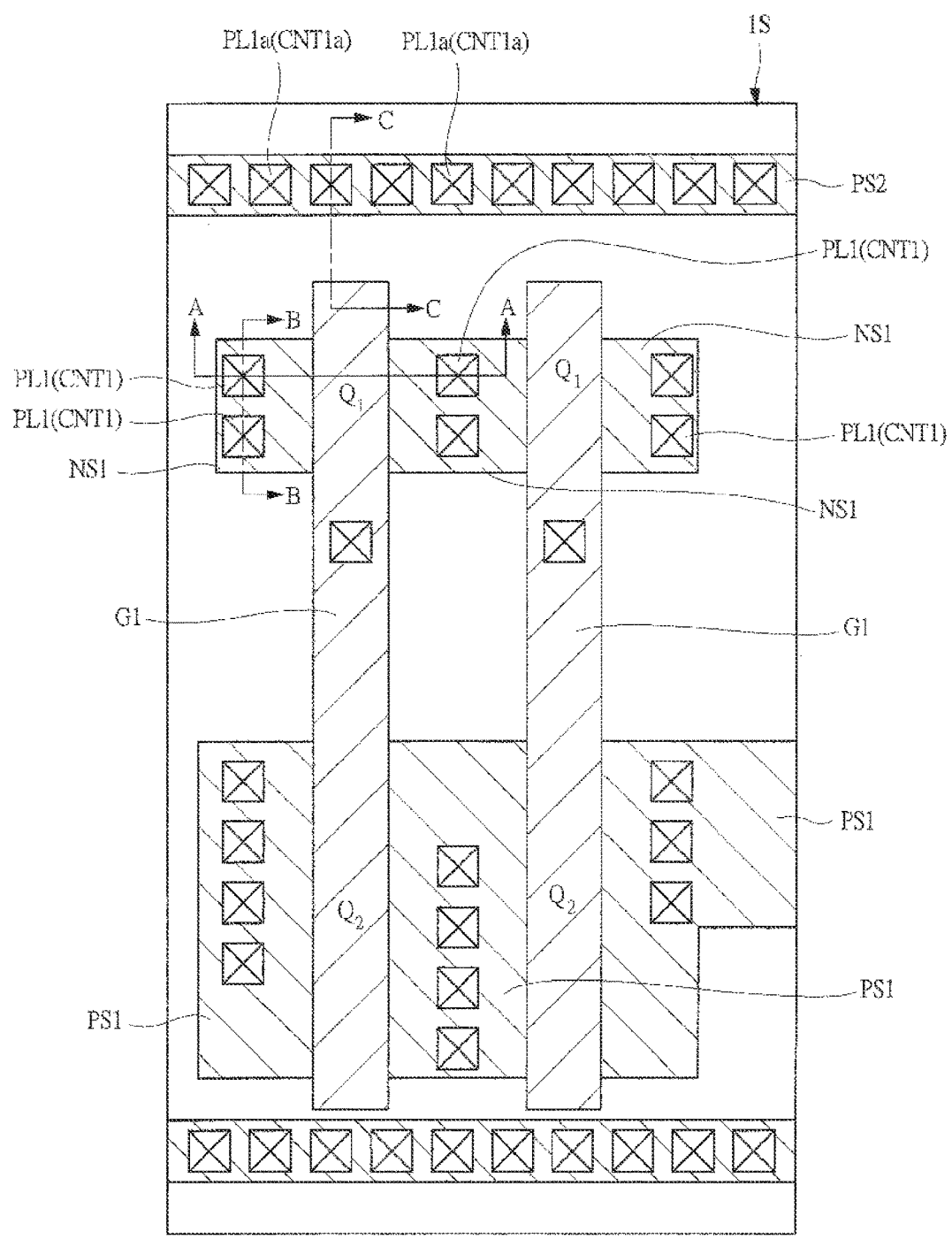
FIG. 1 is a plan view of a principal part of a semiconductor device according to a first embodiment of the present invention.
Figure 2:
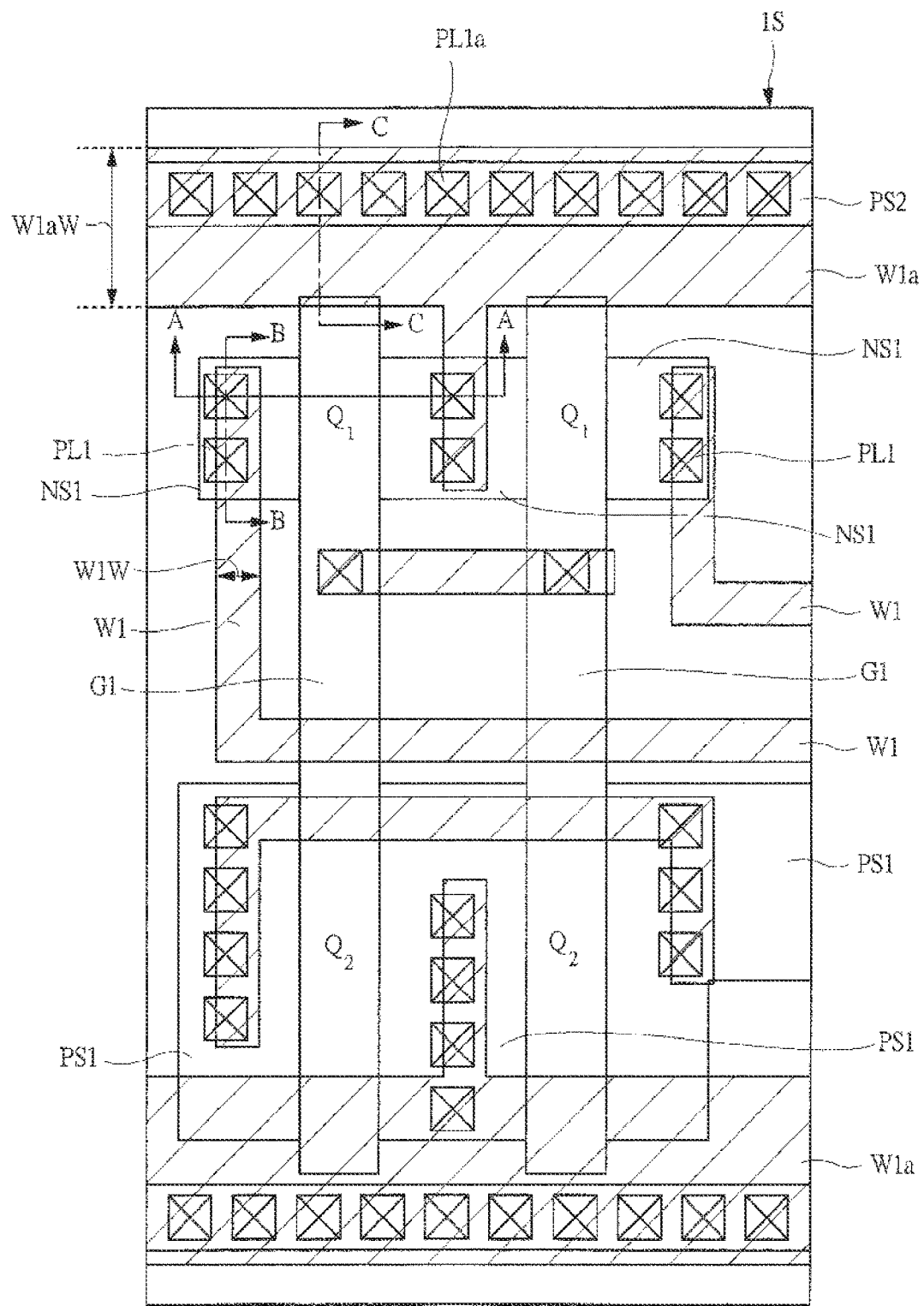
FIG. 2 is a plan view of a principal part of the semiconductor device according to the first embodiment of the present invention.

Each of FIGS. 1 and 2 is a plan view of the semiconductor device according to the first embodiment. FIGS. 1 and 2 illustrate the same planar region as each other in the semiconductor device of the first embodiment, and FIG. 2 corresponds to a drawing obtained by overlaying a first-layer wiring including wirings W1 and W1a on FIG. 1. While FIGS. 1 and 2 are plan views, hatching is attached to the first-layer wiring including the wirings W1 and W1a in FIG. 2, and hatching is attached to a gate electrode G1, an n-type semiconductor region NS1, and p-type semiconductor regions PS1 and PS2 in FIG. 1, in order to easily see the drawings.

Each of FIGS. 1 and 2 illustrates a region where an n-channel-type MISFET Q and a p-channel-type MISFET Q are formed on a main surface of the semiconductor substrate 1S. More specifically, in the planar region illustrated in FIGS. 1 and 2, the gate electrode G1, the n-type semiconductor region NS1 which is a source region or a drain region of the n-channel-type MISFET $Q_1$, and the p-type semiconductor region PS1 which is a source region or a drain region of the p-channel-type MISFET Q are formed. Further, a plug PL1 connected to the p-type semiconductor region PS1 or the n-type semiconductor region NS1, a plug PL2 connected to the p-type semiconductor region PS2, the wiring W1 which is the first-layer wiring connected to the plug PL1, the wiring W2 which is the first-layer wiring connected to the plug PL2, and others are formed therein.

Hereinafter, a cross section taken along a line A-A illustrated in FIGS. 1 and 2 is referred to as a cross section A, a cross section taken along a line B-B illustrated in FIGS. 1 and 2 is referred to as a cross section B, and a cross section taken along a line C-C illustrated in FIGS. 1 and 2 is referred to as a cross section C. Hereinafter, for the purpose of simplification, the semiconductor device and the method of manufacturing the same according to the first embodiment will be explained with reference to the cross section A where the n-channel-type MISFET $Q_1$ is formed.

Figure 3:
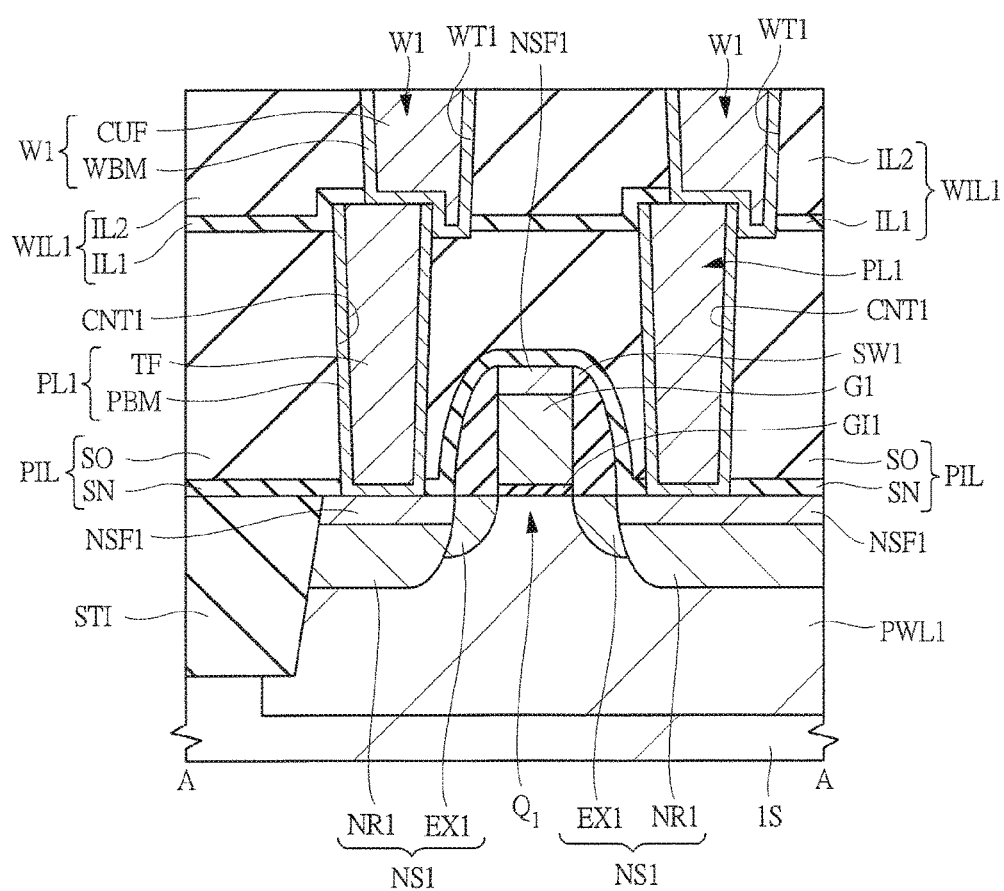
FIG. 3 is a cross-sectional view of a principal part (cross-sectional view taken along a line A-A) of the semiconductor device according to the first embodiment of the present invention.

FIG. 3 is a cross-sectional view of a principal part of the semiconductor device of the first embodiment, and illustrates the cross section A taken along the line A-A in FIGS. 1 and 2. Hereinafter, a structure of the semiconductor device according to the first embodiment will be specifically explained.

As illustrated in FIG. 3, an element isolation region STI is formed in the semiconductor substrate 1S, and a p-type well PWL1 is formed in an active region of the semiconductor substrate 1S which is partitioned (defined) by this element isolation region STI. The p-type well PWL1 is formed of a p-type semiconductor region formed by introducing a p-type impurity such as boron (B) into the semiconductor substrate 1S.

A gate insulating film GI1 is formed on the p-type well PWL1 (the semiconductor substrate 1S), and the gate electrode G1 is formed on this gate insulating film GI1. The gate insulating film GI1 is formed of, for example, a silicon oxide film as an insulating film. The gate electrode G1 is formed of, for example, a polycrystalline silicon film and a metal silicide layer (a metal silicide film) NSF1 formed on an upper portion of this polycrystalline silicon film as a conductive film. The metal silicide layer NSF1 configuring a part of the gate electrode G1 is formed in order to decrease a resistance of the gate electrode G1.

On both side walls of the gate electrode G1, a sidewall (sidewall spacer, sidewall insulating film) SW1 made of an insulating film is formed. A shallow impurity diffusion region (an extension region) EX1 which is a semiconductor region is formed in the p-type well PWL1 (the semiconductor substrate 1S) right below this sidewall SW1. This shallow impurity diffusion region EX1 is an n-type semiconductor region, and is formed so as to be aligned with the gate electrode G1. And, a deep impurity diffusion region NR1 which is a semiconductor region is formed outside this shallow impurity diffusion region EX1. This deep impurity diffusion region NR1 is also an n-type semiconductor region, and is formed so as to be aligned with the sidewall SW1. On a surface (an upper portion) of the deep impurity diffusion region NR1, the metal silicide layer NSF1 is formed in order to decrease the resistance. The deep impurity diffusion region NR1 has a higher impurity concentration (n-type impurity concentration) and a deeper junction depth than those of the shallow impurity diffusion region EX1. By the shallow impurity diffusion region EX1 and the deep impurity diffusion region NR1, the n-type semiconductor region NS1 serving as the source region or the drain region is formed.

In this manner, the n-channel-type MISFET Q is formed in the cross section A. Also, although not illustrated here, a cross-sectional structure of the p-channel-type MISFET Q almost supports a structure in which the p-type well PWL1 is to be an n-type well, each of the shallow impurity diffusion region EX1 and the deep impurity diffusion region NR1 is to be a p-type semiconductor region, and the n-type semiconductor region NS1 is to be a p-type semiconductor region PS1 in FIG. 3 where the n-channel-type MISFET Q is formed. The polycrystalline silicon film in a portion forming the gate electrode G1 of the n-channel-type MISFET $Q_1$ is preferably an n-type polycrystalline silicon film (doped polysilicon film), and the polycrystalline silicon film in a portion forming the gate electrode G1 of the p-channel-type MISFET $Q_2$ is preferably a p-type polycrystalline silicon film (doped polysilicon film).

By the n-channel-type MISFET $Q_1$ and the p-channel-type MISFET Q formed on the main surface of the semiconductor substrate 1S, for example, a word driver, a sense amplifier, a control circuit, or others is configured, and besides, a CPU (circuit), a RAM (circuit), an analog circuit, an I/O circuit, or others is configured.

Subsequently, a wiring structure connected to the n-channel-type MISFET $Q_1$ will be explained.

As illustrated in FIG. 3, on the main surface of the semiconductor substrate 1S (that is, on the n-channel-type MISFET Q₁), the interlayer insulating film PIL is formed so as to cover the n-channel-type MISFET Q₁. The interlayer insulating film PIL is formed of, for example, a stacked film formed of: an insulating film SN made of a silicon nitride film as an insulating film; and an insulating film SO made of a silicon oxide film as an insulating film. In the insulating film SN and the insulating film SO forming the interlayer insulating film PIL, the insulating film SN is on a lower-layer side and the insulating film SO is on an upper-layer side, and therefore, the insulating film SO is formed above the insulating film SN.

In this interlayer insulating film PIL, a contact hole (through hole, hole) CNT1 is formed so as to penetrate through the interlayer insulating film PIL and reach the metal silicide layer NSF1 (that is, the metal silicide layer NSF1 above the deep impurity diffusion region NR1) forming the n-type semiconductor region NS1. Therefore, from a bottom portion of the contact hole CNT1, the metal silicide layer NSF1 formed above the deep impurity diffusion region NR1 is exposed.

Inside (in side walls and a bottom portion of) the contact hole CNT1, a barrier conductor film PBM is formed of, for example, a stacked film formed of a titanium film (a Ti film) and a titanium nitride film (a TiN film) as a conductive film, and a conductor film TF is formed of, for example, a tungsten film as a conductive film so as to be buried in the contact hole CNT1. In this manner, by burying the barrier conductor film PBM and the conductor film TF into the contact hole CNT1, the conductive plug PL1 is formed. Since the plug PL1 is formed so as to fill the contact hole CNT1 of the interlayer insulating film PIL, the plug PL1 can be regarded as being formed inside the interlayer insulating film PIL.

While the plug PL1 is a connecting conductor portion and is buried inside the contact hole CNT1, a height of an upper surface of the interlayer insulating film PIL is lower than a height of an upper surface of the plug PL1. That is, the height of the upper surface of the plug PL1 is higher than the upper surface of the interlayer insulating film PIL. In other words, a part of the plug PL1 protrudes (projects out) from the upper surface of the interlayer insulating film PIL. While the plug PL1 is formed of the barrier conductor film PBM and the conductor film TF as described above, side surfaces and a bottom surface of the plug PL1 are formed of the barrier conductor film PBM, and the other parts (mainly an inside) thereof are formed of the conductor film TF.

Note that, in the present application, it is set that a height or a height position of each of an upper surface, a lower surface, and others of a plug, a wiring, and various types of an insulating film is described as a height or a height position thereof in a direction perpendicular to the main surface of the semiconductor substrate 1S, and a side thereof closer to the main surface of the semiconductor substrate 1S is described as a lower side, and a side thereof farther away from the main surface of the semiconductor substrate 1S is described as a higher side.

In the first embodiment, as described later, after the plug PL1 is formed inside the contact hole CNT1 of the interlayer insulating film PIL, a surface of the insulating film SO, that is, a surface (an upper surface) of the interlayer insulating film PIL, is made to recede so that the upper surface of the plug PL1 is higher than the upper surface of the insulating film SO, that is, the upper surface of the interlayer insulating film PL (that is, the upper surface of the interlayer insulating film PL is lower than the upper surface of the plug PL1).

Therefore, in a manufactured semiconductor device, the height of the upper surface of the plug PL1 is higher than the upper surface of the interlayer insulating film PIL. Therefore, in a wiring W1 to be formed later than the plug PL1, even if an embedded (buried) amount inside the insulating film SO, that is, the interlayer insulating film PIL is decreased, the connection between the plug PL1 and the wiring W1 is ensured.

Figure 25:
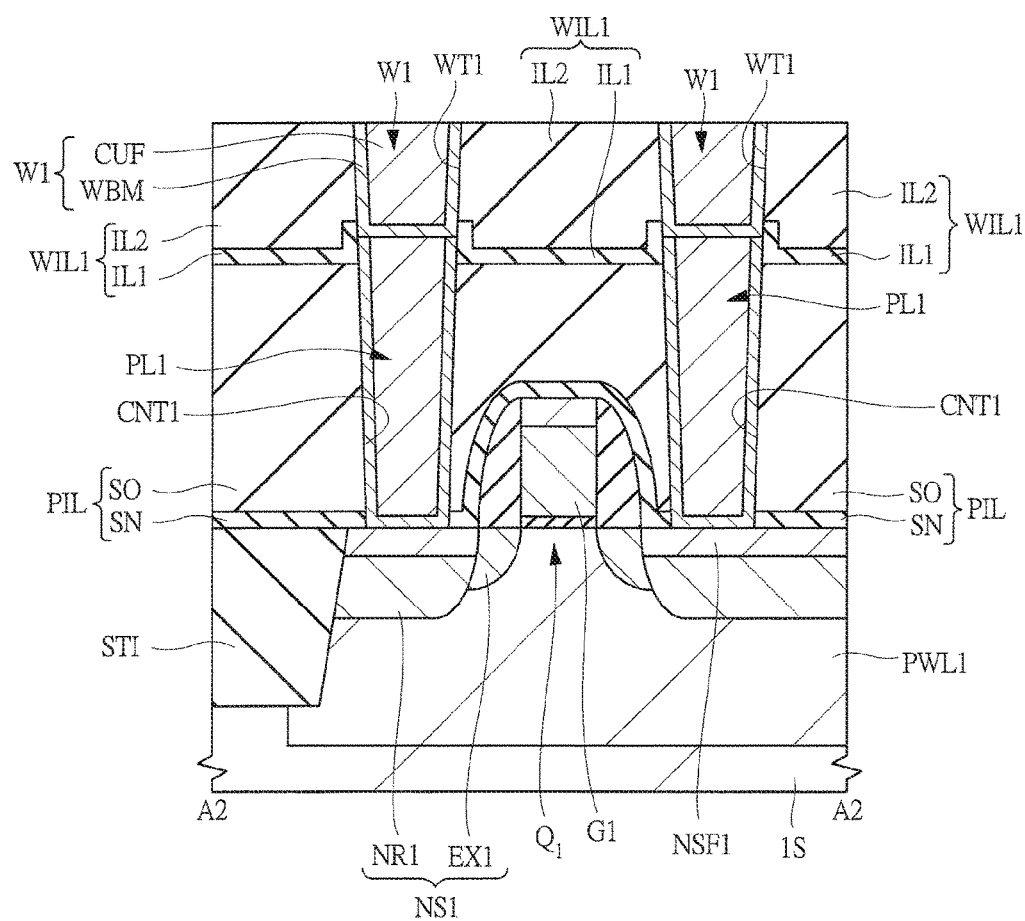
FIG. 25 is a cross-sectional view of a principal part taken along a line A2-A2 in FIG. 24.

An interlayer insulating film WIL1 is formed on the interlayer insulating film PIL in which the plug PL is buried, that is, on the interlayer insulating film PIL and the plug PL1 formed so as to protrude from the interlayer insulating film PIL (the insulating film SO). However, a part or whole of the upper surface of the plug PL1 is covered with the wiring W1. In the case of FIG. 3, a part of the upper surface of the plug PL1 is covered with the wiring W1, and the other part thereof is covered with the interlayer insulating film WIL1. In the case of FIG. 25 described later, the whole of the upper surface of the plug PL1 is covered with the wiring W1.

The interlayer insulating film WIL1 is formed of a stacked film formed of, for example: an insulating film IL1 formed of a silicon oxide film as an insulating film; and an insulating film IL2 formed of a SiOC film which is a silicon oxide film containing carbon as a low dielectric constant film. In the insulating film IL1 and the insulating film IL2 forming the interlayer insulating film WIL1, the insulating film IL1 is on a lower-layer side and the insulating film IL2 is on an upper-layer side, and therefore, the insulating film IL2 is formed above the insulating film IL1.

A wiring trench WT1 is formed in the interlayer insulating film WIL1, and the wiring (buried wiring) W1 is formed so as to be buried inside this wiring trench WT1. The wiring W1 is a buried wiring formed by a damascene technique. A part of the plug PL1 is exposed from the wiring trench WT1, and the plug PL1 exposed from the wiring trench WT1 is in contact with and is electrically connected to the wiring W1 buried in the wiring trench WT1. Therefore, the wiring W1 can be regarded as a buried wiring formed inside the interlayer insulating film WIL1, and besides, a buried wiring connected to the plug PL1.

The reason why the insulating film IL2 is formed of the low dielectric constant film is that a capacitance (inter-wiring capacitance) between adjacent wirings (for example, adjacent wirings W1) is reduced. Also, the insulating film IL1 is an insulating film formed to be sufficiently thinner than the insulating film IL2.

The wiring W1 is formed of a stacked film formed of, for example: a barrier conductor film WBM formed of a tantalum nitride film (a TaN film) as a conductive film; and a conductor film CUF formed of a copper film (a Cu film) as a conductive film, and is electrically connected to the plug PL1 formed inside the interlayer insulating film PIL. While the wiring W1 is formed of the barrier conductor film WBM and the conductor film CUF as described above, side surfaces and a bottom surface of the wiring W1 are formed of the barrier conductor film WBM, and the other parts (mainly an inside) thereof are formed of the conductor film CUF.

As described above, a part of the plug PL1 protrudes from the upper surface of the interlayer insulating film PIL so that the upper surface of the plug PL1 is higher than the upper surface of the insulating film SO, that is, the upper surface of the interlayer insulating film PIL, and therefore, even if the embedded (buried) amount of the wiring W1 inside the insulating film SO, that is, the interlayer insulating film PIL is decreased, the connection between the plug PL1 and the wiring W1 can be ensured. Also, since the embedded (buried) amount of the wiring W1 inside the insulating film SO, that is, the interlayer insulating film PIL is decreased, a surface area of a part of the wiring W1 formed inside the insulating film SO, that is, the interlayer insulating film PIL is decreased, and a surface area of a part of the wiring W1 formed inside the insulating film IL2 which is the low dielectric constant film is increased. Therefore, the capacitance (inter-wiring capacitance) between the wirings W1 can be reduced.

Note that the delay of the signal transmitted via the wiring can be reduced by the reduction in the inter-wiring capacitance, which further results in the improvement of the electronic performance of the semiconductor device.

On the interlayer insulating film WIL1 in which a wiring 41 is formed (buried), a second-layer wiring (such as an interlayer insulating film WIL2, a wiring W2, and a plug PL2, which will be described later) and wiring layers to be formed thereafter are formed. However, illustration and explanation thereof are omitted here.

The semiconductor device according to the first embodiment is configured as described above, and a method of manufacturing the same will be explained below with reference to the drawings.

Figure 16:
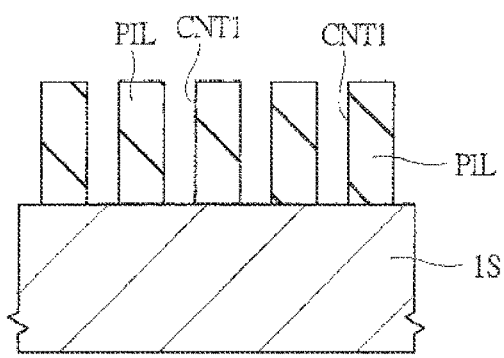
FIG. 16 is an explanatory diagram of still another step of forming the contact hole.
Figure 17:
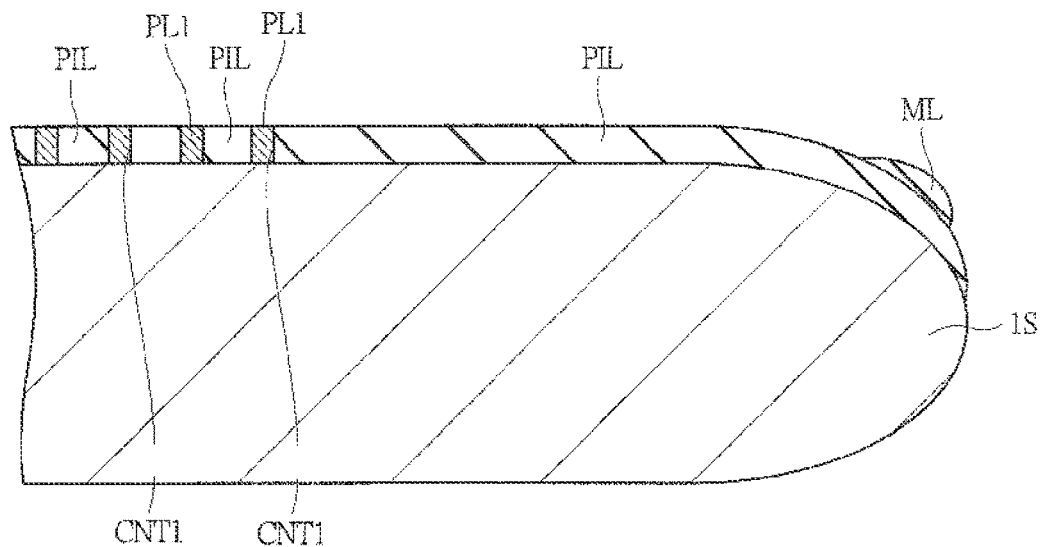
FIG. 17 is a cross-sectional view in the vicinity of the edge portion of the wafer.
Figure 18:
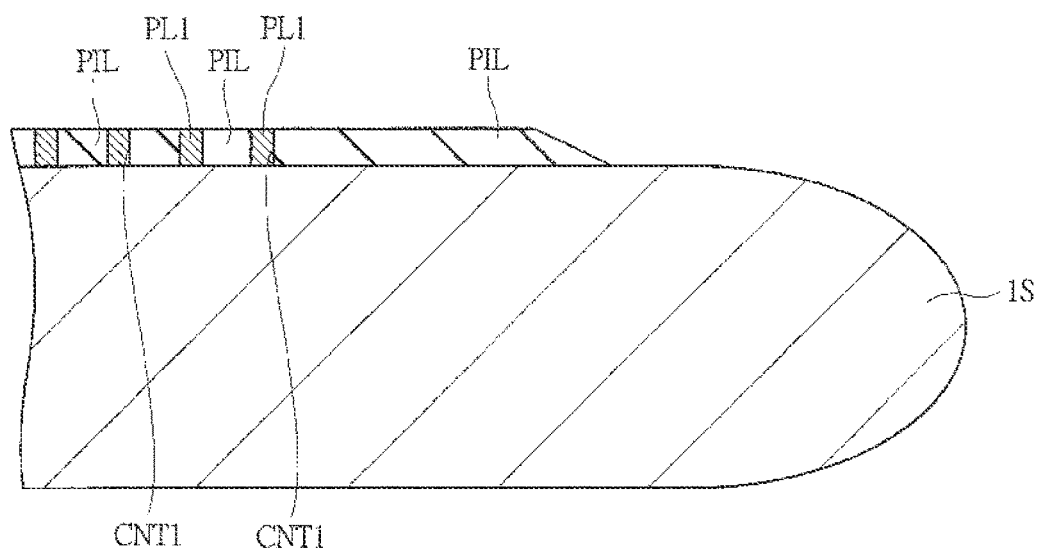
FIG. 18 is a cross-sectional view in the vicinity of the edge portion of the wafer.

Each of FIGS. 4 to 23 is a cross-sectional view of a principal part of the semiconductor device of the first embodiment in a manufacturing step. Among them, each of FIGS. 4 to 10 and 19 to 23 illustrates a cross section corresponding to the cross section A. Also, each of FIGS. 11, 17, and 18 illustrates a cross-sectional view in a vicinity of an edge portion (an end portion) of a wafer (the semiconductor substrate 1S). Further, each of FIGS. 12 to 16 is a cross-sectional view of a principal part of a semiconductor-element formed portion in FIG. 11 (in the vicinity of the edge portion of the wafer), which corresponds to an explanatory diagram for a step of forming the contact hole CNT1.

Figure 4:
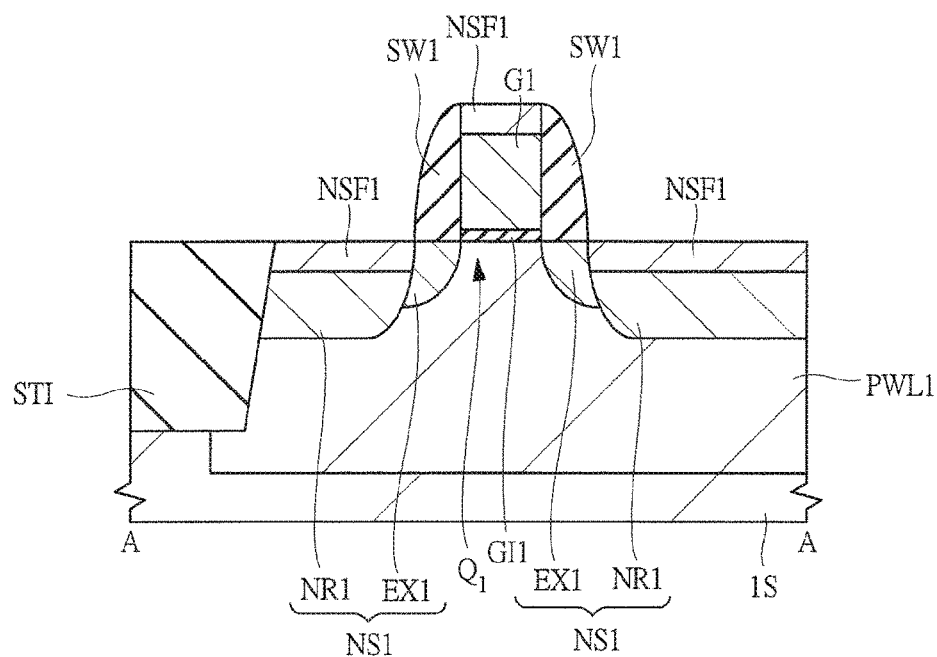
FIG. 4 is a cross-sectional view of a principal part (cross-sectional view taken along the line A-A) of the semiconductor device according to the first embodiment of the present invention in a manufacturing step thereof.

In order to manufacture the semiconductor device of the first embodiment, as illustrated in FIG. 4, the semiconductor substrate 1S made of, for example, p⁻-type monocrystalline silicon is prepared first, and the element isolation region STI is formed on the main surface of the semiconductor substrate 1S. The element isolation region STI can be formed as, for example, follows.

That is, first, a silicon oxide film (a $SiO_2$ film) and a silicon nitride film (a $Si_3N_4$ film) are sequentially formed on the semiconductor substrate 1S, and this silicon nitride film is etched by using a photoresist pattern (a patterned photoresist film). Subsequently, by using this etched silicon nitride film as a mask (an etching mask), a trench (an element isolation trench) is formed in the semiconductor substrate 1S. Then, as an insulating film to be buried inside this trench, for example, a silicon oxide film is deposited on the semiconductor substrate 1S, the silicon oxide film in an outer region of the trench is removed by using a chemical mechanical polishing (CMP) method or others, and the silicon nitride film is further removed by a wet etching method. In this manner, the element isolation region STI is formed of an insulating film (an insulator) buried inside the trench.

Next, the p-type well PWL1 is formed in the semiconductor substrate 1S. The p-type well PWL1 can be formed by forming a photoresist pattern (a patterned photoresist film) on the main surface of the semiconductor substrate 1S by using a photolithography method, and then, ion-implanting an impurity into the semiconductor substrate 1S by using this photoresist pattern as a mask (an ion-implantation blocking mask). At this time, the p-type well PWL1 is formed by implanting ion such as boron (B) as an impurity (p-type impurity) exhibiting a p-type conductivity. Then, ion implantation (channel-dope ion implantation) of an impurity for controlling a threshold value of the n-channel-type MISFET $Q_1$ may be performed into the p-type well PWL1.

Next, after the surface of the semiconductor substrate 1S is washed (rinsed) by dilute hydrofluoric acid or others, for example, an oxide film of silicon (a silicon oxide film) is formed on the main surface (the surface of the p-type well PWL1) of the semiconductor substrate 1S as an insulating film (an insulating film for a gate insulating film), so that the gate insulating film GI1 is formed as illustrated in FIG. 4. The gate insulating film GI1 can be formed by using, for example, a thermal oxidation method. As the gate insulating film GI1, not only the silicon oxide film but also a silicon oxynitride film (a $Si_xO_yN_z$ film) can be used, or a metal oxide film having a higher dielectric constant than that of the silicon nitride film, such as a hafnium oxide film (a $Hf_2O_3$ film), an aluminum oxide film (an $Al_2O_3$ film), or a tantalum oxide film (a $Ta_2O_5$ film) may be used.

Next, the gate electrode G1 is formed on the main surface of the semiconductor substrate 1S (that is, on the gate insulating film GI1). The gate electrode G1 can be formed as, for example, follows.

That is, first, a polycrystalline silicon film to be the gate electrode G1 later is deposited on the whole main surface of the semiconductor substrate 1S. This polycrystalline silicon film can be formed by using, for example, a CVD (Chemical Vapor Deposition) method. Then, this polycrystalline silicon is etched by using a photoresist pattern (a patterned photoresist film) formed as a mask (an etching mask) by a photolithography technique, so that the gate electrode G1 is formed of the patterned polycrystalline silicon film as illustrated in FIG. 4.

Next, by using a photolithography technique and an ion implantation method, the shallow n-type impurity diffusion region EX1 aligned with the gate electrode G1 is formed inside (the p-type well PWL1 of) the semiconductor substrate 1S. This shallow low-concentration n-type impurity diffusion region EX1 is a semiconductor region (an n-type semiconductor region) obtained by introducing an n-type impurity such as phosphorus (P) or arsenic (As) into the semiconductor substrate 1S.

Next, as illustrated in FIG. 4, the sidewall (sidewall spacer, sidewall insulating films) SW1 is formed on both side walls of the gate electrode G1. The sidewall SW1 can be formed by, for example, forming a silicon oxide film as an insulating film on the semiconductor substrate 1S so as to cover the gate electrode G1, and then, dry-etching (anisotropically etching) this silicon oxide film. The sidewall SW1 can be formed of not only the silicon oxide film but also a silicon nitride film or a stacked film formed of a silicon oxide film and a silicon nitride film. The sidewall SW1 is provided in order to form an LDD (Lightly Doped Drain) structure.

Next, by using a photolithography technique and an ion implantation method, the deep n-type impurity diffusion region NR1 aligned with the sidewall SW1 formed on the side walls of the gate electrode G1 is formed inside (the p-type well PWL1 of) the semiconductor substrate 1S as illustrated in FIG. 4. This deep n-type impurity diffusion region NR1 is also a semiconductor region (an n-type semiconductor region) obtained by introducing an n-type impurity such as phosphorus (P) or arsenic (As) into the semiconductor substrate 1S. At this time, to the deep n-type impurity diffusion region NR1, the n-type impurity with a concentration higher than that of the shallow n-type impurity diffusion region EX1 is introduced. That is, the deep n-type impurity diffusion region NR1 is formed so as to have a higher impurity concentration and a deeper junction depth than those of the shallow impurity diffusion region EX1. By the shallow n-type impurity diffusion region EX1 and the deep n-type impurity diffusion region NR1, the n-type semiconductor region NS1 serving as the source region or the drain region of the n-channel-type MISFET $Q_1$ is formed.

Next, in order to reduce the resistance value of the gate electrode G1, an upper portion of the gate electrode G1 is reacted to form silicide and form the metal silicide layer NSF1, so that the gate electrode G1 has a stacked structure formed of the polycrystalline silicon film and the metal silicide layer NSF1 thereon as illustrated in FIG. 4. Similarly, in order to reduce the resistance also in the n-type semiconductor region NS1, the metal silicide layer NSF1 is formed on the surface of (the deep n-type impurity diffusion region NR1 of) the n-type impurity diffusion region NR1. In the first embodiment, a nickel silicide layer (a NiSi layer) is formed as the metal silicide layer NSF1. The metal silicide layer NSF1 above the gate electrode G1 and the metal silicide layer NSF1 above (the deep n-type impurity diffusion region NR1 of) the n-type impurity diffusion region NR1 can be formed by a Salicide (Self Aligned Silicide) process in the same step. Hereinafter, the step of forming the metal silicide layer NSF1 will be explained.

That is, first, for example, a nickel film (a Ni film) is formed on the semiconductor substrate 1S as a conductive film (a metal film). At this time, the nickel film is in contact with (the polycrystalline silicon film which forms) the gate electrode G1 and a region whose surface is exposed in the n-type impurity diffusion region NR1. Then, a heat treatment is performed to the semiconductor substrate 1S. In this manner, the nickel film is reacted with a part of (the polycrystalline silicon film which forms) the gate electrode G1 and (the monocrystalline silicon which forms) the n-type impurity diffusion region NR1 in contact with the nickel film, so that the nickel silicide layer is formed. Then, an unreacted nickel film is removed from the semiconductor substrate 1S. Note that the nickel silicide layer is formed as the metal silicide layer NSF in the first embodiment. However, instead of the nickel silicide layer, for example, a cobalt silicide layer (a $CoSi_2$ layer), a titanium silicide layer (a $TiSi_2$ layer), or a platinum silicide layer (a PtSi layer) may be formed as the metal silicide layer NSF.

As described above, the n-channel-type MISFET $Q_1$ is formed in the semiconductor substrate 1S. When the p-channel-type MISFET $Q_2$ is formed, each polar character (conductive type) of the impurities of the well region (the p-type well PWL1) of the above-described n-channel-type MISFET $Q_1$, the source region and the drain region (the n-type impurity diffusion region NR1) thereof, and the gate electrode (the gate electrode G1) thereof is changed to be opposite thereto.

Next, a wiring step (a step of forming a wiring layer) will be explained.

Figure 5:
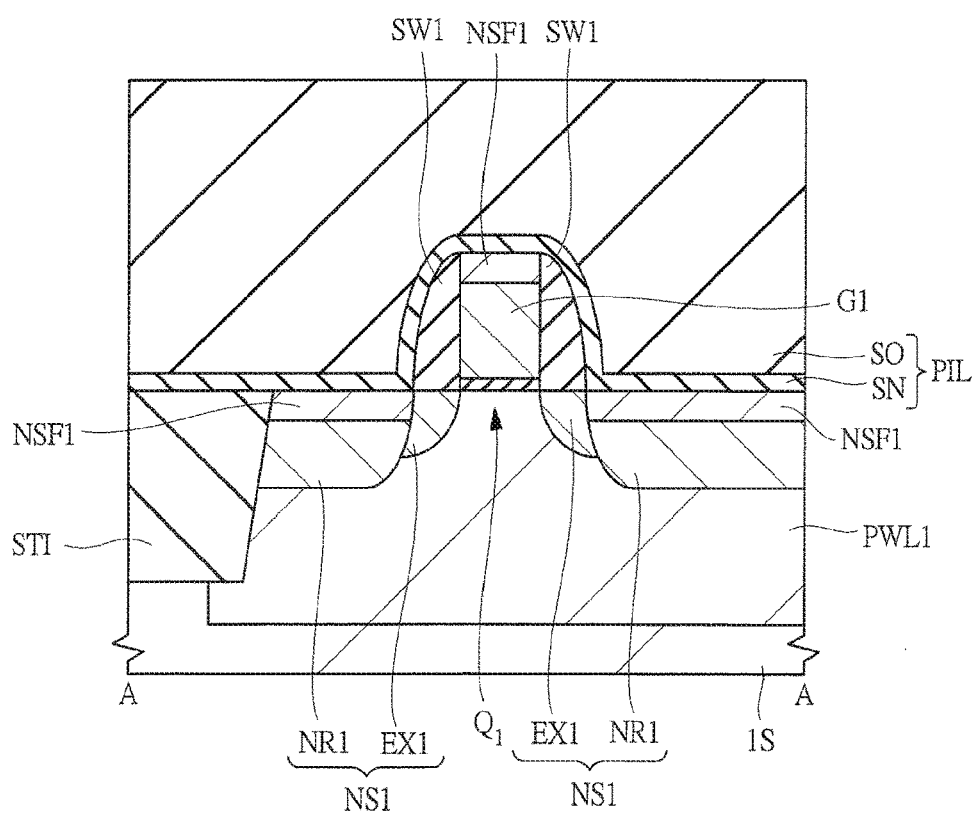
FIG. 5 is a cross-sectional view of the principal part (cross-sectional view taken along the line A-A) of the semiconductor device in a manufacturing step thereof continued from FIG. 4.

As illustrated in FIG. 5, the insulating film SN is formed on the semiconductor substrate 1S in which the n-channel-type MISFET $Q_1$ is formed so as to cover the n-channel-type MISFET $Q_1$. That is, the insulating film SN is formed on the semiconductor substrate 1S including a portion on the metal silicide layer NSF1 so as to cover the gate electrode G1 and the sidewall SW1. The insulating film SN is formed of, for example, a silicon nitride film as an insulating film, and can be formed by using a CVD method. A thickness of the insulating film SN is, for example, 10 nm which is thinner than that of the insulating film SO to be formed later.

Then, the insulating film (the interlayer insulating film) SO is formed on the insulating film SN. The insulating film SO is formed of, for example, an $O_3$-TEOS film, a P-TEOS film, or a stacked film formed of the $O_3$-TEOS film and the P-TEOS film, as an insulating film. The $O_3$-TEOS film is a silicon oxide film which is formed at normal pressure with using TEOS (Tetraethylorthosilicate) and ozone ($O_3$) as raw materials, and the P-TEOS film is a silicon oxide film which is formed under plasma with using TEOS as a raw material. After the insulating film SN and the insulating film SO are formed, the stacked film formed of the insulating film SN and the insulating film SO is planarized by a CMP method. A thickness of the insulating film SO is, for example, 145 nm. By the insulating film SN and the insulating film SO, the interlayer insulating film PIL is formed. Since the planarizing process by the CMP method is performed as described above, an upper surface of the interlayer insulating film PIL is planarized at this stage.

Figure 6:
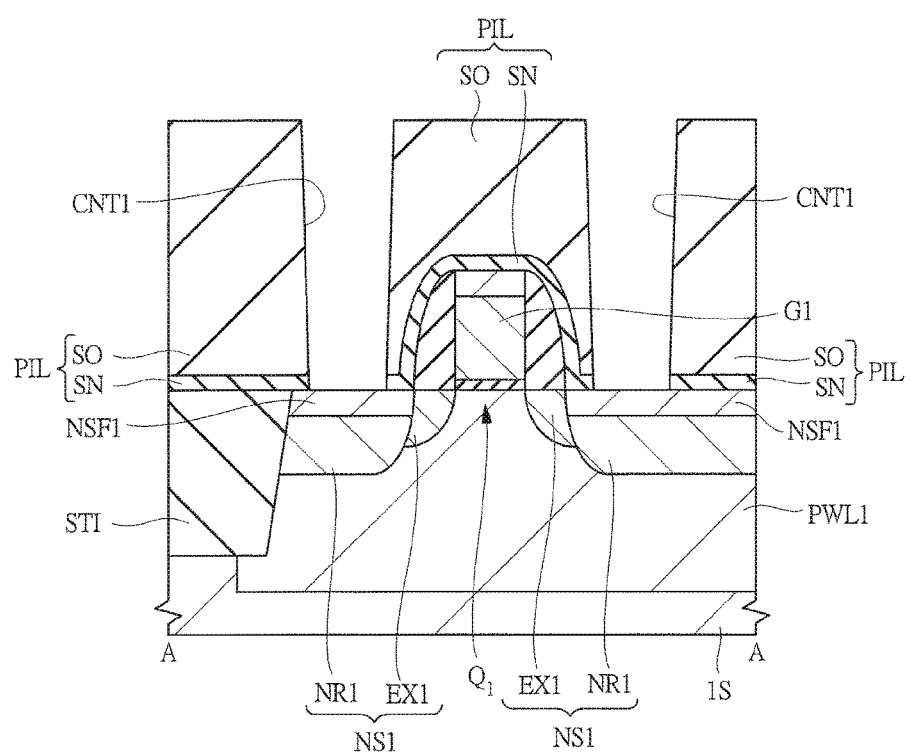
FIG. 6 is a cross-sectional view of the principal part (cross-sectional view taken along the line A-A) of the semiconductor device in a manufacturing step thereof continued from FIG. 5.

Next, as illustrated in FIG. 6, the contact hole (through hole, hole) CNT1 is formed in the interlayer insulating film PIL. The contact hole CNT1 can be formed by performing the dry-etching to the interlayer insulating film PIL by using a photoresist pattern (a patterned photoresist film) formed on the interlayer insulating film PIL by a photolithography technique as a mask (an etching mask). The contact hole CNT1 is formed so as to penetrate through the interlayer insulating film PIL and reach the metal silicide layer NSF1 formed on the n-type impurity diffusion region NR1 (the deep impurity diffusion region NR1). Therefore, from a bottom portion of the contact hole CNT1, a part of the metal silicide layer NSF1 formed on the n-type impurity diffusion region NR1 (the deep impurity diffusion region NR1) is exposed.

When the contact hole CNT1 is formed, dry etching is performed first to the insulating film SO by using the insulating film SN as an etching stopper so as to form the contact hole CNT1 in the insulating film SO, and then, the insulating film SN on the bottom portion of the contact hole CNT1 is removed by dry etching, so that the contact hole CNT1 penetrating through the interlayer insulating film PIL is formed. In this manner, the insulating film SN is formed for so-called SAC (Self Align Contact).

Figure 7:
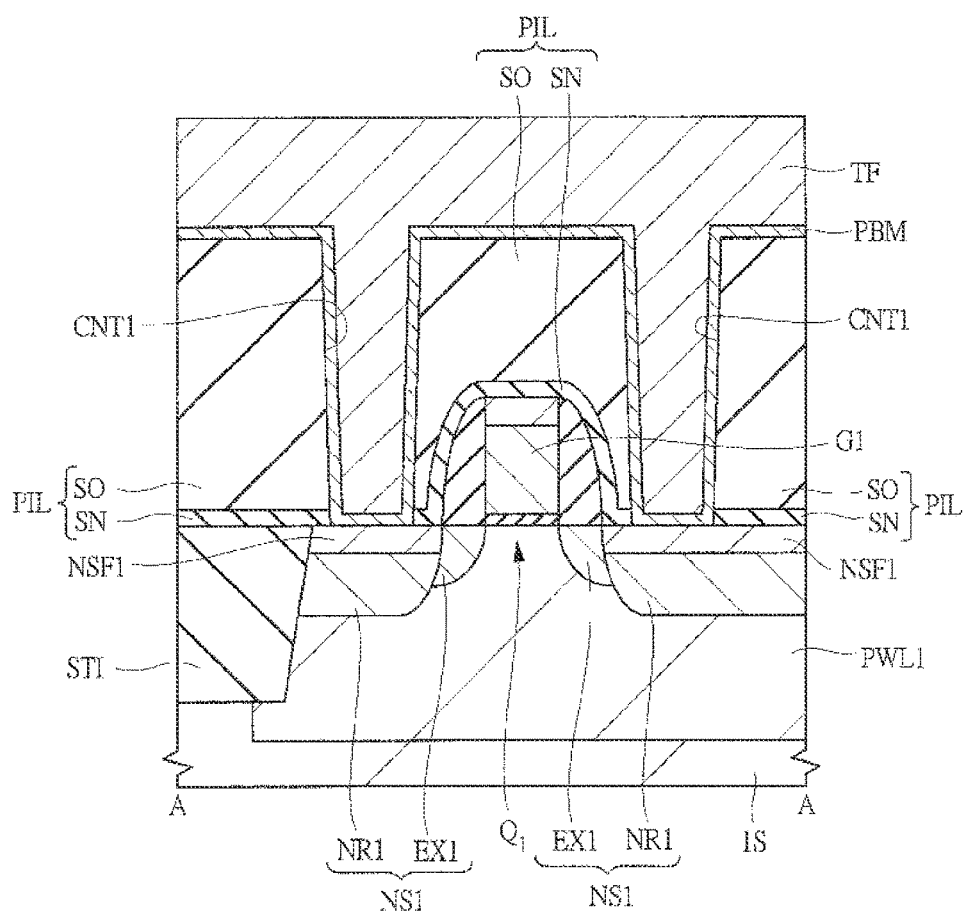
FIG. 7 is a cross-sectional view of the principal part (cross-sectional view taken along the line A-A) of the semiconductor device in a manufacturing step thereof continued from FIG. 6.

Next, as illustrated in FIG. 7, the barrier conductor film PBM is formed on the semiconductor substrate 1S. More specifically, the barrier conductor film PBM is formed on the interlayer insulating film PIL including an inner wall (the side surfaces and the bottom portion) of the contact hole CNT1. In the first embodiment, the barrier conductor film PBM is formed of, for example, a stacked film formed of a titanium film (on a lower-layer side) and a titanium nitride film (on an upper-layer side) as a conductor film, and can be formed by using, for example, a sputtering method. This barrier conductor film PBM is formed in order to prevent diffusion of tungsten to be buried into the silicon oxide film (the insulating film SO) in a later step. The barrier conductor film PBM may be a conductive film having such a function, and may be formed of, for example, a single layer of a titanium film or a titanium nitride film.

Next, the conductor film TF is formed on the barrier conductor film PBM. The conductor film TF is formed of, for example, a tungsten film (a W film) as a conductor film. The conductor film TF is formed so as to be buried inside the contact hole CNT1, and can be formed by using, for example, a CVD method.

In this manner, the inside of the contact hole CNT1 is filled with the barrier conductor film PBM and the conductor film TF, and a plug can be formed in a later step. However, the barrier conductor film PBM and the conductor film TF cannot be formed only inside the contact hole CNT1, and therefore, when these films are formed, the barrier conductor film PBM and the conductor film TF are formed not only inside the contact hole CNT1 but also on the interlayer insulating film PIL in addition to the inside of the contact hole CNT1 as illustrated in FIG. 7. Therefore, after the barrier conductor film PBM and the conductor film TF are formed, it is required to remove unnecessary portions of the barrier conductor film PBM and the conductor film TF formed outside the contact hole CNT1 so that the barrier conductor film PBM and the conductor film TF remain only inside the contact hole CNT1 as described later.

Figure 8:
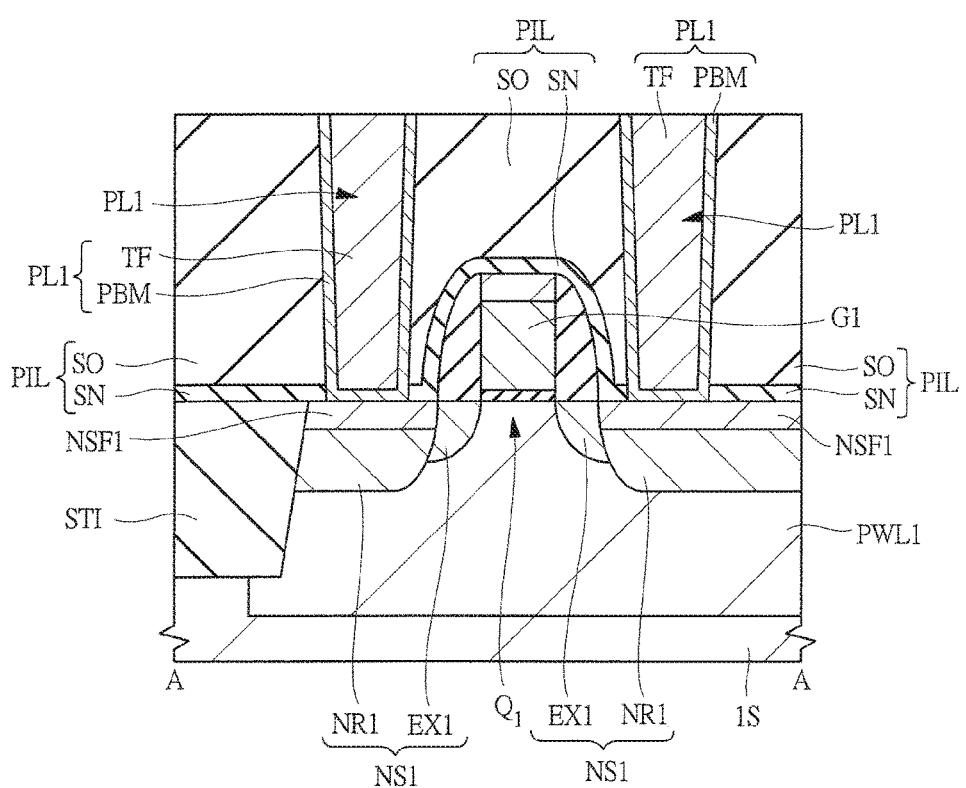
FIG. 8 is a cross-sectional view of the principal part (cross-sectional view taken along the line A-A) of the semiconductor device in a manufacturing step thereof continued from FIG. 7.

Next, as illustrated in FIG. 8, the unnecessary portions of the conductor film TF and the barrier conductor film PBM formed outside the contact hole CNT1 are removed by a CMP method. In this manner, (an upper surface) of the insulating film SO is exposed, and the plug PL1 is formed inside the interlayer insulating film PIL (more specifically, inside the contact hole CNT1). The plug PL1 is formed of the barrier conductor film PBM and the conductor film TF which are buried and remain inside the contact hole CNT1.

In the first embodiment, the interlayer insulating film PIL is formed of the insulating film SN and the insulating film SO formed on the insulating film SN. Thus, in the first embodiment, the upper surface of the interlayer insulating film PIL is namely the upper surface of the insulating film SO. Therefore, in the following steps, the upper surface of the insulating film SO is used synonymously with the upper surface of the interlayer insulating film PIL. Also, the inside of the insulating film SO is used synonymously with the inside of the interlayer insulating film PIL.

Figure 9:
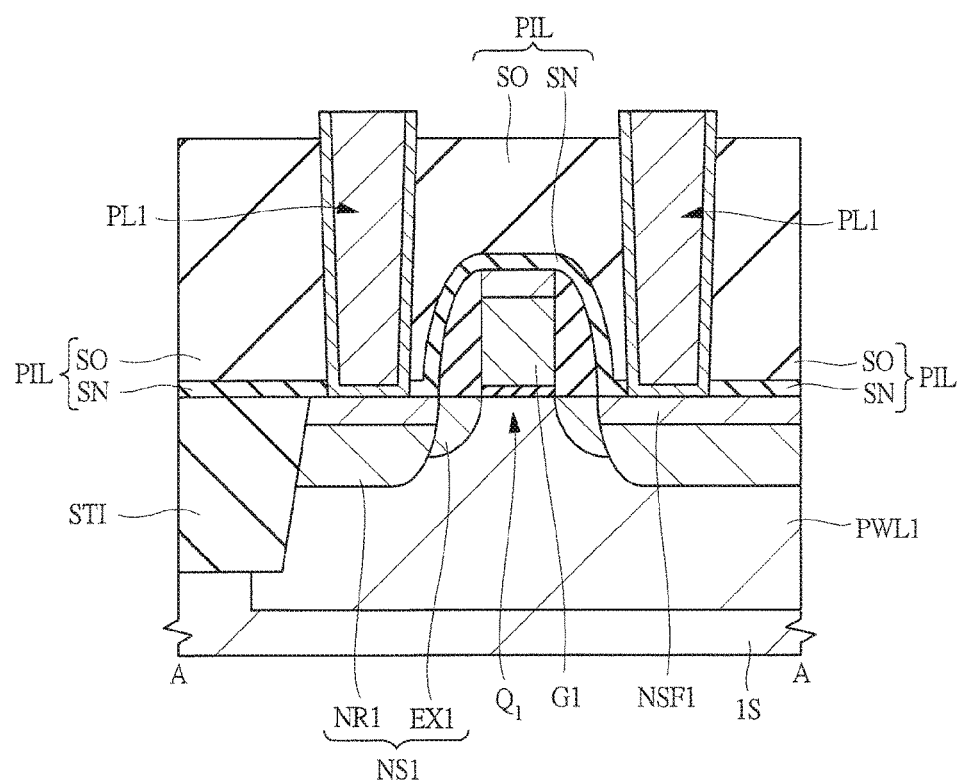
FIG. 9 is a cross-sectional view of the principal part (cross-sectional view taken along the line A-A) of the semiconductor device in a manufacturing step thereof continued from FIG. 8.

Next, as illustrated in FIG. 9, by making the upper surface of the insulating film SO to recede by etching, the upper surface of the insulating film SO is made lower than the upper surface of the plug PL1. That is, the upper surface of the insulating film SO is made to recede so that the upper surface of the insulating film SO is lower than the upper surface of the plug PL1. In this manner, a part of the plug PL1 is protruded from the upper surface of the insulating film SO. For example, by making the upper surface of the insulating film SO to recede by 25 nm by etching, the upper surface of the insulating film SO is made lower than the upper surface of the plug PL1 by 25 nm, so that the plug PL1 is protruded by 25 nm from the upper surface of the insulating film SO. Note that the recession of the upper surface of the insulating film SO corresponds to the thinning of the insulating film SO so that the height position of the upper surface of the insulating film SO is lowered.

Since the insulating film SO is etched in this step (the step illustrated in FIG. 9), a thickness of the insulating film SO in FIG. 9 is thinner by, for example, 25 nm, than a thickness of the insulating film SO obtained at the planarization period in the step illustrated in FIG. 5 described above. However, if the thickness of the insulating film SO formed above the n-channel-type MISFET $Q_1$ is too thin, there is a possibility of reduction in reliability between the wiring W1 to be formed in a later step and the gate electrode G1 of the n-channel-type MISFET $Q_1$. Therefore, it is required to set the thickness of the insulating film SO formed in the step illustrated in FIG. 5 described above and an etching amount of the insulating film SO in this step (the step illustrated in FIG. 9) so as to ensure a desired thickness capable of ensuring the reliability between the wiring W1 to be formed in a later step and the gate electrode G1 of the n-channel-type MISFET Q as the thickness of the insulating film SO obtained at the stage of FIG. 9.

Also, the etching of this step (the step illustrated in FIG. 9) can be either of dry etching and wet etching as long as the insulating film SO can be selectively etched with respect to the conductive film TF (the plug PL1). That is, for the step illustrated in FIG. 9 (the step of making the upper surface of the insulating film SO to recede), etching with selectivity for the insulating film SO can be used, that is, etching under an etching condition which allows the insulating film SO to be etched easier than the plug PL1 (in other words, an etching condition which allows an etching speed of the insulating film SO to be higher than an etching speed of the plug PL1) can be used.

In the first embodiment, after the unnecessary portions of the conductor film TF and the barrier conductor film PBM are removed by using the CMP method, the upper surface of the insulating film SO is made to recede by the etching (that is, the height position of the upper surface of the insulating film SO is made lower by the etching), so that the upper surface of the plug PL1 is made higher than the upper surface of the insulating film SO. However, the method is not limited to such a method. By optimizing a polishing liquid used in the CMP method, the CMP method can be used all from the step of removing the conductor film TF and the barrier conductor film PBM formed outside the contact hole CNT1 to the step of making the upper surface of the insulating film SO to recede. In this case, the CMP method with the selectivity for the insulating film SO can be used in the step illustrated in FIG. 9 (the step of making the upper surface of the insulating film SO to recede).

For example, the polishing (removal) of the conductor film TF and the barrier conductor film PBM formed outside the contact hole CNT1 and the recession of (the upper surface of) the insulating film SO can be performed by using one type of the polishing liquid (CMP polishing liquid). In this case, a polishing liquid is used, the polishing liquid having a higher selectivity for the insulating film SO, that is, the polishing liquid having a higher polishing speed for the insulating film SO than that for the conductor film TF and the barrier conductor film PBM. When the polishing is performed by the CMP method with using this polishing liquid, the polishing amount of the insulating film SO becomes larger than the polishing amounts of the conductor film TF and the barrier conductor film PBM after the conductor film TF and the barrier conductor film PBM formed outside the contact hole CNT1 are removed by the polishing so as to expose the insulating film SO, and therefore, the insulating film SO can be made to recede (by, for example, 25 nm) from the upper surface of the plug PL1 as illustrated in FIG. 9. When this method is adopted, the above-described dry etching step is not required, and therefore, there is a merit that the steps can be simplified.

In the forming method described above, the step of polishing the conductor film TF to the step of making the insulating film SO to recede after the insulating film SO is exposed are performed with one type of the polishing liquid. However, the polishing is not limited to the CMP method with one type of the polishing liquid as described above, and is possible with two types of polishing liquids. For example, the polishing by the CMP method is performed with the polishing liquid having the high selectivity for the conductor film TF and the barrier conductor film PBM, that is, the polishing liquid having the higher polishing speed for the conductor film TF and the barrier conductor film PBM than that for the insulating film SO until the conductor film TF and the barrier conductor film PBM formed outside the contact hole CNT1 are polished so as to expose the insulating film SO. And, after the conductor film TF and the barrier conductor film PBM formed outside the contact hole CNT1 are removed by the polishing so as to expose the insulating film SO, the polishing by the CMP method is performed with the polishing liquid having the higher selectivity for the insulating film SO, that is, the polishing liquid having the higher polishing speed for the insulating film SO than those for the conductor film TF and the barrier conductor film PBM. In this manner, when the conductor film TF and the barrier conductor film PBM formed outside the contact hole CNT1 are polished, by using the polishing liquid having the higher selectivity for the conductor film TF and the barrier conductor film PBM, the time for polishing the conductor film TF and the barrier conductor film PBM required to expose the insulating film SO can be shortened. In the CMP method with the two types of polishing liquids, the polishing can be performed by using the same apparatus, or, different apparatuses can be used for the respective polishing liquids.

Next, the first-layer wiring is formed by a single damascene method. Hereinafter, a method of forming the first-layer wiring will be explained.

Figure 10:
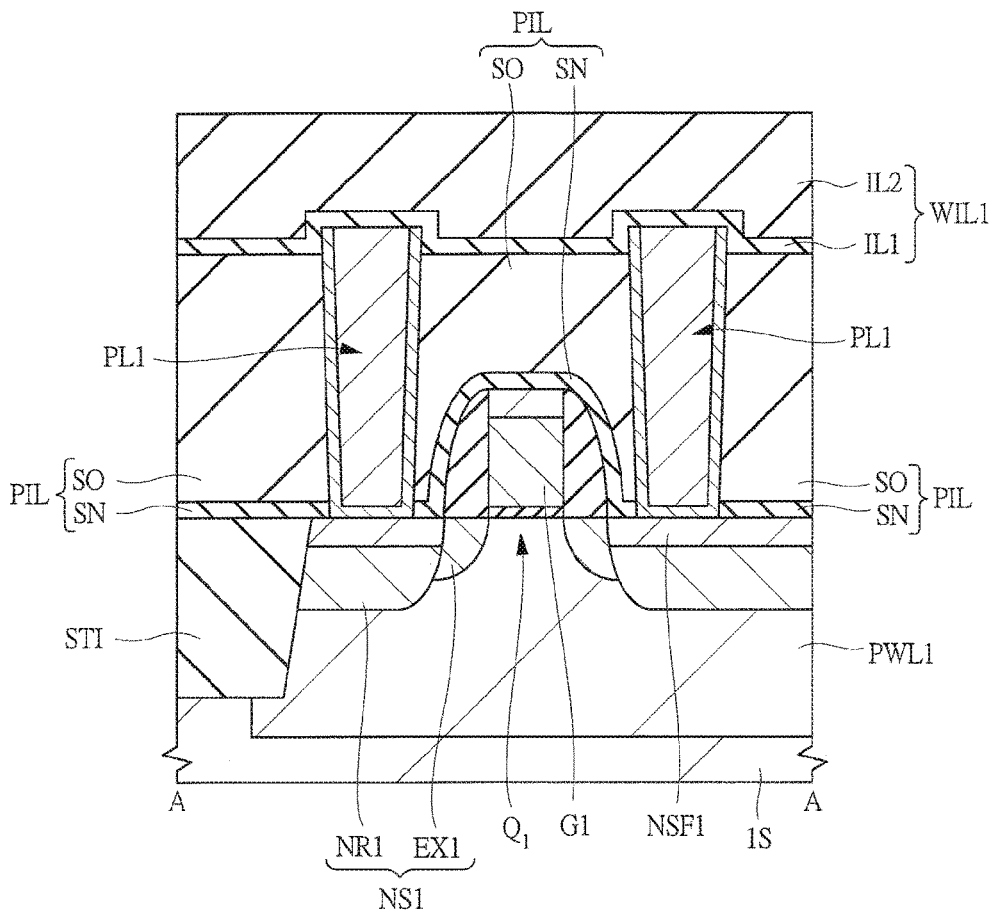
FIG. 10 is a cross-sectional view of the principal part (cross-sectional view taken along the line A-A) of the semiconductor device in a manufacturing step thereof continued from FIG. 9.
Figure 11:
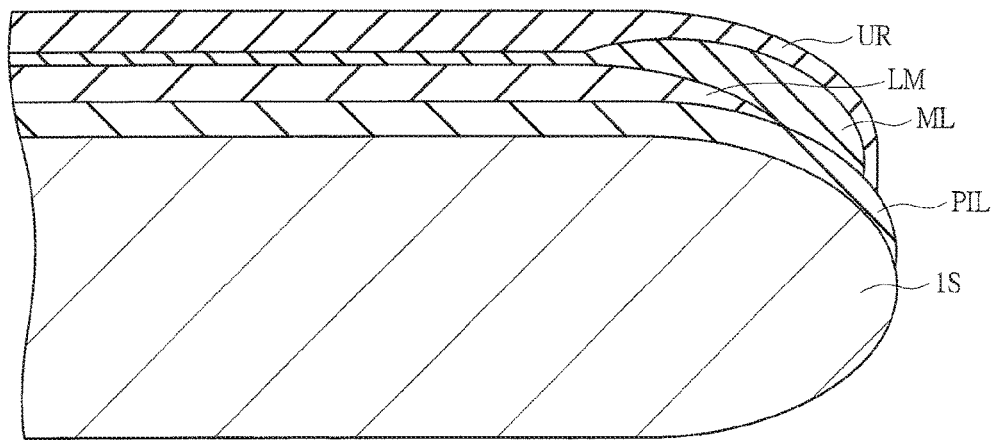
FIG. 11 is a cross-sectional view in a vicinity of an edge portion of a wafer.

First, as illustrated in FIG. 10, the insulating film IL1 is formed on the interlayer insulating film PIL (including a portion on the plug PL1). The insulating film IL1 is formed on the interlayer insulating film PIL so as to cover a portion of the plug PL1 protruding from the upper surface of the interlayer insulating film PIL. Then, the insulating film IL2 is formed on the insulating film IL1. The insulating film IL1 is formed so as to be thinner than the insulating film IL2. A thickness of the insulating film IL1 is, for example, 15 nm, and a thickness of the insulating film IL2 is, for example, 70 nm. By these insulating film IL1 and insulating film IL2, the interlayer insulating film WIL1 of the first-layer wiring is formed.

Here, the insulating film IL2 is formed of a SiOC film which is a film formed by, for example, adding carbon (C) to a silicon oxide film (that is, a silicon oxide film containing carbon) as a low dielectric constant film. The insulating film IL2 is formed of the low dielectric constant film in order to reduce the inter-wiring capacitance of wirings to be formed in a later step. Note that the low dielectric constant film can be exemplified by an insulating film having a dielectric constant lower than a dielectric constant of a silicon oxide film, and generally refers to a low dielectric constant film having a dielectric constant of the silicon oxide film which is about "ε=4.1 to 4.2" or lower. Therefore, the insulating film IL2 formed as the low dielectric constant film has a dielectric constant lower than that of silicon oxide. Also, the insulating film IL2 has a dielectric constant lower than those of the insulating films SO and IL1. While the insulating film IL2 is the low dielectric constant film, not only a SiOC film (k~2.2) but also a SiOF film (k~3.7), an ULK film (k~2.7), an ELK film (k~2.2), a spin-coated porous MSQ film (k~2.2), or a stacked film thereof can be used.

In the first embodiment, the interlayer insulating film WIL1 is formed of a stacked film formed of the insulating film IL1 and the insulating film IL2 thereon. This is because of the following reason.

That is, in the step illustrated in FIG. 6, when the contact hole CNT1 is formed inside the interlayer insulating film PIL, a lower-layer material LM and a middle layer ML are used in the first embodiment as illustrated in FIG. 11 in addition to an upper-layer resist film (a photoresist film) UR used in a normal step. FIG. 11 is a cross-sectional view of a principal part in a vicinity of an edge portion of the wafer (the semiconductor substrate 1S), obtained when the step illustrated in FIG. 5 ends, and then, the lower-layer material IM, the middle layer ML, and the upper-layer resist film UR are formed on the wafer (the semiconductor substrate 1S).

With reference to FIGS. 12 to 16, details of the step of etching the interlayer insulating film PIL upon the formation of the contact hole CNT1 will be explained. Note that, while FIGS. 12 to 16 are explanatory diagrams of the step of forming the contact hole CNT1, FIG. 12 corresponds to a partially-enlarged cross-sectional view illustrating to enlarge a region where a semiconductor element (a MISFET) is formed in FIG. 11, and each of FIGS. 13 to 16 illustrates the same region as that in FIG. 12. For simplification, in FIGS. 12 to 16, the illustration of the semiconductor element (MISFET) is omitted, and the insulating film SN and the insulating film SO are collectively illustrated as the interlayer insulating film PIL.

Figure 12:
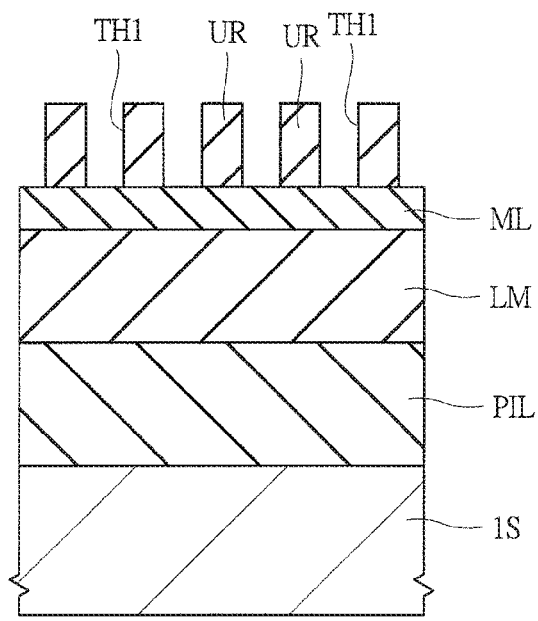
FIG. 12 is an explanatory diagram of a step of forming a contact hole.

First, as illustrated in FIG. 12, for example, a low-sublimation organic film is formed on the interlayer insulating film PIL so as to have a thickness of, for example, 180 nm, as the lower-layer material LM. On the lower-layer material IM, for example, an organic film containing silicon (Si) and carbon (C) as main components is formed as the middle layer ML so as to have a thickness of, for example, 40 nm, which is thinner than the interlayer insulating film PIL and the lower-layer material LM. Further, on the middle layer ML, the upper-layer resist film UR is formed so as to have a thickness of, for example, 150 nm. Next, by a lithography technique by using a mask (an exposure mask), exposure and development are performed to the upper-layer resist film UR so as to form a through hole TH1 in the upper-layer resist film UR. Note that a state of the above-described FIG. 11 corresponds to a stage after the formation of the lower-layer material IM, the middle layer ML, and the upper-layer resist film UR but before the formation of the through hole TH1 in the upper-layer resist film UR.

Figure 13:
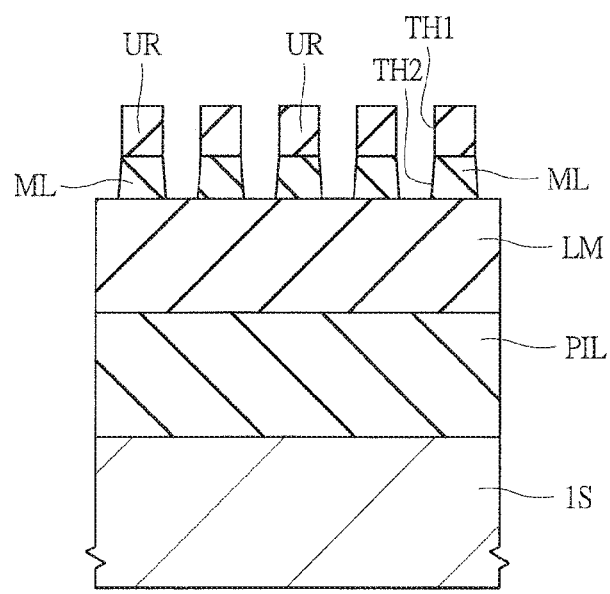
FIG. 13 is an explanatory diagram of a step of forming a contact hole.

Next, as illustrated in FIG. 13, the middle layer ML is etched by using the patterned upper-layer resist film UR (that is, the upper-layer resist film UR having the through hole TH1 formed therein) as a mask (an etching mask), so that a through hole TH2 is formed in the middle layer ML. At this time, a diameter of an upper surface of the through hole TH2 formed in the middle layer ML is almost equal to a diameter of the through hole TH1 (that is, the through hole TH2 is formed so that the upper surface thereof is aligned with a lower surface of the through hole TH1). On the other hand, a diameter of a lower surface of the through hole TH2 is smaller than a diameter of the through hole TH1. That is, the through hole TH2 is formed in a tapered shape whose lower-potion diameter is narrower (smaller) than an upper-portion diameter thereof.

Figure 14:
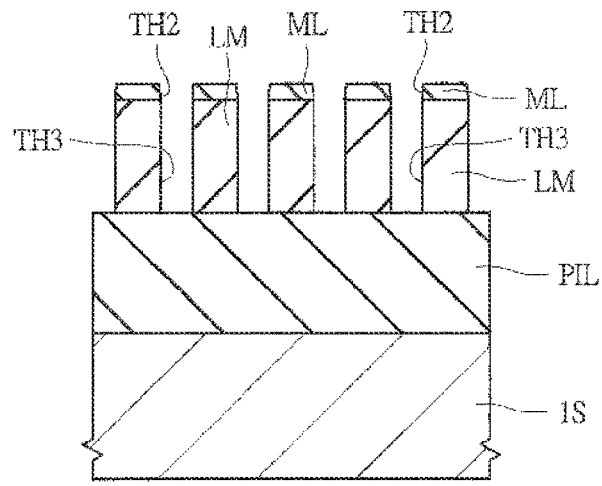
FIG. 14 is an explanatory diagram of another step of forming the contact hole.

Next, as illustrated in FIG. 14, the lower-layer material LM is etched by using the middle layer ML patterned in the step illustrated in FIG. 13 (that is, the middle layer ML having the through hole TH2 formed therein) as a mask (an etching mask), so that a through hole TH3 is formed in the lower-layer material LM. At this time, a diameter of the through hole TH3 formed in the lower-layer material LM is almost equal to a diameter of a lower surface of the through hole TH2 (that is, the through hole TH3 is formed so as to be aligned with an upper surface thereof with the lower surface of the through hole TH2).

Figure 15:
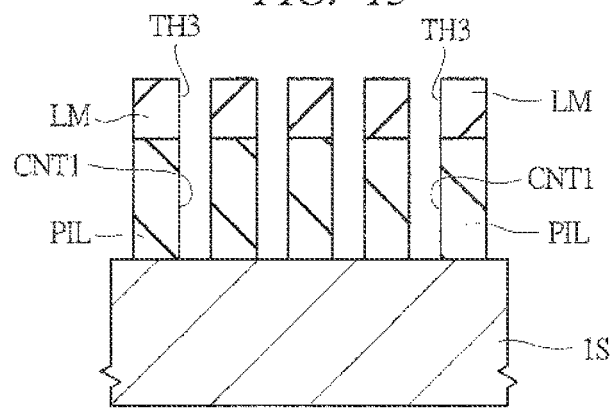
FIG. 15 is an explanatory diagram of still another step of forming the contact hole.

Next, as illustrated in FIG. 15, the interlayer insulating film PIL is etched by using the lower-layer material LM patterned in the step illustrated in FIG. 14 (that is, the lower-layer material LM having the through hole TH3 formed therein) and the middle layer ML remaining after the etching in the step illustrated in FIG. 14 as masks (etching masks), so that the contact hole CNT1 in the interlayer insulating film PIL. At this time, a diameter of an upper surface of the contact hole CNT1 formed in the interlayer insulating film PIL is almost equal to a diameter of a lower surface of the through hole TH3 (that is, the contact hole CNT1 is formed so as to be aligned with an upper surface thereof with a lower surface of the through hole TH3). Finally, the lower-layer material LM is removed as illustrated in FIG. 16.

When a fine pattern is formed, it is required to thin the resist film in order to maintain resolution of the resist film (the photoresist film). However, in the thin resist film, there is a problem of insufficient etching resistance of the resist film for a film to be processed (a film to be processed by using the resist pattern as the etching mask). Accordingly, as described above (as explained with reference to the above-described FIGS. 12 to 16), by patterning the respective films (the upper-layer resist film UR, the middle layer ML, the lower-layer material IM, and the interlayer insulating film PIL), the etching resistance at each patterning stage of the respective films can be ensured even if the resist film (the upper-layer resist film UR) is thinned in order to maintain the resolution. More particularly, since the middle layer ML to be patterned by using the upper-layer resist film UR is formed thinner than the lower-layer material IM, the upper-layer resist film UR can be formed thin. Further, as described above, since the through hole TH2 to be formed by patterning the middle layer ML is formed in the tapered shape whose lower-portion diameter is smaller than the upper-portion diameter thereof, the diameter of the through hole TH3 in the lower-layer material LM etched by using the patterned middle layer ML as the mask (etching mask) is formed so as to be almost equal to the diameter of the lower surface of the through hole TH2, so that the contact hole CNT1 having the smaller diameter than the diameter of the through hole TH1 formed in the upper-layer resist film UR can be formed.

However, when the contact hole CNT1 is formed in the interlayer insulating film PIL by using the method as described above (the above-described FIGS. 12 to 16), the middle layer ML is formed thick at an edge portion (an end portion) of the wafer (the semiconductor substrate 1S) as illustrated in FIG. 11 described above. Therefore, as illustrated in FIG. 16, even after the contact hole CNT1 is formed and after the lower-layer material LM remaining in the region where the semiconductor element is to be formed is removed, the middle layer ML is not removed and remains at the edge portion of the wafer. Then, the step of forming the plug PL1 by burying the conductive film in the contact hole CNT1 is performed. Even after this step is performed, the middle layer ML remains at the edge portion of the wafer as illustrated in FIG. 17. The edge portion of the wafer has a weak film adhesiveness, and therefore, if the film of the middle layer ML partially remains, there is a risk that the remaining film (the middle layer ML remaining at the wafer edge portion) is peeled off in a later step and reattaches to the wafer, which results in decrease in a yield. Therefore, as illustrated in FIG. 18, it is required to remove the middle layer ML remaining at the edge portion of the wafer by etching or polishing. At this time, simultaneously with the removal of the partially-remaining middle layer ML, the interlayer insulating film PIL formed at the edge portion of the wafer is also removed, and therefore, the surface of the wafer is exposed from the edge portion of the wafer as illustrated in FIG. 18. In this manner, there is a new risk of occurrence of the following problem.

After the plug PL1 is formed, it is originally sufficient to form the insulating film IL2 which is the low dielectric constant film on the interlayer insulating film PIL. However, since the SiOC film formed as the insulating film IL2 in the first embodiment is formed under unusual plasma discharge, there is a risk that abnormal electrical discharge occurs if the film is formed in the state that the surface of the wafer is exposed, which results in damage of the wafer (semiconductor substrate 1S). Therefore, in the first embodiment, it is desired to form the insulating film IL1 so as to cover the surface of the semiconductor substrate 1S after the surface of the semiconductor substrate 1S is exposed by the etching for removing the middle layer ML remaining at the edge portion of the wafer but before the insulating film IL2 is formed. In this manner, the SiOC film can be formed as the insulating film IL2 in a state that the surface of the wafer (the semiconductor substrate 1S) is not exposed, and therefore, the damage of the wafer (the semiconductor substrate 1S) upon the formation of the SiOC film (the insulating film IL2) can be prevented. As the insulating film IL1 for covering the semiconductor substrate 1S, an insulating film such as a silicon oxide film or a silicon nitride film can be considered. Since a wiring trench (corresponding to the wiring trench WT1 which will be described later) to be formed in a later step is also formed inside the insulating film IL1, it is desired to avoid the formation of the insulating film IL1 formed by using a high dielectric constant film which leads to the increase in the inter-wiring capacitance. In the first embodiment, the silicon oxide film is preferably used as the insulating film IL1.

In the first embodiment, because of the above-described reason, the interlayer insulating film WIL1 is formed so as to have the stacked structure formed of the insulating film IL1 and the insulating film IL2. However, the case that the insulating film IL1 is changed to the stacked structure formed of the insulating film IL1 and the insulating film IL2 is not limited to the above-described reason. For example, a case can be also considered, the case forming the insulating film IL1 as an etching stopper upon the formation of the wiring trench (corresponding to the wiring trench WT1 which will be described later) inside the interlayer insulating film WIL1 in a later step. Also in this case, as the insulating film IL1, for example, an insulating film such as a silicon oxide film, a silicon nitride film, a silicon carbide film (a SiC film), a silicon carbonitride film (a SiCN film), or a silicon oxynitride film (a SiON film) can be considered. However, it is required to avoid usage of a film having a function of the etching stopper for a low dielectric constant film, and besides, having a high dielectric constant which results in the increase in the inter-wiring capacitance. On the other hand, when the above-described abnormal electrical discharge does not occur or when the etching stopper is not required, the interlayer insulating film WIL1 can be formed of one layer of the insulating film IL2 without forming the insulating film IL1.

Figure 19:
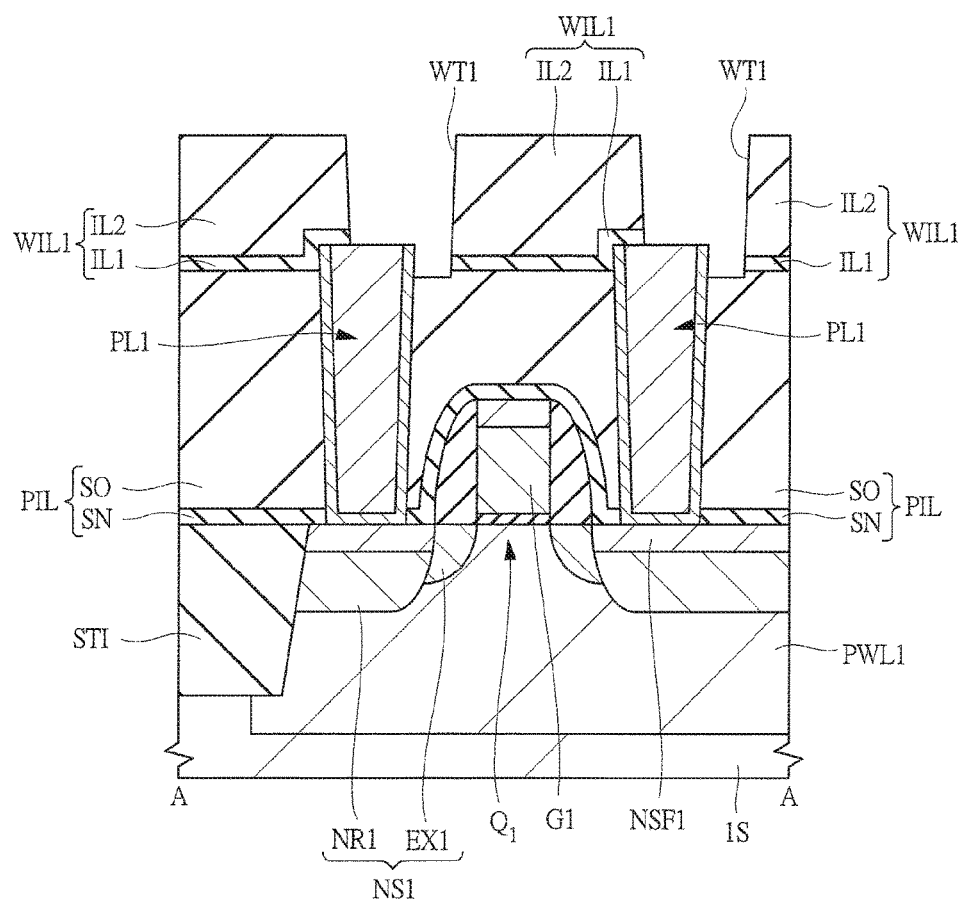
FIG. 19 is a cross-sectional view of the principal part (cross-sectional view taken along the line A-A) of the semiconductor device in a manufacturing step thereof continued from FIG. 10.

Next (that is, after the interlayer insulating film WIL1 is formed as illustrated in the above-described FIG. 10), the wiring trench WT1 is formed in the interlayer insulating film WIL1 as illustrated in FIG. 19. At this time, the wiring trench WT1 is formed so that at least a part of the upper surface of the plug PL1 overlaps the wiring trench WT1 in plane, and therefore, a part of the plug PL1 is exposed because of the wiring trench WT1.

In the first embodiment, as illustrated in the above-described FIG. 2, the step of manufacturing the semiconductor device in the case that the whole wiring W1 is slightly shifted from the plug PL1 in a direction parallel to the cross section A is explained. Therefore, the wiring trench WT1 formed in the step illustrated in FIG. 19 is also formed so as to be slightly shifted from the plug PL1 in the direction parallel to the cross section A. A depth of the wiring trench WT1 is, for example, 90 nm.

As illustrated in FIG. 19, in the first embodiment, at least a part of an upper surface (an upper portion) of the plug PL1 and a part of side surfaces thereof are exposed because of the wiring trench WT1. Also, while the wiring trench WT1 is formed in the interlayer insulating film WIL1, a lowermost surface thereof is formed inside the insulating film SO. That is, the wiring trench WT1 is formed inside the interlayer insulating film WIL1 and the insulating film SO. The lowermost surface of the wiring trench WT1 is at a position lower than the upper surface of the plug PL1, and, in the first embodiment, the wiring trench WT1 is formed so that the lowermost surface of the wiring trench WT1 is positioned lower than (on a lower side of) the upper surface of the insulating film SO. The height of the lowermost surface of the wiring trench WT1 is lower than the height of the upper surface of the insulating film SO, and, for example, the lowermost surface of the wiring trench WT1 is positioned at a position 5 nm lower than the upper surface of the insulating film SO. In the first embodiment, the lowermost surface of the wiring trench WT1 is formed inside the insulating film SO, and therefore, the lowermost surface of the wiring trench WT1 is formed of an exposed surface of the insulating film SO.

Note that the lower surface (the bottom surface) of a portion of the wiring trench WT1 not overlapping the plug PL1 in the plane forms the lowermost surface of the wiring trench WT1, and this manner is common among the present first embodiment and the following second to seventh embodiments.

In the first embodiment, since the upper surface of the insulating film SO is made to recede in the step illustrated in the above-described FIG. 9, the upper surface of the plug PL1 is formed at a position higher than the upper surface of the insulating film SO. Further, the lowermost surface of the wiring trench WT1 is formed inside the insulating film SO. Therefore, the lowermost surface of the wiring trench WT1 is formed at a position lower than the upper surface of the plug PL1. Therefore, at least a part of the upper surface of the plug PL1 and a part of the side surfaces of the plug PL1 are exposed because of the wiring trench WT1. When a conductive film is buried inside the wiring trench WT1 in a later step, the plug PL1 and the conductive film buried inside the wiring trench WT1 are reliably connected to each other.

In order to form the wiring trench WT1, the interlayer insulating film WIL1 and the insulating film SO are dry-etched by using a photoresist pattern (a patterned photoresist film) formed on the interlayer insulating film WIL1 by photolithography technique as a mask (an etching mask). In this etching step, an endpoint of the insulating film IL2 in the dry etching is detected. This endpoint detection is observed in, for example, a scribe region.

More specifically, in the step of forming the wiring trench WT1, the insulating film IL2 is dry-etched first. At the time when a part of the surface of the insulating film IL1 is exposed, the endpoint of the insulating film IL2 in the dry etching is detected. In the present first embodiment, the insulating film IL2 is formed of the SiOC film, and the insulating film IL1 is formed of the silicon oxide film. In this manner, the insulating film IL2 and the insulating film IL1 are formed of different materials (material films) from each other, and therefore, the reflected-light intensity of the insulating film during being etched, the mass of the substance of the same, or others is analyzed at the time when the etching reaches a boundary (an interface) between the two insulating films IL1 and IL2, so that the endpoint of the insulating film IL2 in the etching can be detected. In the present first embodiment, after the endpoint of the insulating film IL2 in the etching is detected, the insulating film IL1 and the insulating film SO are further dry-etched. Since the endpoint of this dry etching is inside the insulating film SO, the endpoint cannot be detected, and therefore, the etching is performed for a predetermined period of time (a certain time) by controlling etching time. A dry-etching (etching-thickness) amount of each of the insulating film IL1 and the insulating film SO is smaller than a dry-etching (etching-thickness) amount of the insulating film IL2. Therefore, even if the etching endpoint is not detected upon the dry etching of the insulating film IL1 and the insulating film SO, variation in the etching amount (etching thickness) is not large. Therefore, it is possible to avoid the formation of the lowermost surface of the wiring trench WT1 at a position close to the gate electrode G1 of the n-channel-type MISFET $Q_1$ due to the excessively-large etching amount of the insulating film SO in the step of forming the wiring trench WT1.

Therefore, the step of forming the wiring trench WT1 includes: a first step of etching the insulating film IL2; a second step of detecting the etching endpoint of the insulating film IL2 when the etching in the first step reaches the upper surface of the insulating film IL1; and a third step of etching the insulating film IL1 and the insulating film SO after the second step.

As described above, by performing the dry etching (dry etching for forming the wiring trench WT1) in two stages (the first step and the third step), processing accuracy of the etching can be improved. Also, by the above-described etching (dry etching for forming the wiring trench WT1), at least a part of the upper surface of the plug PL1 and a part of the side surfaces of the same are exposed because of the wiring trench WT1. However, the insulating film IL1 may remain on the side surfaces of the plug PL1 in some cases. In this case, it is preferred to perform wet etching or others after the dry etching for forming the wiring trench WT1 so as to remove the insulating film IL1 remaining on the side surfaces of the plug PL1 and expose the side surfaces of the plug PL1 from the wiring trench WT1. In this manner, the reliable connection between a wiring (corresponding to the wiring W1 which will be described later) to be formed in a later step and the plug PL1 can be ensured.

Figure 20:
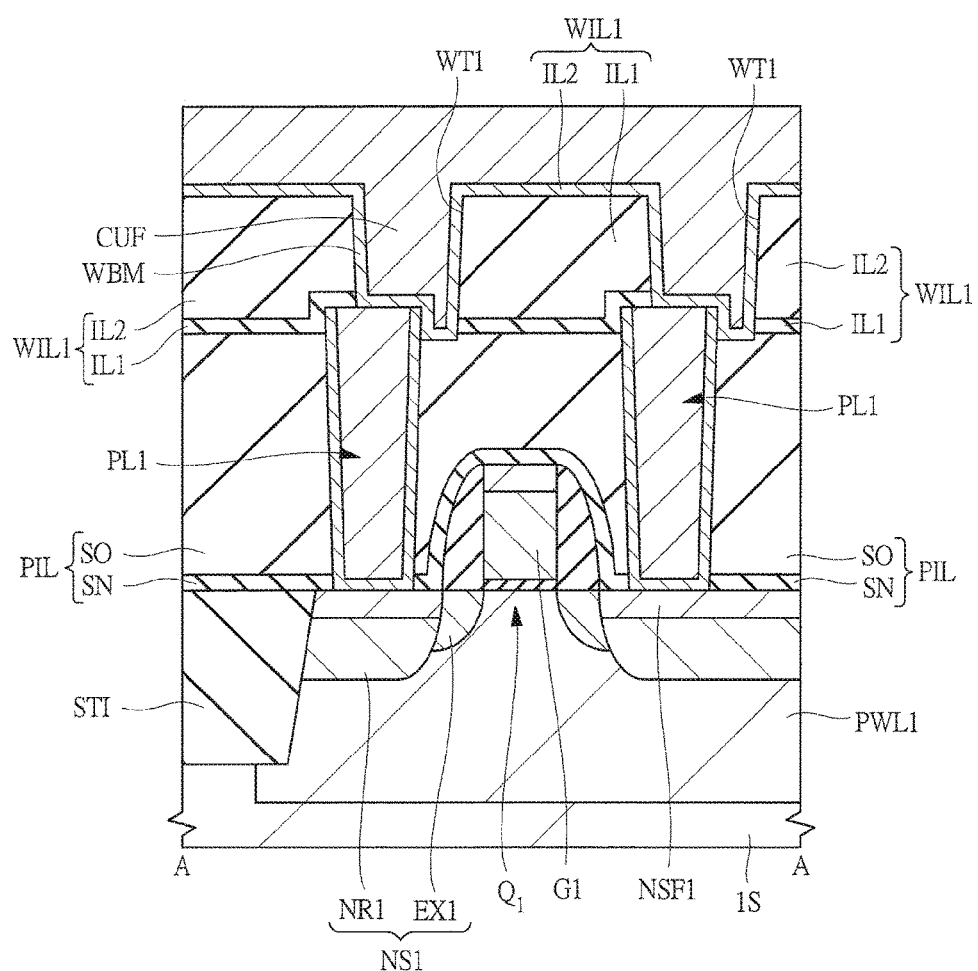
FIG. 20 is a cross-sectional view of the principal part (cross-sectional view taken along the line A-A) of the semiconductor device in a manufacturing step thereof continued from FIG. 19.

Next, as illustrated in FIG. 20, a barrier conductor film WBM is formed on the interlayer insulating film WIL1 including an inner wall (side surfaces and a bottom portion) of the wiring trench WT1. In the present first embodiment, the barrier conductor film WBM is formed of a stacked film formed of a tantalum film (a Ta film) and a tantalum nitride film (a TaN film) thereon, and can be formed by using, for example, a sputtering method. A thickness of the barrier conductor film WBM is, for example, 10 nm. This barrier conductor film WBM is formed in order to achieve adhesiveness with a copper film (a Cu film) to be formed in a later step and to prevent diffusion of the copper. The formation of the stacked film formed of the tantalum film and the tantalum nitride film is exemplified as the barrier conductor film WBM in the present first embodiment. However, the barrier conductor film WBM can be formed of a single layer of a metal film made of tantalum (Ta) or others, a single layer of a nitride film (a metal nitride film) such as a titanium nitride film, or a stacked film formed of a metal film and a nitride film (a metal nitride film). When the barrier conductor film WBM is a tantalum film or a tantalum nitride film, adhesiveness to a copper film is excellent compared with the case of using a titanium nitride film.

Next, as illustrated in FIG. 20, a conductor film CUF is formed on the barrier conductor film WBM. The conductor film CUF is formed of, for example, a copper film (a Cu film) as a conductor film. This step can be performed by forming a copper seed layer (not illustrated) on the barrier conductor film WBM by, for example, a CVD method or a sputtering method, and further forming the conductor film CUF on the seed layer by, for example, an electrolytic-plating method. The conductor film CUF is formed thicker than the barrier conductor film WBM, and besides, is formed so as to be buried (fill) inside the wiring trench WT1. In this manner, the barrier conductor film WBM and the conductor film CUF are buried inside the wiring trench WT1.

However, the barrier conductor film WBM and the conductor film CUF cannot be formed only inside the wiring trench WT1. Therefore, upon the formation of these films, as illustrated in FIG. 20, the barrier conductor film WBM and the conductor film CUF are formed not only inside the wiring trench WT1 but also on the interlayer insulating film WIL1 in addition to the inside of the wiring trench WT1.

Figure 21A:
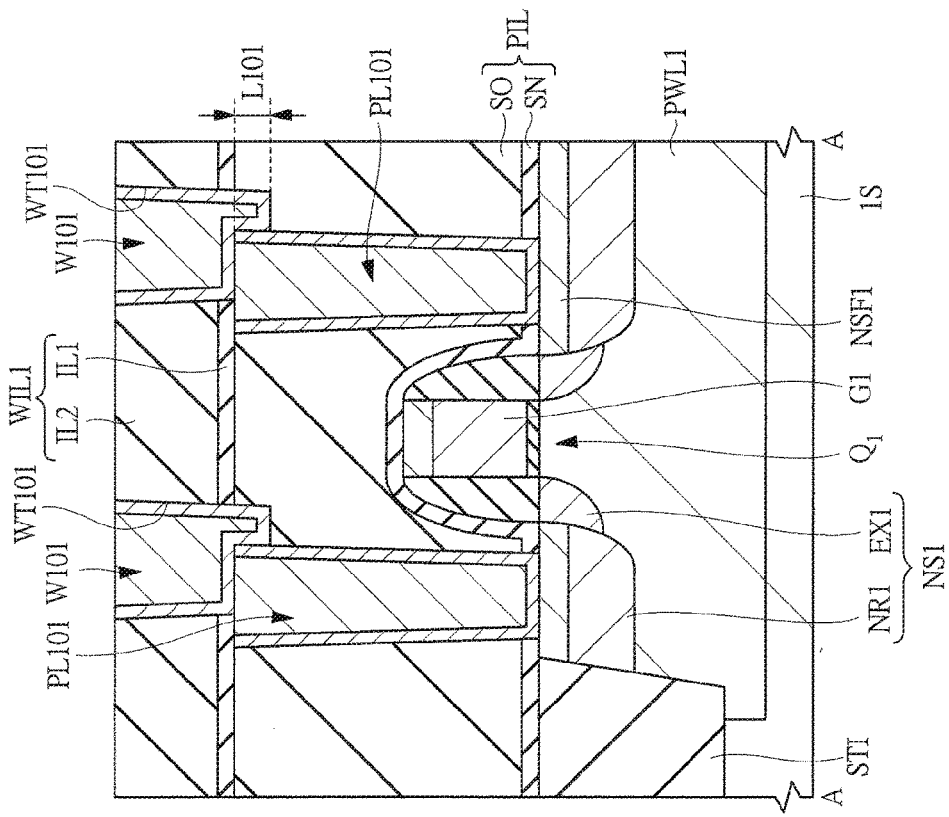
FIGS. 21A and 21B are cross-sectional views of the principal part (cross-sectional view taken along the line A-A) of the semiconductor device in a manufacturing step thereof continued from FIG. 20.

Next, as illustrated in FIG. 21A, unnecessary portions of the conductor film CUF and the barrier conductor film WBM formed outside the wiring trench WT1 are polished by using a CMP method. In this manner, the conductor film CUF and the barrier conductor film WBM formed outside the wiring trench WT1 are removed, so that the wiring W1 of the first-layer wiring is formed. The wiring W1 is formed of the conductor film CUF and the barrier conductor film WBM buried and remaining inside the wiring trench WT1, and a depth of the wiring W1 is similar to that of the wiring trench WT1, which is, for example, 90 nm. The wiring W1 is buried in the wiring trench WT1, and is a so-called buried wiring (a damascene wiring, a single damascene wiring). The wiring W1 buried in the wiring trench WT1 is connected to the plug PL1 exposed from the wiring trench WT1.

Since the wiring trench WT1 is formed inside the interlayer insulating film WIL1 and the insulating film SO in the present first embodiment, the lowermost surface of the wiring W1 which is formed by burying the barrier conductor film WBM and the conductor film CUF inside the wiring trench WT1 is formed inside the insulating film SO. Since the lowermost surface of the wiring W1 is formed inside the insulating film SO, the lowermost surface of the wiring W1 is in contact with the exposed surface of the insulating film SO.

Note that the lower surface (the bottom surface) of a portion of the wiring W1 not overlapping the plug PL1 in the plane forms the lowermost surface of the wiring W1, and this is common among the first present embodiment and the following second to seventh embodiments.

The lowermost surface of the wiring W1 is at a position lower than the upper surface of the plug PL1, and the lowermost surface of the wiring W1 is positioned lower than (on a lower side of) the upper surface of the insulating film SO in the first embodiment. The height position of the lowermost surface of the wiring W1 is equal to the height position of the lowermost surface of the wiring trench WT1 in which the wiring W1 is buried, and is at a position, for example, 5 nm lower than the upper surface of the insulating film SO. Also, the upper surface of the plug PL1 is formed at a position higher than the upper surface of the insulating film SO, and besides, the lowermost surface of the wiring W1 is formed at a position lower than the upper surface of the plug PL1, and therefore, at least a part of the upper surface of the plug PL1 and a part of the side surfaces of the same (that is, the exposed portion of the plug PL1 from the wiring trench WT1) are covered with the wiring W1. In this manner, the connection between the plug PL1 and the wiring W1 can be ensured, and reliability of the connection between the plug PL1 and the wiring W1 can be improved. In FIG. 21A, a length (a distance) of a portion where the plug PL1 and the wiring W1 overlap with each other in a direction perpendicular to the semiconductor device 1S is indicated as a length L1. This length L1 is also a distance from the lower surface of the wiring W1 (more specifically, the lowermost surface of the wiring W1) to the upper surface of the plug PL1. The length L1 is, for example, 30 nm.

Figure 21B:
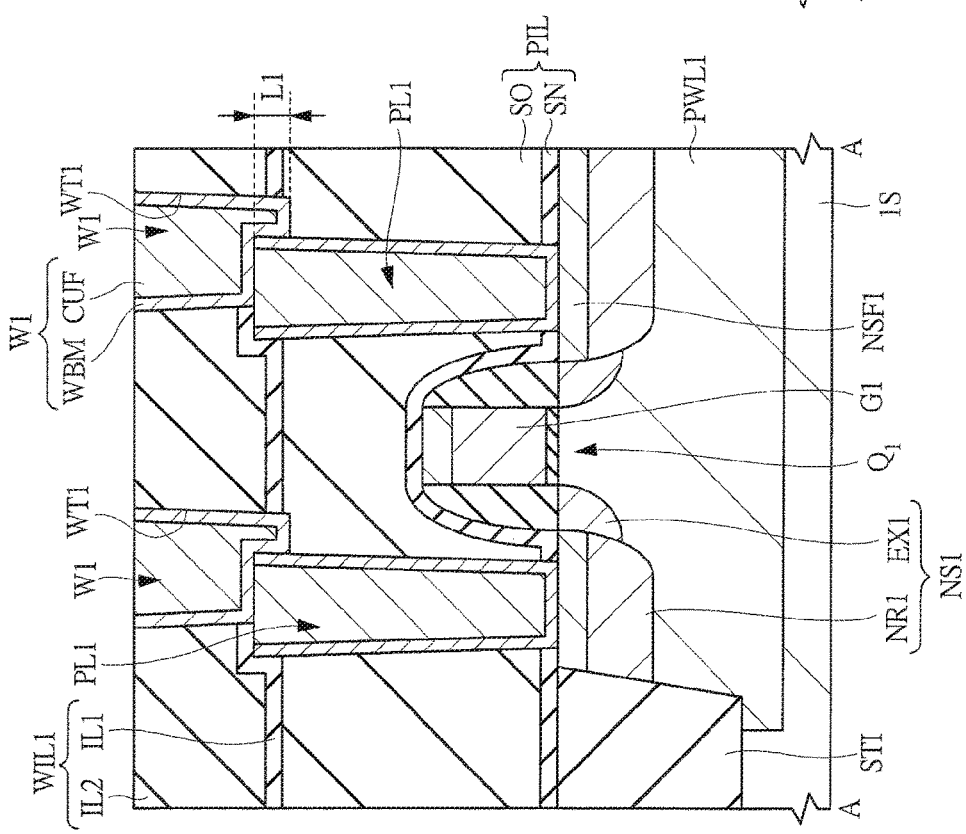

FIG. 21B is a cross-sectional view of a principal part of a semiconductor device of the first embodiment as a first comparative example, and illustrates a case that a plug PL101, a wiring trench WT101, and a wiring W101 are formed as different from the first embodiment but as in the manufacturing step of the comparative example explained with reference to the above-described FIGS. 60 to 65.

FIG. 21B illustrates a case that each member is formed so that the height of the plug PL101 and the heights of the upper surfaces of the wiring W101 and the interlayer insulating film WIL1 obtained after the wiring W101 is formed are equal to the height of the plug PL1 and the heights of the upper surfaces of the wiring W1 and the interlayer insulating film WIL1 obtained after the wiring W1 is formed, respectively. That is, in FIG. 21B, a length L101 of a portion where the plug PL101 and the wiring W101 overlap with each other in the direction perpendicular to the semiconductor substrate 1S is set to be almost equal to the above-described length L1 in FIG. 21A (that is, "L1=L101").

In each step performed in the first embodiment, there are variations in the polishing amount, the etching amount, and others, and therefore, in order to ensure the connection between the wiring W1 and the plug PL1 even if there is variation in each step, it is desired that the wiring W1 and the plug PL1 are designed so that they overlap with each other by a predetermined length in the direction perpendicular to the semiconductor substrate 1S. In the first embodiment, this length is set to be the length L1.

In the manufacturing step of the comparative example explained with reference to the above-described FIGS. 60 to 65, the height of the upper surface of the plug PL101 illustrated in FIG. 21B tends to be formed to be equal to that of the upper surface of the insulating film SO or lower than that of the upper surface of the insulating film SO. Therefore, in the first comparative example illustrated in FIG. 21B, in order to ensure the length L101 of the portion where the wiring W101 and the plug PL101 overlap with each other in the direction perpendicular to the semiconductor device 1S, the wiring W101 is formed so as to be embedded (buried) inside the insulating film SO by the length L101. In this case, a ratio of a portion of the wiring W101 which is formed inside the insulating film IL2 which is the low dielectric constant film is small, and therefore, there is a problem that the inter-wiring capacitance cannot be effectively reduced in spite of the fact that most portion of the interlayer insulating film WIL1 is formed of the insulating film IL2 which is the low dielectric constant film.

On the other hand, in the manufacturing step of the first embodiment, after the polishing for forming the plug PL1 is performed, the upper surface of the insulating film SO is made to recede, so that the upper surface of the insulating film SO is formed at a position lower than the upper surface of the plug PL1. Therefore, even if the plug PL1 and the wiring W1 are overlapped with each other by the length L1 in the direction perpendicular to the semiconductor substrate 1S as illustrated in FIG. 21A, it is not required to form the wiring W1 so as to be embedded (buried) inside the insulating film SO deeper than that in the case of the manufacturing step of the above-described comparative example. Therefore, in the first embodiment, the ratio of the portion of the wiring W1 which is formed inside the insulating film IL2 which is the low dielectric constant film can be larger than that that in the case of the manufacturing step of the above-described comparative example, and therefore, the surface area of the wiring W1 inside the insulating film IL2 is increased, so that the inter-wiring capacitance can be effectively reduced.

Also, in the manufacturing step of the above-described comparative example, by embedding (burying) the wiring trench WT101 by the length L101 from the upper surface of the insulating film SO, it is required to ensure the length L101 of the portion where the wiring W101 and the plug PL101 to be formed later overlap with each other in the direction perpendicular to the semiconductor substrate 1S. If the microfabrication of wirings is developed, it is desired to decrease this length L101 in accordance with that. However, if the length L101 is decreased in a current processing accuracy of each step, it becomes difficult to ensure the reliability of the connection between the wiring W101 and the plug PL101. That is, this means that, even if the microfabrication of the wiring W101 is achieved, it is required in the manufacturing step of the above-described comparative example to form the wiring W101 so as to be embedded (buried) inside the insulating film SO by the length L101 in order to ensure the connection between the wiring W101 and the plug PL101. Therefore, due to the microfabrication of wirings, the ratio of the portion of the wiring W101 which is formed inside the insulating film IL2 which is the low dielectric constant film is further decreased. This means that, if the microfabrication is achieved in the manufacturing step of the above-described comparative example, the inter-wiring capacitance is further increased.

However, in the first embodiment, by forming the upper surface of the plug PL1 so as to be higher than the upper surface of the insulating film SO, the wiring W1 can be formed so as not to be embedded (buried) inside the insulating film SO deeper than that in the manufacturing step of the above-described comparative example even if the length L1 of the portion where the wiring W1 and the plug PL1 overlap with each other in the direction perpendicular to the semiconductor substrate 1S is ensured. Therefore, in the first embodiment, even if the microfabrication of wirings is achieved, the increase in the inter-wiring capacitance between the wirings W1 due to the large ratio of the portion of the wiring W1 which is formed inside the insulating film SO can be avoided compared with the manufacturing step of the above-described comparative example.

Also, by avoiding the formation of the lowermost surface of the wiring trench WT1 at the position close to the gate electrode G1 of the n-channel-type MISFET $Q_1$, it can be avoided to decrease the distance between the wiring W1 and the gate electrode G1, and it can be avoided to reduce the reliability between the wiring W1 and the gate electrode G1. In the first embodiment, the case that the insulating film IL2 is formed of the low dielectric constant film is exemplified. However, regarding the effect of avoiding the reduction in the reliability between the wiring W1 and the gate electrode G1, it is not always required to form the insulating film IL2 by the low dielectric constant film. In this case, the insulating film IL2 can be formed of, for example, a silicon oxide film as the insulating film.

In the first embodiment, the above-described effect can be obtained by forming the upper surface of the plug PL1 so as to be even slightly higher than the upper surface of the insulating film SO. Here, a more preferable condition used when the wiring W1 is formed for the plug PL1 will be explained.

Figure 22:
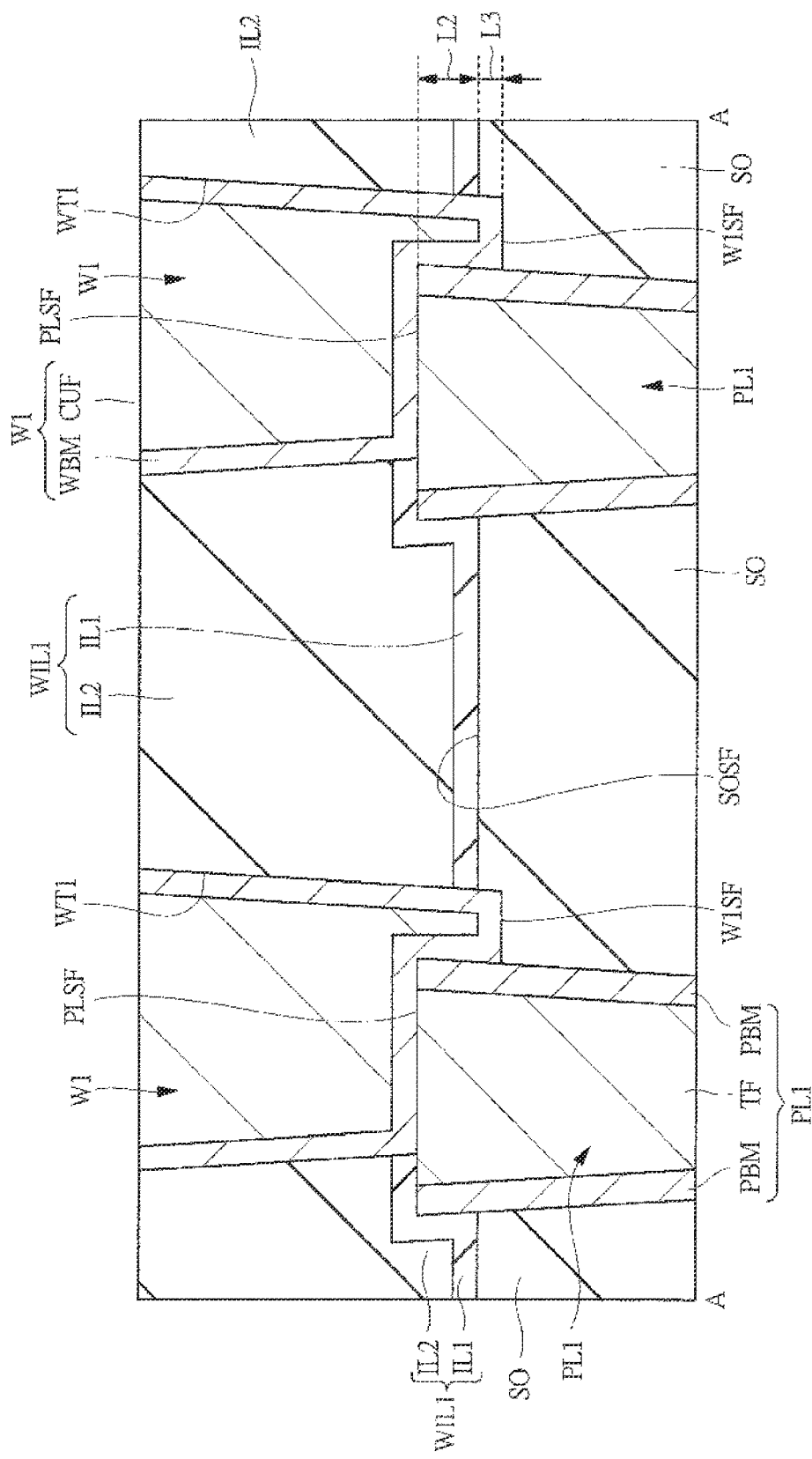
FIG. 22 is an enlarged cross-sectional view of a principal part of an enlarged periphery of a region where a plug and a wiring are connected in FIG. 21A.

FIG. 22 is an enlarged cross-sectional view of a principal part (a partially-enlarged cross-sectional view) of an enlarged periphery of a region where the plug PL1 and the wiring W1 are connected to each other in FIG. 21A. Hereinafter, with reference to FIG. 22, a more preferable condition for the formation of the plug PL1 and the wiring W1 will be explained. Note that each of the above-described length L1, lengths L1a, L2, L3, L4, L5, L6, L7, L8, L9, L10, L11, and L12, which will be described later, and distances L1b and L1c, which will be described later, indicates a distance (a difference in height, a difference between height positions) in a direction (a height direction) perpendicular to the main surface of the semiconductor device 1S.

As illustrated in FIG. 22, a distance (a length) from the upper surface of the insulating film SO to the upper surface of the plug PL1 is set as the length L2. That is, a distance (a length) of protrusion of the plug PL1 from the position of the upper surface of the insulating film SO is set as the length L2. Meanwhile, a distance (a length) from the lowermost surface of the wiring W1 to the upper surface of the insulating film SO is set as the length L3. That is, a distance of the embedding (burying) of the wiring W1 from the position of the upper surface of the insulating film SO is set as the length L3. Here, in the first embodiment, addition of the length L2 and the length L3 corresponds to the above-described length L1 (that is, "L1=L2+L3"). Note that, for easily understand, in FIG. 22, an upper surface of the insulating film SO is provided with a reference symbol SOSF so as to be represented as the upper surface SOSF of the insulating film SO, an upper surface of the plug PL1 is provided with a reference symbol PLSF so as to be represented as the upper surface PLSF of the plug PL1, and the lowermost surface of the wiring W1 is provided with a reference symbol W1SF so as to be represented as the lowermost surface W1SF of the wiring W1.

At this time, in the first embodiment, it is desired that a relation of "L2>L3" is established between the length L2 and the length L3 (that is, it is desired that the length L2 is larger than the length L3). By forming the plug PL1 and the wiring W1 so that the relation of "L2>L3" is established, the connection between the plug PL1 and the wiring W1 in the direction perpendicular to the semiconductor substrate 1S can be ensured as avoiding the increase in the forming amount of the wiring W1 so as to be embedded (buried) inside the insulating film SO formed in a lower layer than the interlayer insulating film WIL1 (that is, an amount corresponding to the length L3). Also, by avoiding the increase in the forming amount of the wiring W1 so as to be embedded (buried) inside the insulating film SO (that is, the amount corresponding to the length L3), the ratio of the portion of the wiring W1 which is formed inside the insulating film IL2 which is the low dielectric constant film is increased. In other words, by avoiding the increase in the forming amount of the wiring W1 so as to be embedded (buried) inside the insulating film SO (that is, the amount corresponding to the length L3), the surface area of the portion of the wiring W1 which is formed inside the insulating film IL2 which is the low dielectric constant film can be increased. Therefore, for example, the inter-wiring capacitance between the adjacent wirings W1 can be reduced. Also, by avoiding the formation of the lowermost surface of the wiring W1 at the position close to the gate electrode G1 of the n-channel-type MISFET $Q_1$, the reduction in the reliability between the wiring W1 and the gate electrode G1 can be avoided. More particularly, by shortening the length L3 as short as possible, the amount of the portion of the wiring W1 which is formed inside the insulating film SO is decreased, so that the inter-wiring capacitance can be effectively reduced, and the reduction in the reliability between the wiring W1 and the gate electrode G1 can be avoided. In the first embodiment, by establishing relations of, for example, "L2=25 nm" and "L3=5 nm", the above-described condition (the relation of "L2>L3") is satisfied.

Figure 23:
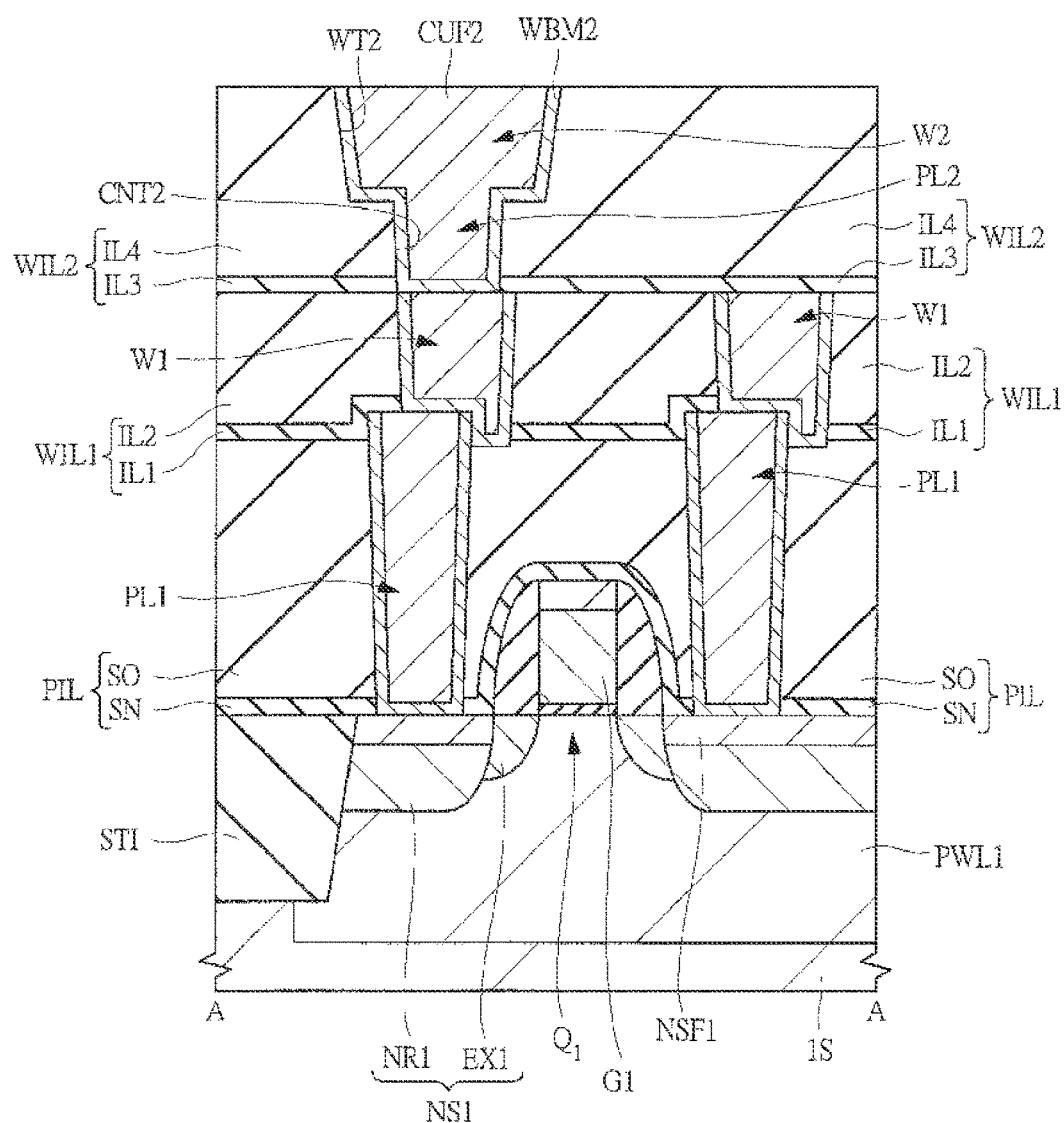
FIG. 23 is a cross-sectional view of the principal part (cross-sectional view taken along the line A-A) of the semiconductor device in a manufacturing step thereof continued from FIG. 21.

Then (after the formation of the wiring W1), a second-layer wiring is formed by using the dual damascene method as illustrated in FIG. 23. Hereinafter, a method of forming the second-layer wiring will be explained.

First, as illustrated in FIG. 23, an insulating film IL3 is formed on the interlayer insulating film WIL1 in which the wiring W1 is formed (buried). The insulating film IL3 is formed of, for example, a silicon nitride film as an insulating film. The insulating film IL3 functions as a barrier insulating film for suppressing diffusion of the copper forming (configuring) the wiring W1. Also, the insulating film IL3 also plays a role of an etching stopper in etching (etching for forming a contact hole CNT2 which will be described later) to be performed in a later step. The insulating film IL3 is formed of a silicon nitride film in the first embodiment, but is not limited to this, and the insulating film IL3 can be formed of, for example, a silicon carbide film, a silicon carbonitride film, or a silicon oxynitride film.

Subsequently, as illustrated in FIG. 23, an insulating film IL4 is formed on the insulating film IL3. The insulating film IL4 is formed of, for example, a SiOC film (a silicon oxide film containing carbon) as a low dielectric constant film, and is formed in order to reduce the inter-wiring capacitance of wirings to be formed later. As the insulating film IL4, not only the SiOC film but also, for example, a SiOF film, an ULK film, an ELK film, a spin-coated porous MSQ film, or a stacked film thereof can be used. An interlayer insulating film WIL2A is formed of a stacked film formed of the insulating film IL3 and the insulating film IL4.

Sequentially, the contact hole (hole portion, connection hole portion) CNT2 and a wiring trench WT2 are formed in the interlayer insulating film WIL2 by using s photolithography technique and an etching technique. The contact hole CNT2 is formed on a bottom portion of the wiring trench WT2, and the contact hole CNT2 is included in the wiring trench WT2 in plane when viewed in the plane (when viewed in plane parallel to the main surface of the semiconductor substrate 1S). The upper surface of the wiring W1 is exposed from the bottom portion of the contact hole CNT2.

Subsequently, on the interlayer insulating film WIL2 including the contact hole CNT2 and the inner wall of the wiring trench WT2, for example, a stacked film formed of a tantalum film and a tantalum nitride film is formed as a barrier conductor film WBM2. The barrier conductor film WBM2 is formed in order to achieve the adhesiveness with copper to be formed in a later step and to prevent diffusion of the copper. In the first embodiment, the formation of the stacked film formed of the tantalum film and the tantalum nitride film is exemplified as the barrier conductor film WBM2. However, a single layer of a metal film such as a tantalum film, a single layer of a nitride film (a metal nitride film) such as a titanium nitride film, or a stacked film formed of a metal film and a nitride film (a metal nitride film) such as a titanium nitride film can be also used as the barrier conductor film WBM2.

Next, on the barrier conductor film WBM2, for example, a copper film is formed as a conductor film CUF2 so as be buried inside the contact hole CNT2 and the wiring trench WT2.

Then, unnecessary portions of the conductor film CUF2 and the barrier conductor film WBM2 formed outside the contact hole CNT2 and the wiring trench WT2 are removed by polishing by using a CMP method, so that the plug PL2 and the wiring W2 are completed as illustrated in FIG. 23. The wiring W2 is formed of the conductor film CUF2 and the barrier conductor film WBM2 buried and remaining inside the wiring trench WT2, the plug PL2 is formed of the conductor film CUF2 and the barrier conductor film WBM2 buried and remaining inside the contact hole CNT2, the plug PL2 and the wiring W2 are integrally formed with each other, and a bottom portion of the plug PL2 is in contact with an upper surface of the wiring W1. Therefore, the wiring W2 is electrically connected to the wiring W1 via the plug PL2 integrally formed with the wiring W2. The wiring W2 and the plug PL2 are buried in the wiring trench WT1 and the contact hole CNT2, and are so-called buried wiring (damascene wiring, dual damascene wiring).

As described above, the semiconductor device according to the first embodiment can be manufactured. Note that multilayered wirings (a third-layer wiring and an upper-layer wiring) may be further formed above the wiring W2. However, description thereof is omitted here.

In the first embodiment, as described in the step illustrated in FIG. 19, the case that the wiring W1 is shifted from the plug PL1 in the direction parallel to the cross section A has been described in the plan view illustrated in FIG. 2. This occurs due to the lithography misalignment in the etching step for forming the wiring trench WT1 illustrated in FIG. 19.

Figure 24:
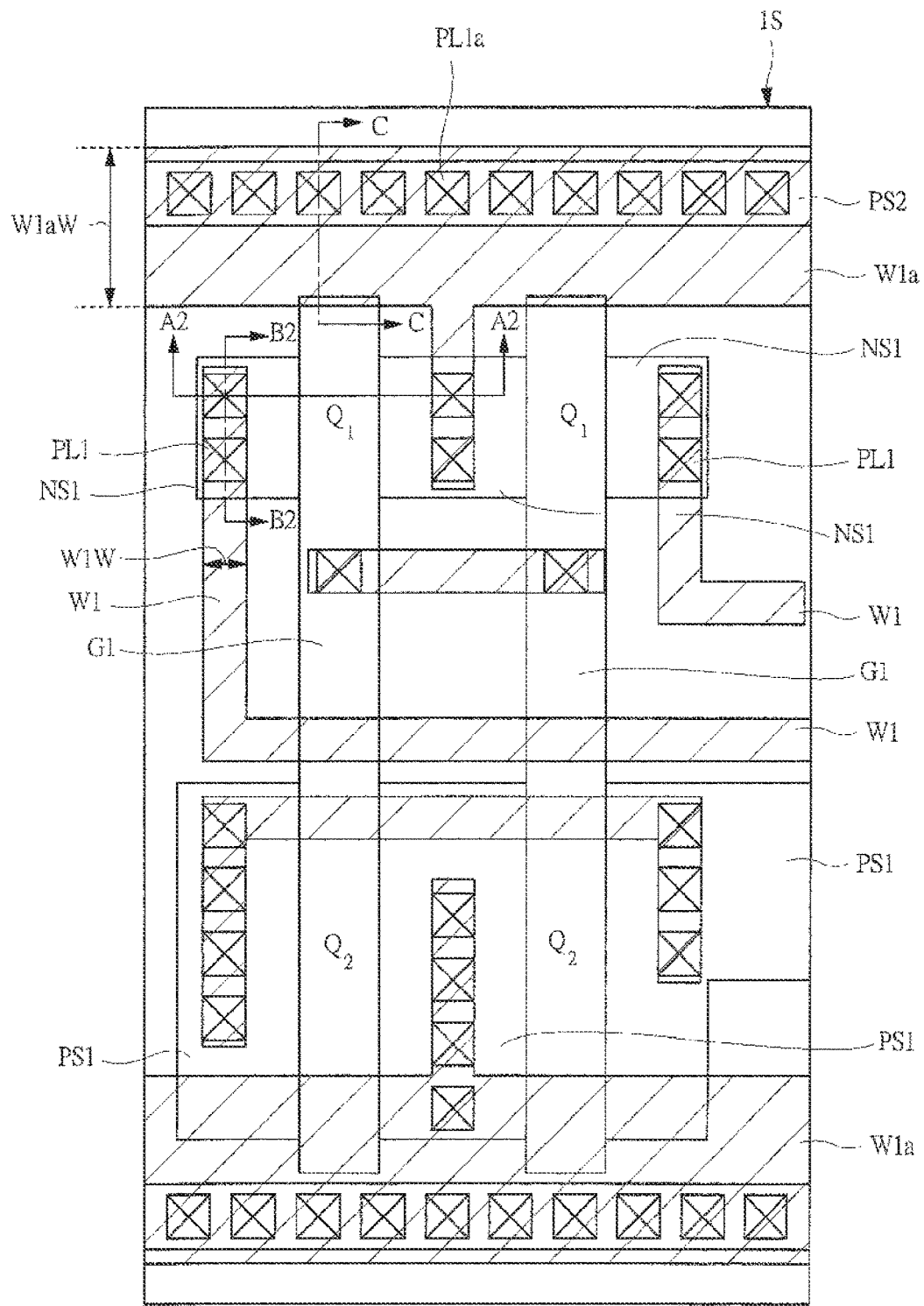
FIG. 24 is a plan view of the principal part of the same portion as that illustrated in FIG. 2 in a case that lithography misalignment does not occur.
Figure 26:
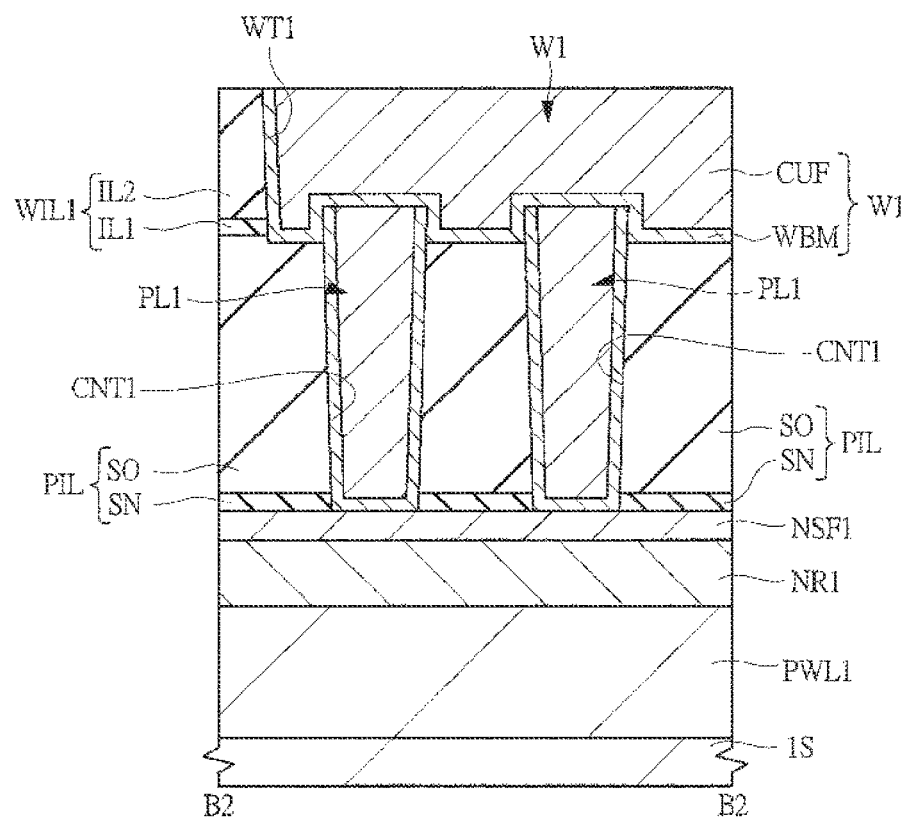
FIG. 26 is a cross-sectional view of a principal part taken along a line B2-B2 in FIG. 24.

FIG. 24 is a plan view of a principal part of the semiconductor device of the first embodiment obtained when the lithography misalignment does not occur so that the wiring W1 is formed almost right on the plug PL1, and illustrates a region corresponding to the above-described FIG. 2. Also, FIG. 25 is a cross-sectional view (a cross-sectional view of a principal part) taken along a line A2-A2 illustrated in FIG. 24, and corresponds to the above-described FIG. 3. FIG. 26 is a cross-sectional view (a cross-sectional view of a principal part) taken along a line B2-B2 line illustrated in FIG. 24. Hereinafter, a cross section taken along the line A2-A2 illustrated in FIG. 24 is referred to as a cross section A2, and a cross section taken along the line B2-B2 illustrated in FIG. 24 is referred to as a cross section B2.

In the first embodiment, a width of a lower surface of the wiring trench WT1 is formed so as to be almost equal to a diameter of an upper surface of the plug PL1 in the cross section A2, and therefore, the lowermost surface of the wiring W1 illustrated in FIG. 25 is apparently formed at the same position as that of the upper surface of the plug PL1. That is, in FIG. 25, the lowermost surface of the wiring W1 is apparently formed upper than an upper surface of the interlayer insulating film PIL. However, practically, as similar to the above-described cross section A (corresponding to the above-described FIG. 3), the lowermost surface of the wiring W1 is formed inside the insulating film SO also in the case of FIG. 24. This will be explained with reference to FIG. 26 which is a cross-sectional view in a direction perpendicular to the cross section A2.

As illustrated in FIG. 26, in the cross section B2, the lowermost surface of the wiring W1 is formed inside the insulating film SO as similar to the above-described FIG. 21A. As a matter of course, this is the same in the cross section B in the above-described FIG. 2 (that is, the cross section taken along the line B-B in the above-described FIG. 2). That is, both of the cross-sectional view taken along the line B-B in the above-described FIG. 2 and the cross-sectional view taken along the line B2-B2 in FIG. 24 are as illustrated in FIG. 26. Therefore, as illustrated in FIG. 25, even when the lithography misalignment does not occur so that the wiring W1 is formed almost right on the plug PL1, the lowermost surface of the wiring W1 is formed inside the insulating film SO as illustrated in FIG. 26, and therefore, effects similar to the above-described effects are provided.

Also, while the explanation has been made in the first embodiment based on the case that the diameter of the upper surface of the plug PL1 and the width of the lower surface of the wiring W1 are almost equal to each other, their relation is not limited to such a case, and a case that the diameter of the plug PL1 is larger than the width of the lower surface of the wiring W1, and a case that the diameter of the plug PL1 is smaller than the width of the lower surface of the wiring W1 can be also applied.

According to the first embodiment, after the polishing for forming the plug PL1 ends, the surface of the insulating film SO is made to recede so that the upper surface of the plug PL1 is higher than the upper surface of the insulating film SO, so that the connection between the plug PL1 and the wiring W1 in the direction perpendicular to the semiconductor substrate 1S can be ensured even if the embedding (burying) amount of the wiring W1 to be formed later inside the insulating film SO is decreased further than that in the case of the manufacturing step of the above-described comparative example. Further, by forming the wiring W1 so as not to be embedded (buried) inside the insulating film SO deeper than the manufacturing step of the above-described comparative example, the surface area of the wiring W1 inside the insulating film IL2 which is the low dielectric constant film is increased. Therefore, even if the microfabrication of the wiring structure is achieved, the increase in the inter-wiring capacitance can be avoided.

Second Embodiment

In the first embodiment, the embodiment that the wiring trench WT1 is embedded (buried) inside the insulating film SO so as to form the lowermost surface of the wiring W1 inside the insulating film SO has been explained. As a second embodiment, an embodiment that the wiring trench WT1 is not embedded (buried) inside the insulating film SO so as to form the wiring W1 inside the interlayer insulating film WIL1 will be explained.

Figure 27:
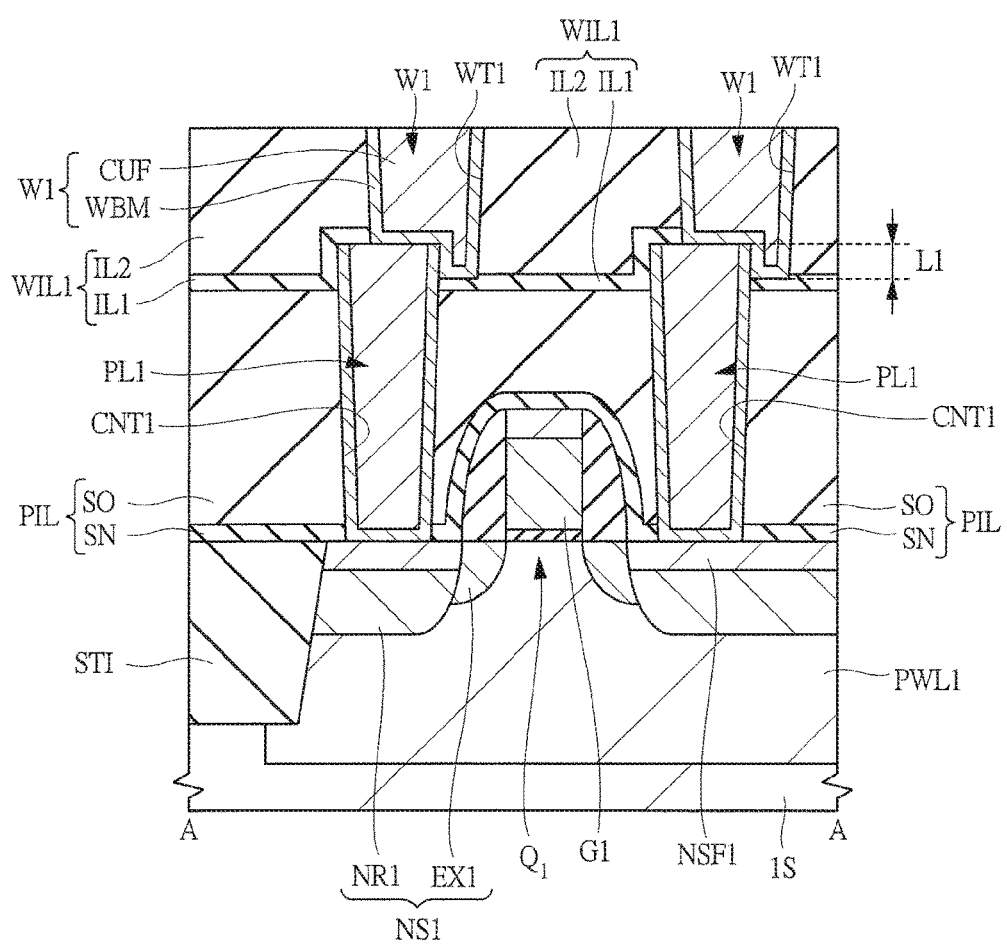
FIG. 27 is a cross-sectional view of a principal part (cross-sectional view taken along a line A-A) of a semiconductor device according to a second embodiment of the present invention.

FIG. 27 is a cross-sectional view of a principal part of a semiconductor device according to the second embodiment, and illustrates a cross section corresponding to the cross section A (the cross section taken along the line A-A) illustrated in the above-described FIG. 2 of the first embodiment.

As illustrated in FIG. 27, as similar to the semiconductor device of the above-described first embodiment, the semiconductor device according to the second embodiment is formed so that the upper surface of the plug PL1 is higher than the upper surface of the insulating film SO, that is, the upper surface of the interlayer insulating film PIL. Also, as similar to the semiconductor device of the above-described first embodiment, the semiconductor device according to the second embodiment is formed so that the lowermost surface of the wiring W1 is lower than the upper surface of the plug PL.

That is, the formation of the upper surface of the plug PL1 at the position higher than the upper surface of the interlayer insulating film PIL and the formation of the lower surface of the wiring W1 (more specifically, the lowermost surface of the wiring W1) at the position lower than the upper surface of the plug PL1 are common among the above-described first embodiment, the present second embodiment, and the third to seventh embodiments described later. Therefore, when the wiring trench WT1 is formed, the formation of the lower surface of the wiring trench WT1 (more specifically, the lowermost surface of the wiring trench WT1) at the position lower than the upper surface of the plug PL1 is common among the above-described first embodiment, the present second embodiment, and the third to seventh embodiments described later.

On the other hand, in the semiconductor device according to the second embodiment, the wiring W1 is not formed inside the insulating film SO and the whole wiring W1 is formed inside the interlayer insulating film WIL1 as different from the above-described first embodiment. That is, the lowermost surface of the wiring W1 is formed inside the interlayer insulating film WIL1.

In the second embodiment, the plug PL1 is formed so as to protrude from the upper surface of the insulating film SO, that is, the upper surface of the interlayer insulating film PIL, so that the connection between the plug PL1 and the wiring W1 can be ensured even if the whole wiring W1 is formed inside the interlayer insulating film WIL1. Also, in the second embodiment, a ratio of a portion of the wiring W1 which is formed inside the insulating film IL2 which is the low dielectric constant film is larger than that in the above-described first embodiment, so that the surface area of the wiring W1 which is formed in the insulating film IL2 which is the low dielectric constant film is increased, and therefore, the effect of reducing the inter-wiring capacitance can be expected more than the above-described first embodiment.

Hereinafter, a method of manufacturing the semiconductor device according to the second embodiment will be explained with reference to the drawings. Each of FIGS. 28 to 33 is a cross-sectional view of a principal part of the semiconductor device according to the second embodiment in a manufacturing step, and illustrates a cross section corresponding to the above-described cross section A.

The steps illustrated in the above-described FIGS. 4 to 8 of the above-described first embodiment are also similarly performed in the second embodiment.

Note that, also in the second embodiment, in the following steps, an upper surface of the insulating film SO is synonymously used with an upper surface of the interlayer insulating film PIL, and an inside of the insulating film SO is synonymously used with an inside of the interlayer insulating film PIL.

Figure 28:
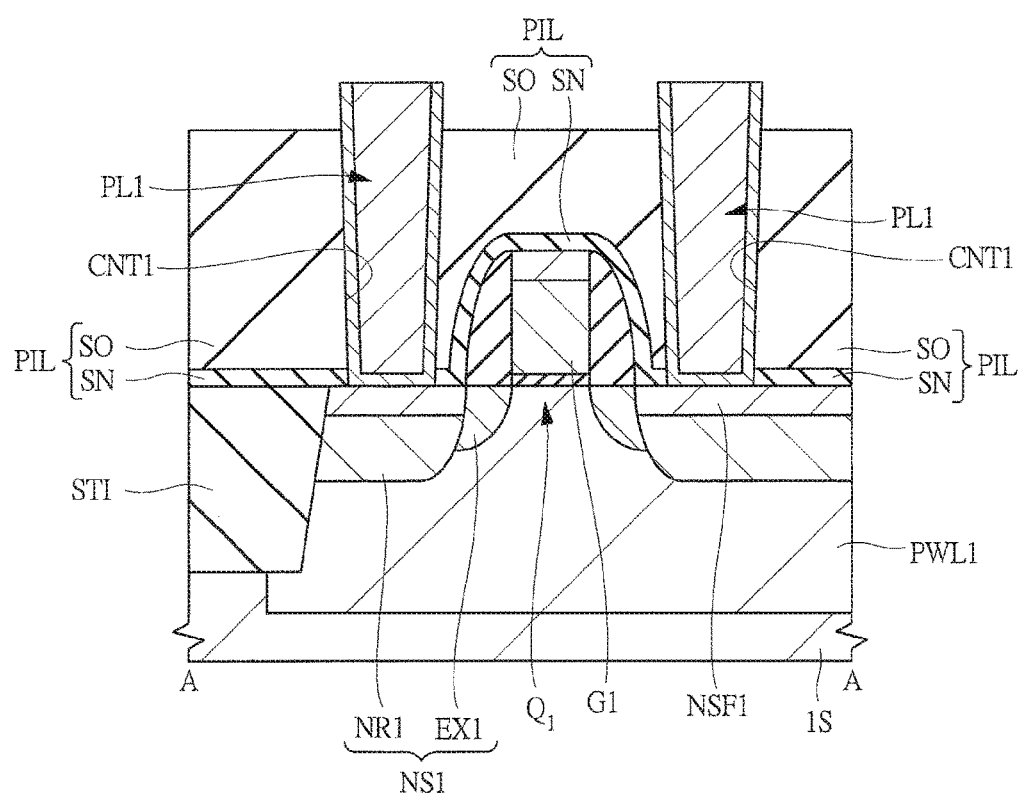
FIG. 28 is a cross-sectional view of the principal part (cross-sectional view taken along the line A-A) of the semiconductor device according to the second embodiment of the present invention in a manufacturing step thereof.

After the step illustrated in the above-described FIG. 8 of the above-described first embodiment, the upper surface of the insulating film SO is made to recede in the second embodiment as illustrated in FIG. 28. In the second embodiment, this receding amount (an amount of making the upper surface of the insulating film SO to recede) is larger than the receding amount (the amount of making the upper surface of the insulating film SO to recede) in the above-described first embodiment, and is, for example, 35 nm. As described in the first embodiment above, the method of making the insulating film SO to recede can be performed by dry etching, wet etching, or a CMP method by using a polishing liquid having a high selectivity for the insulating film SO.

After the insulating film SO is made to recede, the upper surface of the insulating film SO is lower than the upper surface of the plug PL1 as illustrated in FIG. 28. That is, the upper surface of the insulating film SO is made to recede so that the plug PL1 protrudes from the upper surface of the insulating film SO. In the second embodiment, the receding amount of the insulating film SO is large as described above, and therefore, the protruding amount of the plug PL1 from the upper surface of the insulating film SO, that is, a distance between the upper surface of the insulating film SO and the upper surface of the plug PL1 is larger than that of the above-described first embodiment. As described above, when the receding amount of the insulating film SO is, for example, 35 nm, the protruding amount of the plug PL1 from the upper surface of the insulating film SO, that is, the distance between the upper surface of the insulating film SO and the upper surface of the plug PL1 is 35 nm.

Next, as similar to the above-described first embodiment, a first-layer wiring is formed by a single damascene method. Hereinafter, a method of forming the first-layer wiring will be explained.

Figure 29:
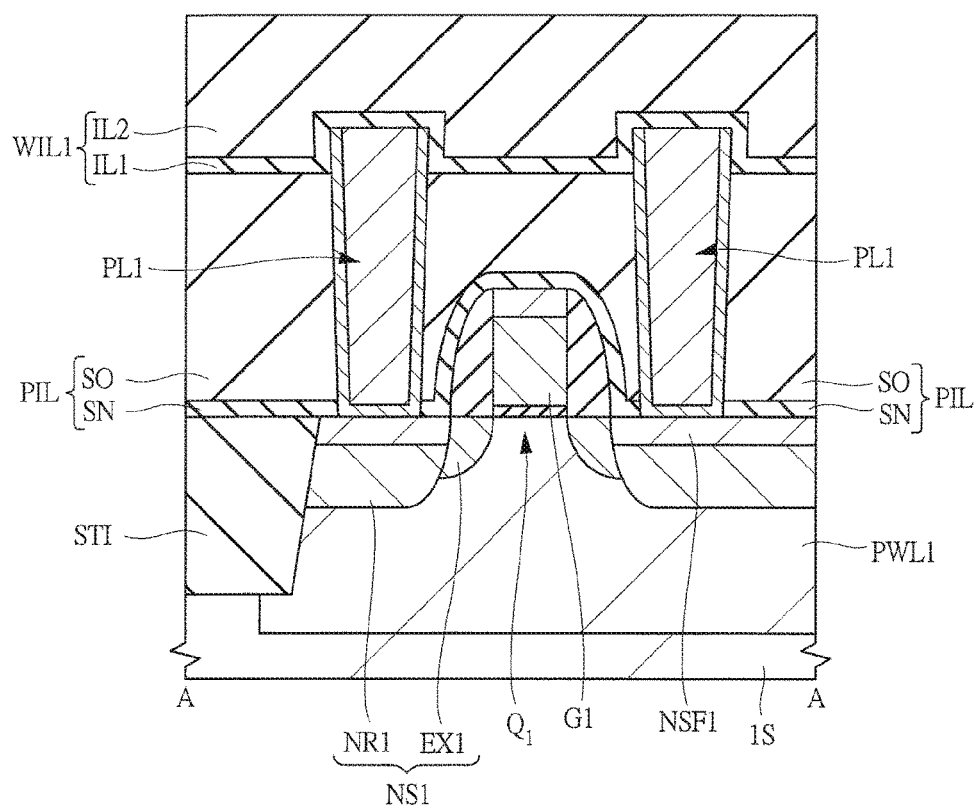
FIG. 29 is a cross-sectional view of the principal part (cross-sectional view taken along the line A-A) of the semiconductor device in a manufacturing step thereof continued from FIG. 28.

First, as illustrated in FIG. 29, the insulating film IL1 is formed on the interlayer insulating film PIL (the insulating film SO) and on the plug PL1, and then, the insulating film IL2 is formed on the insulating film IL1. The insulating film IL1 is formed thinner than the insulating film IL2. A thickness of the insulating film IL1 is, for example, 15 nm, and a thickness of the insulating film IL2 is, for example, 80 nm. By these insulating film IL1 and insulating film IL2, the interlayer insulating film WIL1 of the first-layer wiring is formed. Also in the second embodiment, as similar to the above-described first embodiment, the insulating film IL2 is formed of, for example, a SiOC film as a low dielectric constant film in order to reduce the inter-wiring capacitance. Further, as similar to the above-described first embodiment, the insulating film IL1 is formed of, for example, a silicon oxide film as an insulating film for covering the exposed semiconductor substrate 1S in order to prevent the abnormal electrical discharge upon the formation of the SiOC film of the insulating film.

Figure 30A:
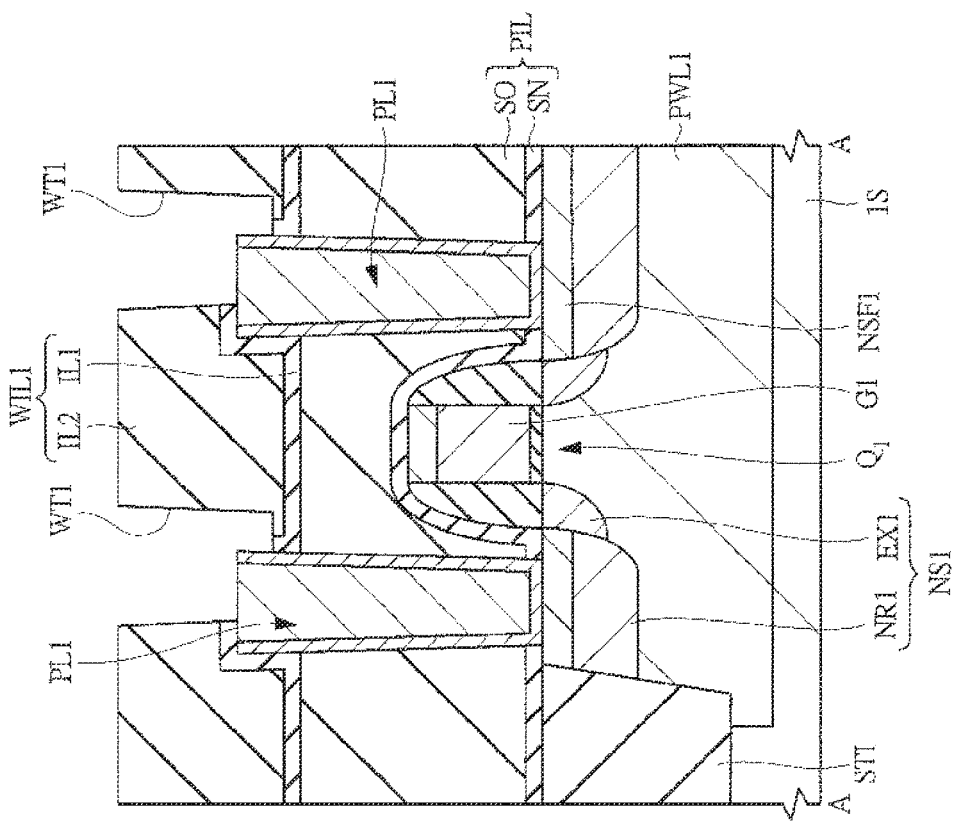
FIGS. 30A and 30B are cross-sectional views of the principal parts (cross-sectional views taken along the line A-A) of the semiconductor device in a manufacturing step thereof continued from FIG. 29.
Figure 30B:
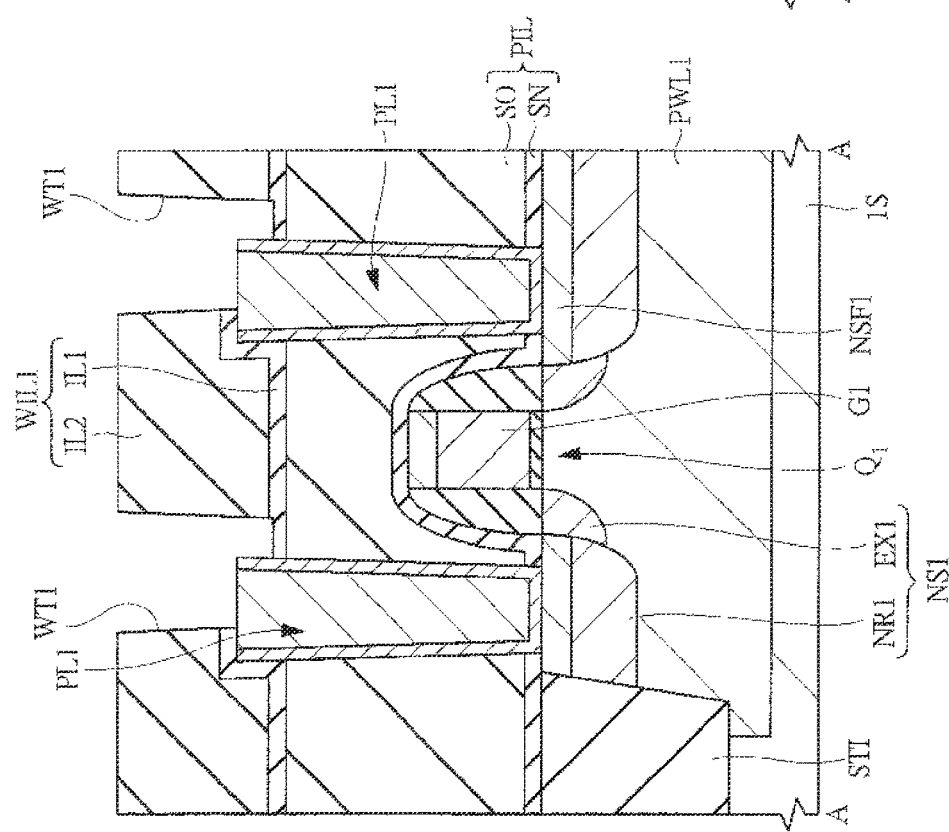

Next, as illustrated in FIGS. 30A and 30B, the wiring trench WT1 is formed in the interlayer insulating film WIL1. A depth of the interlayer insulating film WIL1 is, for example, 90 nm.

In the second embodiment, the wiring trench WT1 is formed inside the interlayer insulating film WIL1, and the lowermost surface of the wiring trench WT1 is also formed inside the interlayer insulating film WIL1. That is, in the second embodiment, the wiring trench WT1 is not embedded (buried) inside the insulating film SO, and therefore, the lowermost surface of the wiring trench WT1 is formed inside the interlayer insulating film WIL1.

Each of FIGS. 30A and 30B illustrates a case that the wiring trench WT1 is formed at a position shifted from the plug PL1 in a direction parallel to the cross section A as similar to the above-described FIG. 19 according to the above-described first embodiment.

FIG. 30A illustrates a case that the whole of the lowermost surface of the wiring trench WT1 is formed inside the insulating film IL1. In this case, the lowermost surface of the wiring trench WT1 is formed of an exposed surface of the insulating film IL1, and the lowermost surface of the wiring W1 to be buried in this wiring trench WT1 later is in contact with this exposed surface of the insulating film IL1. Note that, also in the second embodiment, a state that the wiring trench WT1 is formed inside the interlayer insulating film WIL1 also includes a state that the lowermost surface of the wiring trench WT1 matches with the lower surface of the insulating film IL1 (that is, the lowermost surface of the wiring trench WT1 is on the same plane as that of the lower surface of the insulating film IL1). In this case, the lowermost surface of the wiring trench WT1 is formed of the upper surface of the insulating film SO, and the lowermost surface of the wiring W1 to be buried in this wiring trench WT1 later is in contact with the upper surface of the insulating film SO.

When the wiring trench WT1 is formed as illustrated in FIG. 30A, the wiring trench WT1 can be formed so that the lowermost surface of the wiring trench WT1 is positioned lower than the upper surface of the plug PL1 and also higher than (for example, 5 nm higher than) the upper surface of the insulating film SO (the interlayer insulating film PIL).

On the other hand, as illustrated in FIG. 30B, a case that the lowermost surface of the wiring trench WT1 is formed over both of the insulating film IL1 and the insulating film IL2, that is, a case that the lowermost surface of the wiring trench WT1 is formed inside the insulating film IL1 and in the insulating film IL2 is also included in the second embodiment. In this case, the lowermost surface of the wiring trench WT1 is formed of the exposed surfaces of the insulating films IL1 and IL2, and the lowermost surface of the wiring W1 to be buried in this wiring trench WT1 later is in contact with these exposed surfaces of the insulating films IL1 and IL2.

In the step illustrated in the above-described FIG. 28, when the receding amount of the insulating film SO is further increased so as to be, for example, 50 nm, and besides, a thickness of the insulating film IL2 is, for example, 95 nm, the wiring trench WT1 is formed so that the depth of the wiring trench WT1 is equal to the depth of the wiring trench WT1 of FIG. 30A and that the lowermost surface of the wiring trench WT1 is over both of the insulating film IL1 and the insulating film IL2 as illustrated in FIG. 30B. When the wiring trench WT1 is formed as illustrated in FIG. 30B of the second embodiment, the wiring trench WT1 can be formed so that the lowermost surface of the wiring trench WT1 is positioned lower than the upper surface of the plug PL1, and besides, for example, 20 nm higher than the upper surface of the insulating film SO (the interlayer insulating film PIL).

In order to form the wiring trench WT1 in the state as illustrated in FIG. 30A, as described in the first embodiment above, the interlayer insulating film WIL1 may be dry-etched by using a photoresist pattern (a patterned photoresist film) formed by a photolithography technique as a mask (an etching mask). In this etching step, an etching endpoint of the insulating film IL2 is detected in, for example, a scribe region at the time when the etching of the insulating film IL2 reaches a surface of the insulating film IL1 (that is, at the time when a part of the surface of the insulating film IL1 is exposed). Also after that (after the endpoint detection), as similar to the first embodiment, the etching (the etching of the insulating film IL1) in which etching time is controlled to a predetermined time (a certain time) is performed, so that the wiring trench WT1 is completed. Finally, at least a part of the upper surface (the upper portion) of the plug PL1 and a part of the side surfaces thereof are exposed because of the wiring trench WT1. In this case, the step of forming the wiring trench WT1 includes: a first step of etching the insulating film IL2; a second step of detecting the etching endpoint of the insulating film IL2 when the etching in the first step reaches the upper surface of the insulating film IL1;

and a third step of etching the insulating film IL1 after the second step. In this manner, by detecting the etching endpoint of the insulating film IL2, a process of the dry etching for forming the whole wiring trench WT1 is divided into two stages (the first step and the third step), so that the processing accuracy of the etching can be improved.

On the other hand, in order to form the wiring trench WT1 in the state as illustrated in FIG. 30B, it is required to perform the whole etching for forming the wiring trench WT1 by a step of etching (etching of the insulating film IL2 and the insulating film IL1) in which etching time is controlled. This is because, in the step of forming the wiring trench WT1 as illustrated in FIG. 30B, the etching thereof does not reach the insulating film IL1 in the region where the endpoint detection is observed such as the scribe region. Therefore, the processing accuracy of the etching for forming the wiring trench WT1 can be improved in the case illustrated in FIG. 30A better than the case illustrated in FIG. 30B.

Also, when the insulating film IL1 remains on the side surfaces of the plug PL1 even after the dry etching in this step (that is, after the dry etching step for forming the wiring trench WT1), it is preferred to remove the insulating film IL1 remaining on the side surfaces of the plug PL1 so as to expose the side surfaces of the plug PL1 from the wiring trench WT1 by further performing wet etching or others. In this manner, an exact connection between the wiring W1 to be formed in a later step and the plug PL1 can be ensured.

Also in the second embodiment, since the insulating film SO is made to recede by the step illustrated in FIG. 28, the upper surface of the plug PL1 is formed at a position higher than the upper surface of the insulating film SO. On the other hand, the lowermost surface of the wiring trench WT1 is formed inside the interlayer insulating film WIL1, and besides, the lowermost surface of the wiring trench WT1 is formed at a position lower than the upper surface of the plug PL1. Therefore, at least a part of the upper surface of the plug PL1 and a part of the side surfaces of the plug PL1 are exposed because of the wiring trench WT1, and therefore, when a conductive film is buried in the wiring trench WT1 in a later step, the conductive film buried in this wiring trench WT1 and the plug PL1 can be reliably connected to each other.

Further, in the second embodiment, the etching (etching for forming the wiring trench WT1) is performed so that the whole wiring trench WT1 is formed inside the interlayer insulating film WIL1 but is not formed inside the insulating film SO, and therefore, the lowermost surface of the wiring trench WT1 is formed at a position separated from the gate electrode G1 by at least a distance from the upper surface of the gate electrode G1 to the upper surface of the insulating film SO.

Figure 31:
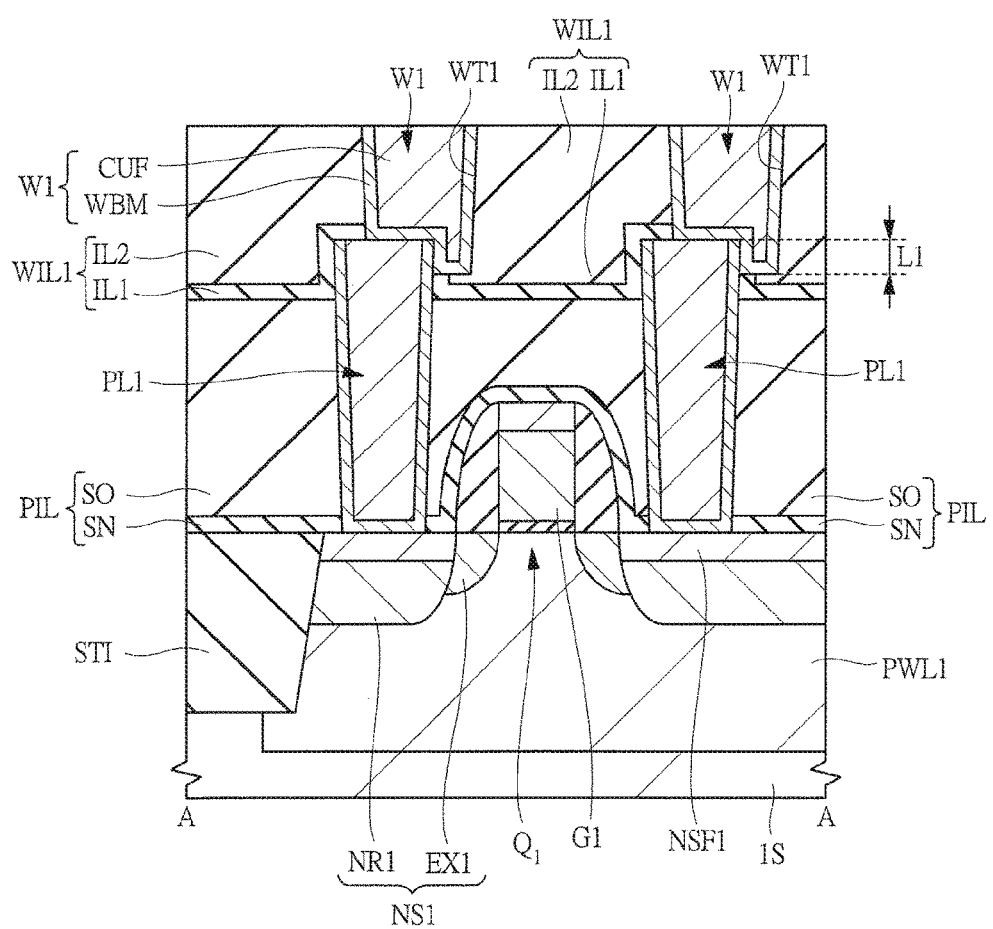
FIG. 31 is a cross-sectional view of the principal part (cross-sectional view taken along the line A-A) of the semiconductor device in a manufacturing step thereof continued from FIGS. 30A and 30B.

Next, as similar to the above-described first embodiment, the barrier conductor film WBM is formed on the interlayer insulating film WIL1 including a portion on the inner wall (the side walls and the bottom portion) of the wiring trench WT1, the conductor film CUF is formed on the barrier conductor film WBM so as to be buried inside the wiring trench WT1, and then, unnecessary portions of the conductor film CUF and the barrier conductor film WBM formed outside the wiring trench WT1 are polished and removed by using a CMP method, so that the wiring W1 is formed as illustrated in FIG. 31. The wiring W1 is formed of the conductor film CUF and the barrier conductor film WBM buried and remaining inside the wiring trench WT1. The wiring trench WT1 is formed inside the interlayer insulating film WIL1, and the lowermost surface of the wiring trench WT1 is also formed inside the interlayer insulating film WIL1, and therefore, the lowermost surface of the wiring W1 formed by burying the barrier conductor film WBM and the conductor film CUF in the wiring trench WT1 is also formed inside the interlayer insulating film WIL1.

FIG. 31 illustrates the case that the lowermost surface of the wiring W1 is formed over both of the insulating film IL1 and the insulating film IL2, that is, the case that the wiring W1 is formed by burying the barrier conductor film WBM and the conductor film CUF in the wiring trench WT1 formed as illustrated in FIG. 30B. On the other hand, the above-described FIG. 27 illustrates the case that the wiring W1 is formed by burying the barrier conductor film WBM and the conductor film CUF in the wiring trench WT1 formed as illustrated in FIG. 30A. In FIGS. 27 and 31, the depth of the wiring W1 is similar to that of the wiring trench WT1, which is, for example, 90 nm, and the position of the lowermost surface of the wiring W1 is also similar to the position of the lowermost surface of the wiring trench WT1 illustrated in FIGS. 30A and 30B. That is, the whole of the lowermost surface of the wiring W1 is formed inside the insulating film IL1 in the case of FIG. 27, but the lowermost surface of the wiring W1 is formed inside the insulating film IL1 and the insulating film IL2 in the case of FIG. 31.

Also in the second embodiment, as illustrated in FIGS. 27 and 31, the upper surface of the plug PL1 is formed at a position higher than the upper surface of the insulating film SO, and besides, the lowermost surface of the wiring W1 is formed at a position lower than the upper surface of the plug PL1, and therefore, at least a part of the upper surface of the plug PL1 and a part of the side surfaces thereof are covered with the wiring W1. In this manner, the connection between the plug PL1 and the wiring W1 can be ensured, so that the reliability of the connection between the plug PL1 and the wiring W1 can be improved.

Further, in the second embodiment, the receding amount of the insulating film SO from the upper surface of the plug PL1 is larger than that of the first embodiment as described above. Therefore, even when the plug PL1 and the wiring W1 are formed so that the connection between the plug PL1 and the wiring W1 is sufficiently ensured, the wiring W1 is not formed inside the insulating film SO but the whole wiring W1 is formed inside the interlayer insulating film WIL1. That is, even when the plug PL1 and the wiring W1 are formed so that the connection between the plug PL1 and the wiring W1 is sufficiently ensured, the lowermost surface of the wiring W1 is not formed inside the insulating film SO but the whole wiring W1 is formed inside the interlayer insulating film WIL1. In this manner, as ensuring the connection between the plug PL1 and the wiring W1, the ratio of the portion of the wiring W1 which is formed inside the insulating film IL2 which is the low dielectric constant film can be increased. In other words, as ensuring the connection between the plug PL1 and the wiring W1, the surface area of the wiring W1 which is formed inside the insulating film IL2 which is the low dielectric constant film can be increased. Therefore, for example, the inter-wiring capacitance between adjacent wirings W1 can be reduced.

In the second embodiment, since the whole wiring W1 is formed inside the interlayer insulating film WIL1, the ratio of the portion of the wiring W1 which is formed inside the low dielectric constant film (the insulating film IL2) can be increased more than that of the above-described first embodiment. Therefore, the inter-wiring capacitance can be reduced further than that of the above-described first embodiment.

Still further, the ratio of the portion of the wiring W1 which is formed inside the insulating film IL2 which is the low dielectric constant film is larger in the case that the wiring trench WT1 and the wiring W1 buried therein are formed as illustrated in FIG. 31 than the case that the wiring trench WT1 and the wiring W1 buried therein are formed as illustrated in FIG. 27, and therefore, it can be said that the effect of reducing the inter-wiring capacitance is large.

Still further, in the second embodiment, by forming the upper surface of the plug PL1 higher than the upper surface of the insulating film SO, even if the whole wiring W1 is formed inside the interlayer insulating film WIL1, the length L1 by which the wiring W1 and the plug PL1 are overlapped with each other in the direction perpendicular to the semiconductor substrate 1S can be ensured by, for example, 30 nm. That is, without the state that the wiring W1 is embedded (buried) inside the insulating film SO, the length L1 by which the wiring W1 and the plug PL1 are overlapped with each other in the direction perpendicular to the semiconductor substrate 1S is ensured. Therefore, even if the microfabrication of wirings is achieved, the state that the wiring W101 is formed inside the insulating film SO as the case of the manufacturing step of the above-described comparative example is not provided, and therefore, it is possible to avoid the increase in the inter-wiring capacitance between the wirings W1 due to the increase in the ratio of the portion of the wiring W1 which is formed inside the insulating film SO.

Still further, as described above, by forming the lowermost surface of the wiring trench WT1 so as to be separated from the gate electrode G1 by a predetermined distance (a certain distance) or farther, the shortening of the distance between the wiring W1 and the gate electrode G1 can be avoided, so that the reduction in the reliability between the wiring W1 and the gate electrode G1 can be avoided. In the second embodiment, the case that the insulating film IL2 is formed of the low dielectric constant film has been described. However, it is not always required to form the insulating film IL2 from the low dielectric constant film regarding the effect of avoidance of the reduction in the reliability between the wiring W1 and the gate electrode G1. In this case, the insulating film IL2 can be formed of, for example, a silicon oxide film as an insulating film.

In the second embodiment, the above-described effect can be obtained by forming the upper surface of the plug PL1 so as to be even slightly higher than the upper surface of the insulating film SO as similar to the above-described first embodiment. Here, a more preferable condition used when the plug PL1 and the wiring W1 are formed will be explained.

Figure 32:
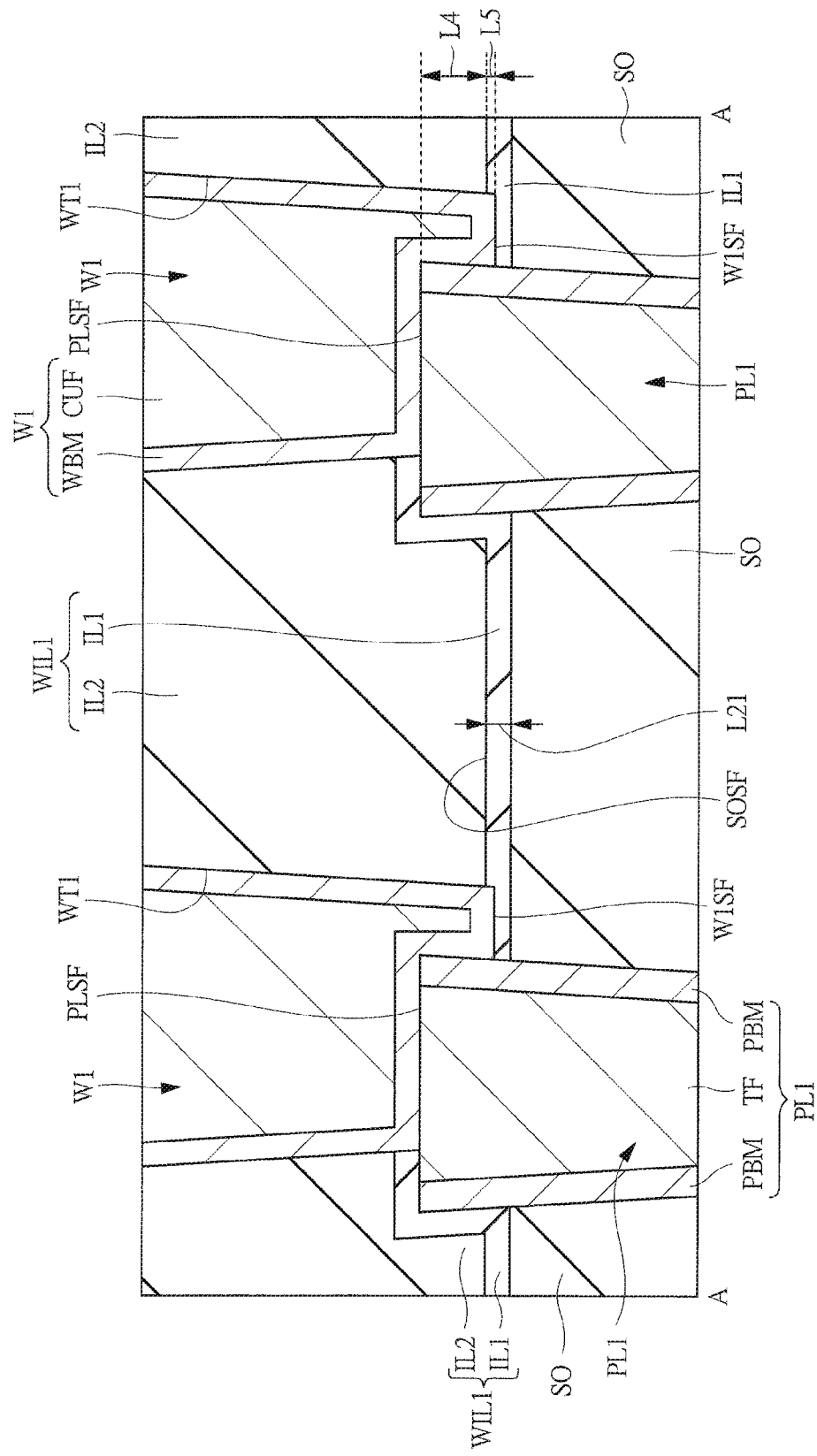
FIG. 32 is an enlarged cross-sectional view of a principal part of an enlarged periphery of a region where a plug and a wiring are connected in FIG. 27.

FIG. 32 is an enlarged cross-sectional view of a principal part (a partially-enlarged cross-sectional view) of an enlarged periphery of a region where the plug PL1 and the wiring W1 are connected to each other in FIG. 27. Hereinafter, with reference to FIG. 32, a more preferable condition for the formation of the plug PL1 and the wiring W1 will be explained.

As illustrated in FIG. 32, a difference between a distance from the upper surface of the insulating film SO to the upper surface of the plug PL1 and a thickness of the insulating film IL1 is set as a length L4. Meanwhile, a difference between the thickness of the insulating film IL1 and a distance from the upper surface of the insulating film SO to the lowermost surface of the wiring W1 is set as a length L5. Here, in the case of FIG. 32, addition of the length L4 and the length L5 corresponds to the above-described length L1 (that is, "L1=L4+L5"). Note that, for easily understanding, in FIG. 32, the upper surface of the insulating film SO is provided with a reference symbol SOSF so as to be represented as an upper surface SOSF of the insulating film SO, the upper surface of the plug PL1 is provided with a reference symbol PLSF so as to be represented as an upper surface PLSF of the plug PL1, the lowermost surface of the wiring W1 is provided with a reference symbol W1SF so as to be represented as the lowermost surface W1SF of the wiring W1, and the thickness of the insulating film IL1 is provided with a reference symbol L21 so as to be represented as a thickness L21 of the insulating film IL1.

At this time, it is desired to establish a relation of "L4>L5" between the length L4 and the length L5 (that is, it is desired that the length L4 is larger than the length L5). By forming the plug PL1 and the wiring W1 so as to establish the relation of "L4>L5", the connection between the plug PL1 and the wiring W1 in the direction perpendicular to the semiconductor substrate 1S can be ensured as avoiding increase in a forming amount of the wiring W1 (that is, an amount corresponding to the length L5) which is embedded (buried) inside the insulating film IL1 which is a part of the interlayer insulating film WIL1 and is formed on a lower side of the low dielectric constant film (the insulating film IL2). Also, by avoiding the increase in the forming amount of the wiring W1 (that is, the amount corresponding to the length L5) which is embedded (buried) inside the insulating film IL1, the ratio of the portion of the wiring W1 which is formed inside the insulating film IL2 which is the low dielectric constant film is increased. In other words, by avoiding the increase in the forming amount of the wiring W1 (that is, the amount corresponding to the length L5) which is embedded (buried) inside the insulating film IL1, the area where the wiring W1 and the insulating film IL2 which is the low dielectric constant film are in contact with each other can be increased. Therefore, for example, the inter-wiring capacitance between adjacent wirings W1 can be reduced. More particularly, by shortening the length L5 as small as possible, the amount of the portion of the wiring W1 which is formed inside the insulating film IL1 is decreased, so that the inter-wiring capacitance can be effectively reduced. In the second embodiment, by setting relations of, for example, "L4=20 nm" and "L5=10 nm", the above-described condition (the relation of "L4>L5") is satisfied.

Figure 33:
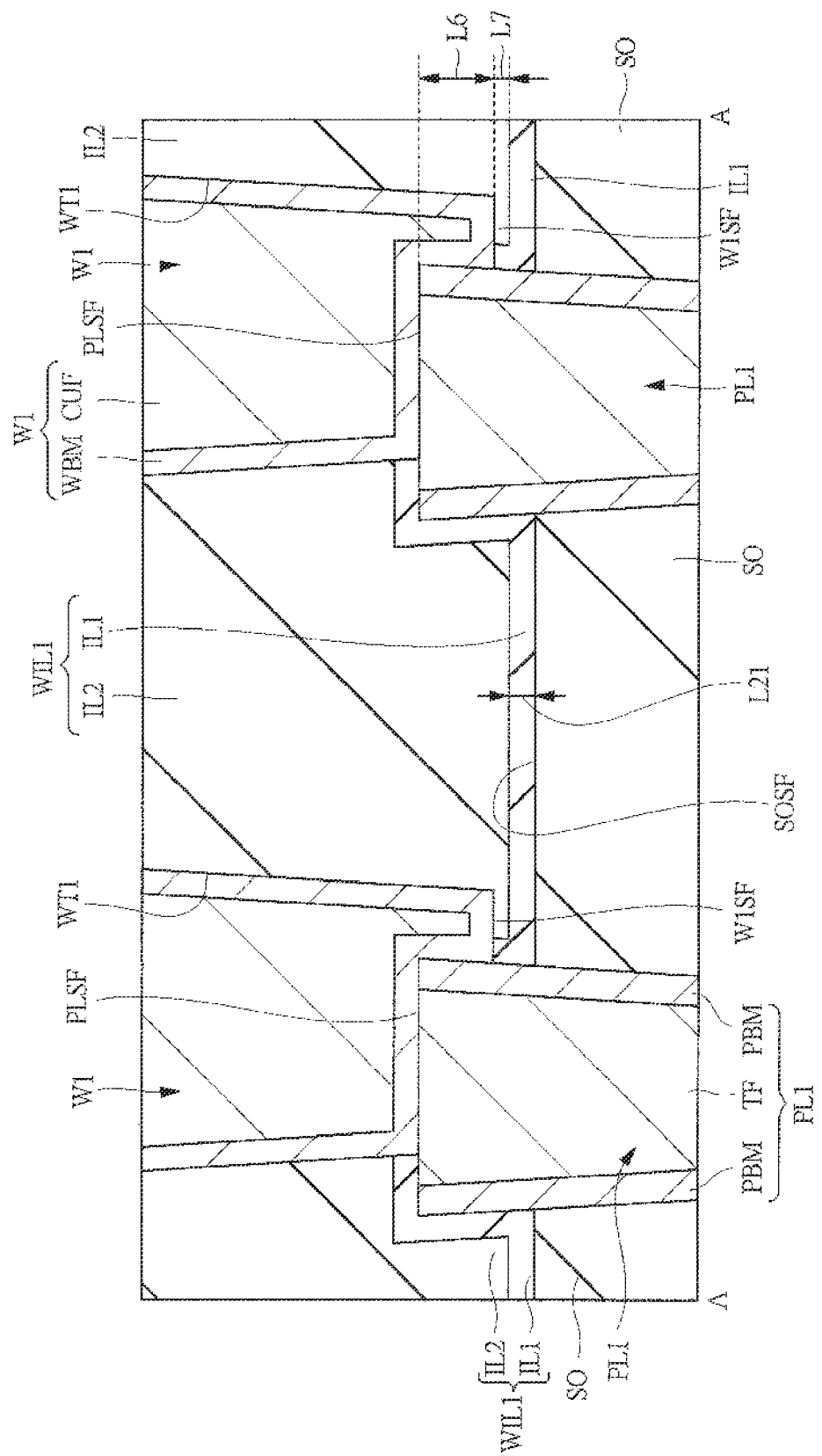
FIG. 33 is an enlarged cross-sectional view of a principal part of an enlarged periphery of a region where a plug and a wiring are connected in FIG. 31.

FIG. 33 is an enlarged cross-sectional view of a principal part (a partially-enlarged cross-sectional view) an enlarged periphery of a region where the plug PL1 and the wiring W1 are connected to each other in FIG. 31. Hereinafter, with reference to FIG. 33, a more preferable condition for the formation of the plug PL1 and the wiring W1 will be explained.

As illustrated in FIG. 33, a distance from the lowermost surface of the wiring W1 to the upper surface of the plug PL1 is set as a length L6. Meanwhile, a difference between a thickness of the insulating film IL1 and a distance from the upper surface of the insulating film SO to the lowermost surface of the wiring W1 is set as a length L7. Here, in the case of FIG. 33, the length L6 corresponds to the above-described length L1 (that is, "L6=L1"). Note that, for easily understanding, in FIG. 33, the upper surface of the insulating film SO is provided with a reference symbol SOSF so as to be represented as an upper surface SOSF of the insulating film SO, the upper surface of the plug PL1 is provided with a reference symbol PLSF so as to be represented as an upper surface PLSF of the plug PL1, the lowermost surface of the wiring W1 is provided with a reference symbol W1SF so as to be represented as the lowermost surface W1SF of the wiring W1, and the thickness of the insulating film IL1 is provided with a reference symbol L21 so as to be represented as a thickness L21 of the insulating film IL1.

At this time, it is desired to establish a relation of "L6>L7" between the length L6 and the length L7 (that is, it is desired that the length L6 is larger than the length L7). By forming the plug PL1 and the wiring W1 so as to establish the relation of "L6>L7", the wiring W1 can be formed inside the interlayer insulating film WIL1 as decreasing a receding amount of the insulating film SO in the step of making the insulating film SO to recede as illustrated in the above-described FIG. 28, and besides, as ensuring the connection between the plug PLI1 and the wiring W1 in the direction perpendicular to the semiconductor substrate 1S in a later step. Therefore, reduction in controllability of the step of making the insulating film SO to recede and repeatability thereof can be suppressed or prevented.

Also, the ratio of the portion of the wiring W1 which is formed inside the insulating film IL2 which is the low dielectric constant film is larger in the case that the wiring W1 is formed as illustrated in FIG. 33 than the case that the wiring W1 is formed as illustrated in FIG. 32, and therefore, the effect of reducing the inter-wiring capacitance is large. More particularly, by shortening the length L7 as small as possible, the receding amount of the insulating film SO in the step illustrated in FIG. 28 can be minimized, and therefore, this is more preferable. In the second embodiment, by setting relation of, for example, "L6=30 nm" and "L7=5 nm", the above-described condition (the relation of "L6>L7") is satisfied.

In a later step (a step after the formation of the wiring W1), as similar to that of the above-described first embodiment, a second-layer wiring is formed. However, illustration and explanation thereof are omitted here.

Also in the second embodiment, the manufacturing method has been explained as similar to the above-described first embodiment with reference to the drawings in the case that the diameter of the upper surface of the plug PL1 and the width of the lower surface of the wiring W1 are formed so as to be about equal to each other. However, the manufacturing step is not limited to such a case, and can be effectively applied to a case that the diameter of the plug PL1 is larger than the width of the lower surface of the wiring W1 and a case that the diameter of the plug PL1 is smaller than the width of the lower surface of the wiring W1.

According to the second embodiment, after the polishing for forming the plug PL1, the surface (the upper surface) of the insulating film SO is made to recede so that the upper surface of the plug PL1 is higher than the upper surface of the insulating film SO. By making the surface (the upper surface) of the insulating film SO to recede, the connection between the plug PL1 and the wiring W1 in the direction perpendicular to the semiconductor substrate 1S can be ensured even if the wiring W1 to be formed later is not formed so as to be embedded (buried) inside the insulating film SO. Further, by forming the wiring W1 so as not to be embedded (buried) inside the insulating film SO, that is, by forming the wiring W1 only inside the interlayer insulating film WIL1, the ratio of the portion of the wiring W1 which is formed inside the insulating film IL2 which is the low dielectric constant film is increased, and the surface area of the wiring W1 which is formed inside the insulating film IL2 which is the low dielectric constant film is increased, and therefore, the inter-wiring capacitance can be reduced. Still further, by forming the wiring W1 so as not to be embedded (buried) inside the insulating film SO, the increase in the inter-wiring capacitance can be avoided even if the microfabrication of wirings is achieved.

Third Embodiment

In the above-described first and second embodiments, the interlayer insulating film WIL1 in which the wiring W1 is formed is formed of the stacked film formed of the insulating film IL1 and the insulating film IL2. However, in a third embodiment, the interlayer insulating film WIL1 is formed of one layer of the insulating film IL2 without forming the insulating film IL1 as a part of the interlayer insulating film WIL.

Figure 34:
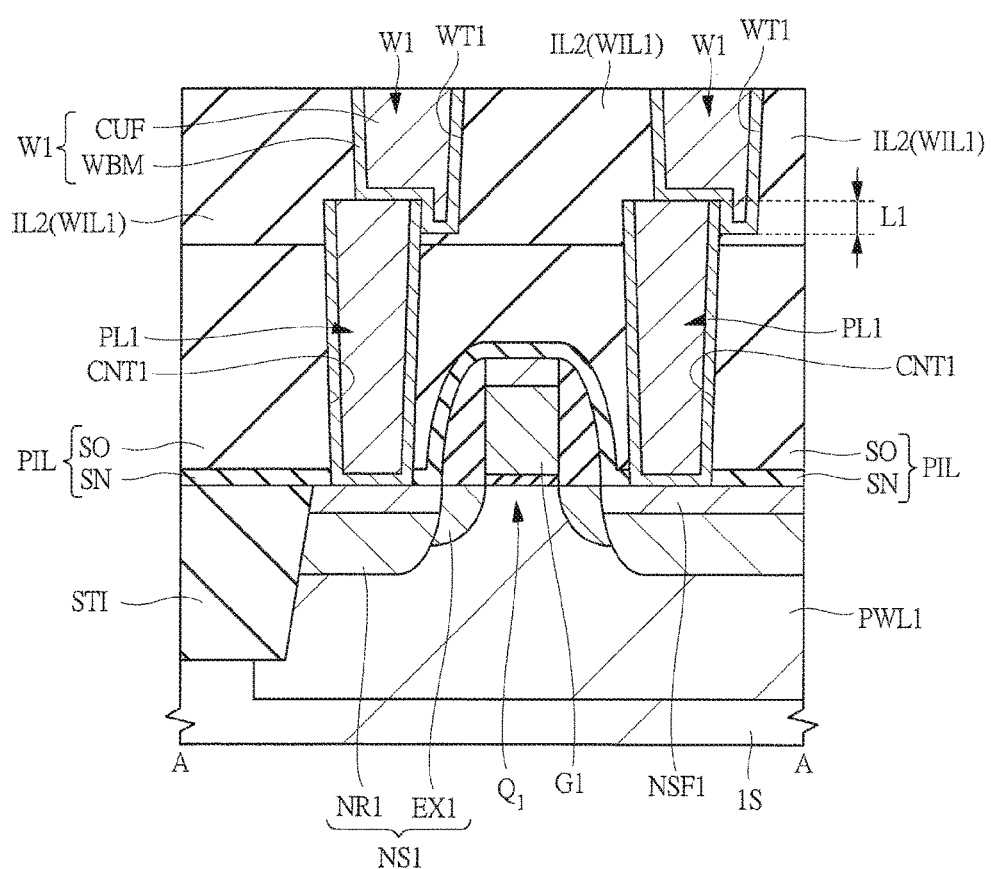
FIG. 34 is a cross-sectional view of a principal part (cross-sectional view taken along a line A-A) of a semiconductor device according to a third embodiment of the present invention.

FIG. 34 is a cross-sectional view of a principal part of a semiconductor device according to the third embodiment, and illustrates a cross section corresponding to the cross section A (the cross section taken along the line A-A) illustrated in the above-described FIG. 2 of the above-described first embodiment.

As illustrated in FIG. 34, in the semiconductor device according to the third embodiment, the upper surface of the plug PL1 is formed higher than the upper surface of the insulating film SO, that is, the upper surface of the interlayer insulating film PIL as similar to the semiconductor devices of the above-described first and second embodiments. Also, in the semiconductor device according to the third embodiment, the whole wiring W1 is formed inside the interlayer insulating film WIL1 as similar to the above-described second embodiment. That is, the lowermost surface of the wiring W1 is formed inside the interlayer insulating film WIL1. On the other hand, in the semiconductor device according to the third embodiment, the insulating film IL1 is not formed as different from the above-described first and second embodiments. That is, the interlayer insulating film WIL1 is formed of one layer of the insulating film IL2. Therefore, in the semiconductor device according to the third embodiment, the whole wiring W1 is formed inside the insulating film IL2 which is the low dielectric constant film.

In the third embodiment, by forming the plug PL1 so as to protrude from the upper surface of the insulating film SO, that is, the upper surface of the interlayer insulating film PIL, the connection between the plug PL1 and the wiring W1 can be ensured even if the whole wiring W1 is formed inside the insulating film IL2. Also, in the third embodiment, since the whole wiring W1 is formed inside the insulating film IL2 which is the low dielectric constant film, the effect of reducing the inter-wiring capacitance can be expected further than the above-described first and second embodiments.

Figure 36:
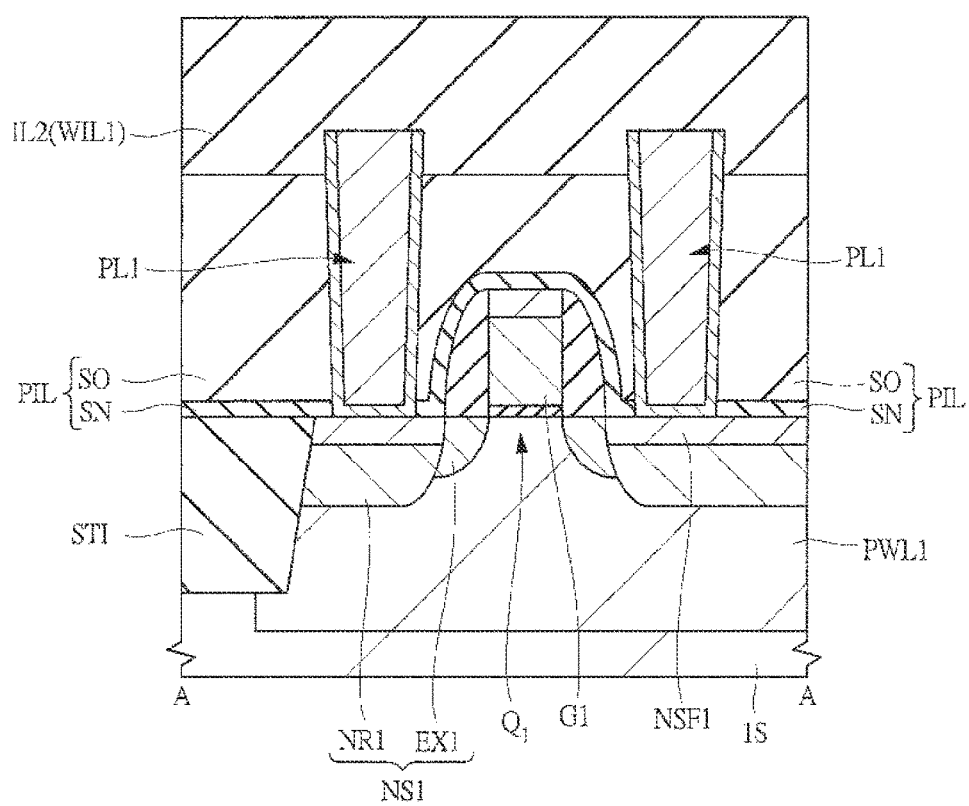
FIG. 36 is a cross-sectional view of the principal part (cross-sectional view taken along the line A-A) of the semiconductor device in a manufacturing step thereof continued from FIG. 35.
Figure 37:
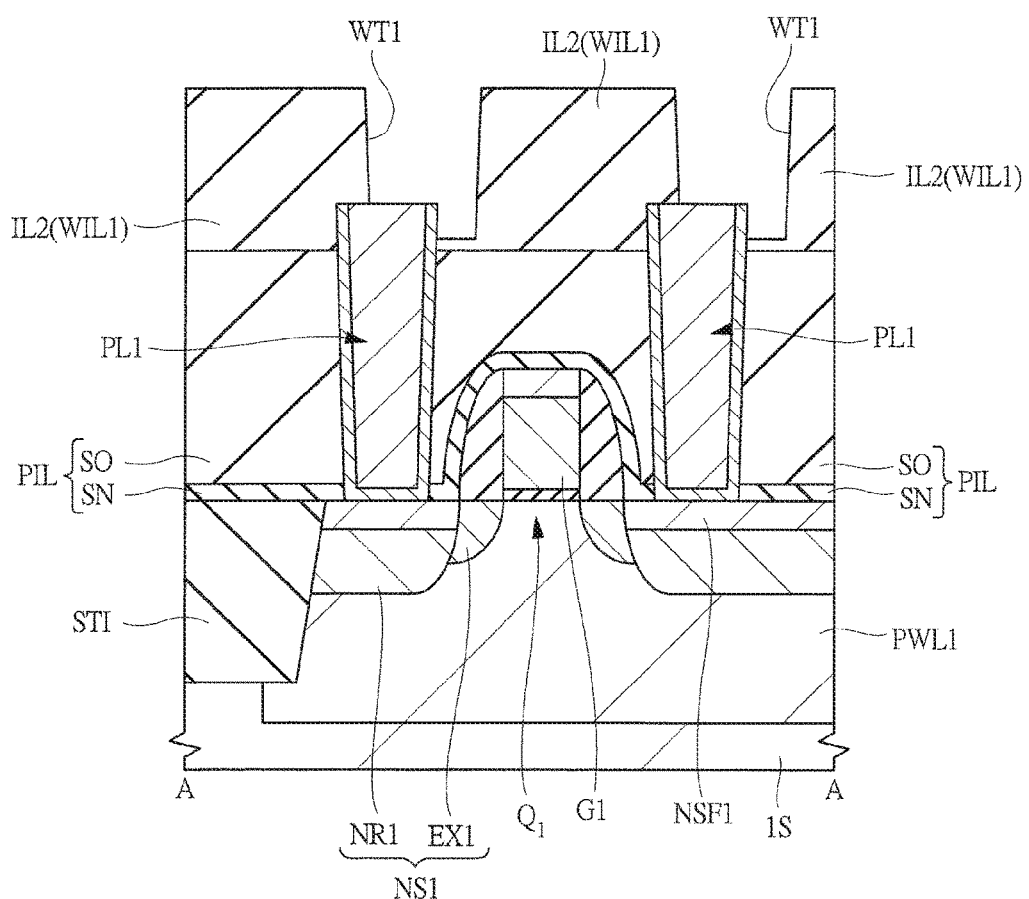
FIG. 37 is a cross-sectional view of the principal part (cross-sectional view taken along the line A-A) of the semiconductor device in a manufacturing step thereof continued from FIG. 36.

Hereinafter, a method of manufacturing the semiconductor device according to the third embodiment will be explained with reference to the drawings. Each of FIGS. 35 to 37 is a cross-sectional view of a principal part of the semiconductor device of the third embodiment in a manufacturing step, and illustrates a cross section corresponding to the above-described cross section A.

The steps illustrated in the above-described FIGS. 4 to 8 of the above-described first embodiment also similarly performed in the third embodiment.

Note that, also in the third embodiment, in the following steps, an upper surface of the insulating film SO is synonymously used with an upper surface of the interlayer insulating film PIL, and an inside of the insulating film SO is synonymously used with an inside of the interlayer insulating film PIL.

Figure 35:
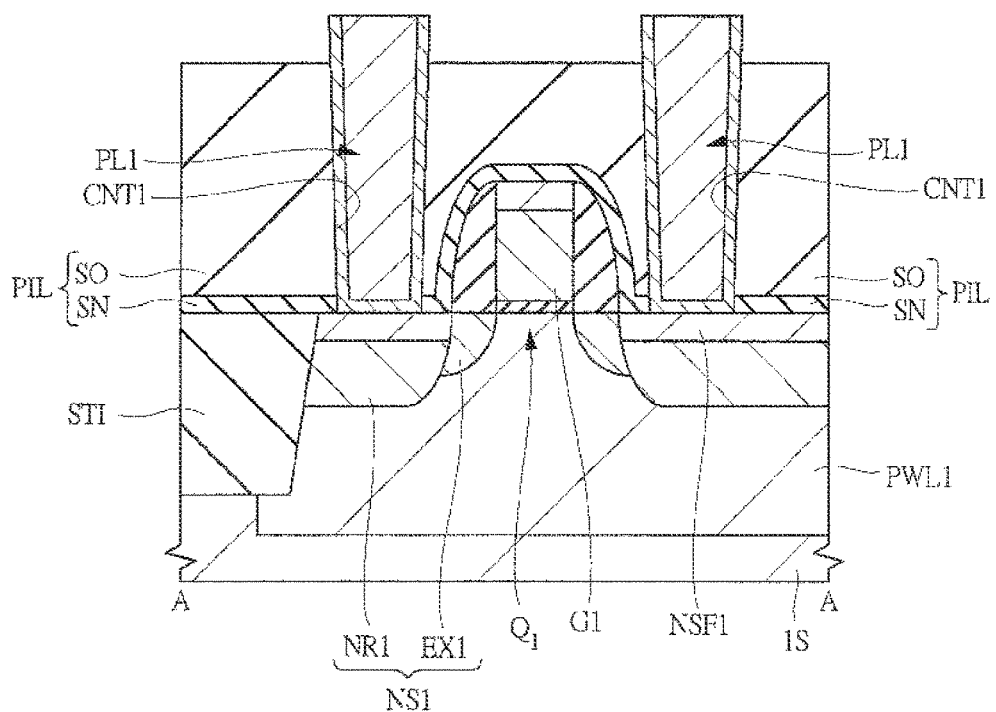
FIG. 35 is a cross-sectional view of the principal part (cross-sectional view taken along the line A-A) of the semiconductor device according to the third embodiment of the present invention in a manufacturing step thereof.

After the step illustrated in the above-described FIG. 8 of the above-described first embodiment, the upper surface of the insulating film SO is made to recede in the third embodiment as illustrated in FIG. 35. A receding amount of the upper surface of the insulating film SO is, for example, 35 nm. As described in the above-described first embodiment, the method of making the insulating film SO to recede can be performed by dry etching, wet etching, or a CMP method by using a polishing liquid having a high selectivity for the insulating film SO. After the insulating film SO is made to recede, the upper surface of the insulating film SO is lower than the upper surface of the plug PL1 as illustrated in FIG. 35. That is, the upper surface (the surface) of the insulating film SO is made to recede so that the plug PL1 protrudes from the upper surface of the insulating film SO. As described above, since the receding amount of the insulating film SO is, for example, 35 nm, a protruding amount of the plug PL1 from the insulating film SO, that is, a distance between the upper surface of the insulating film SO and the upper surface of the plug PL1 is, for example, 35 nm.

Next, a first-layer wiring is formed by a single damascene method. Hereinafter, a method of forming the first-layer wiring will be explained.

First, as illustrated in FIG. 36, the insulating film IL2 is formed on the interlayer insulating film PIL (the insulating film SO) and on the plug PL1. The insulating film IL2 is formed on the interlayer insulating film PIL (the insulating film SO) so as to cover a portion of the plug PL1 protruding from the upper surface of the interlayer insulating film PIL (the insulating film SO). The insulating film IL2 is formed of, for example, a SiOC film as a low dielectric constant film in order to reduce the inter-wiring capacitance. A thickness of the insulating film IL2 is, for example, 95 nm. In the third embodiment, as different from the above-described first and second embodiments, the insulating film IL1 is not formed before the formation of the insulating film IL2.

In the above-described first and second embodiments, the insulating film IL2 is formed in order to prevent abnormal electrical discharge upon the formation of the SiOC film. However, when there is no risk of the abnormal electrical discharge upon the formation of the SiOC film, when there is no requirement to form the insulating film IL2 by a low dielectric constant film other than the SiOC film or others so as to prevent the abnormal electrical discharge, or when there is no requirement to form the insulating film IL1 even as the etching stopper, the insulating film IL2 can be formed on the interlayer insulating film PIL (insulating film SO) including the portion on the plug PL1 without forming the insulating film IL1, and this manner corresponds to the third embodiment. Therefore, in the third embodiment, the interlayer insulating film WIL1 is formed of one layer of the insulating film IL2, and the insulating film IL2 indicates the interlayer insulating film WIL1 in the following steps.

Next, as illustrated in FIG. 37, the wiring trench WT1 is formed in the insulating film IL2. With the wiring trench WT1, at least a part of the upper surface (the upper portion) of the plug PL1 and a part of the side surfaces thereof are exposed. A depth of the wiring trench WT1 is, for example, 90 nm.

In the third embodiment, the whole wiring trench WT1 is formed inside the insulating film IL2. That is, in the third embodiment, the wiring trench WT1 is not embedded inside the insulating film SO, and the lowermost surface of the wiring trench WT1 is formed inside the insulating film IL2 which is the low dielectric constant film. Therefore, the lowermost surface of the wiring trench WT1 is formed of the exposed surface of the insulating film IL2, and the lowermost surface of the wiring W1 to be buried in this wiring trench WT1 later is in contact with this exposed surface of the insulating film IL2. The lowermost surface of the wiring trench WT1 is positioned lower than the upper surface of the plug PL1, and is positioned, for example, 5 nm higher than the upper surface of the insulating film SO. FIG. 37 illustrates a case that the wiring trench WT1 is formed at a position shifted from the plug PL1 in a direction parallel to the cross section A as similar to the above-described FIG. 19 in the above-described first embodiment.

In order to form the wiring trench WT1, the insulating film IL2 is dry-etched by using a photoresist pattern (a patterned photoresist film) formed by a photolithography technique as a mask (an etching mask) as described in the first embodiment. If the insulating film IL2 remains on a side surface of the plug PL1 after this dry etching, it is preferred to further perform wet etching or others after this dry etching so as to remove the insulating film IL2 remaining on the side surface of the plug PL1 and expose the side surface of the plug PL1 from the wiring trench WT1. In this manner, the exact connection between the wiring W1 to be formed in a later step and the plug PL1 can be ensured.

Also in the third embodiment, since the insulating film SO is made to recede by the step illustrated in FIG. 35, the upper surface of the plug PL1 is formed at a position higher than the upper surface of the insulating film SO. On the other hand, the lowermost surface of the wiring trench WT1 is formed inside the insulating film IL2, and besides, the lowermost surface of the wiring trench WT1 is formed at a position lower than the upper surface of the plug PL1. Therefore, at least a part of the upper surface of the plug PL1 and a part of the side surfaces of the plug PL1 are exposed because of the wiring trench WT1, so that, when a conductive film is buried in the wiring trench WT1 in a later step, the conductive film buried in this wiring trench WT1 and the plug PL1 can be reliably connected to each other.

In order to form the wiring trench WT1, the interlayer insulating film WIL1 may be dry-etched by using a photoresist pattern (a patterned photoresist film) formed by a photolithography technique as a mask (an etching mask) as described in the above-described first embodiment. However, in the third embodiment, the interlayer insulating film WIL1 is formed of one layer of the insulating film IL2, and besides, the lower surface of the wiring trench WT1 is formed inside the insulating film IL2, and therefore, there is no film for detecting an endpoint of the dry etching. Therefore, in the third embodiment, the etching for forming the wiring trench WT1 is performed by controlling etching time for the insulating film IL2. By performing the etching (the etching for the insulating film IL2) with controlling the etching time as the etching for forming the wiring trench WT1, the wiring trench WT1 having a desired depth can be formed even when the film for detecting the endpoint or an etching-stopper film is not formed. However, in the third embodiment, it is required to etch the whole wiring trench WT1 by controlling the etching time, and therefore, the detection of the endpoint as in the above-described first and second embodiments is more advantageous in a viewpoint of improvement of the processing accuracy of the wiring trench WT1.

Further, in the third embodiment, the etching for forming the wiring trench WT1 is performed so that the whole wiring trench WT1 is formed inside the insulating film IL 2 but the wiring trench WT1 is not formed inside the insulating film SO, and therefore, the lowermost surface of the wiring trench WT1 is formed at a position separated from the gate electrode G1 by at least a distance from the upper surface of the gate electrode G1 to the upper surface of the insulating film SO.

Next, as similar to the above-described first embodiment, the wiring W1 is formed as illustrated in the above-described FIG. 34 by forming the barrier conductor film WBM on the insulating film IL2 including the portion on the inner wall (the side surfaces and the bottom portion) of the wiring trench WT1, forming the conductor film CUF on the barrier conductor film WBM so as to be buried (be filled) inside the wiring trench WT1, and then, polishing and removing unnecessary portions of the conductor film CUF and the barrier conductor film WBM formed outside the wiring trench WT1 by using a CMP method. The wiring W1 is formed of the conductor film CUF and the barrier conductor film WBM buried and remaining inside the wiring trench WT1. A depth of the wiring W1 is similar to a depth of the wiring trench WT1, which is, for example, 90 nm. Also, a position of the lowermost surface of the wiring W1 is similar to a position of the lowermost surface of the wiring trench WT1 formed in FIG. 37. The wiring trench WT1 is formed inside the insulating film IL2, and the lowermost surface of the wiring trench WT1 is also formed inside the insulating film IL2, and therefore, the lowermost surface of the wiring W1 formed by burying the barrier conductor film WBM and the conductor film CUF in the wiring trench WT1 is also formed inside the insulating film IL2. Further, the upper surface of the plug PL1 is formed at a position higher than the upper surface of the insulating film SO, and besides, the lowermost surface of the wiring W1 is formed at a position lower than the upper surface of the plug PL1, and therefore, at least each of a part of the upper surface of the plug PL1 and a part of the side surfaces thereof are covered with the wiring W1. In this manner, the connection between the plug PL1 and the wiring W1 can be ensured, so that the reliability of the connection between the plug PL1 and the wiring W1 can be improved.

Still further, in the third embodiment, the interlayer insulating film WIL1 in which the wiring W1 is formed is formed of one layer of the insulating film IL2 as different from the above-described first and second embodiments, and therefore, the whole wiring W1 is formed inside the low dielectric constant film (the insulating film IL2). Therefore, the inter-wiring capacitance can be further reduced than those of the above-described first and second embodiments in which the wiring W1 can be also formed in a portion other than the inside of the low dielectric constant film.

Still further, in the third embodiment, by forming the upper surface of the plug PL1 so as to be higher than the upper surface of the insulating film SO, the length L1 by which the wiring W1 and the plug PL1 are overlapped with each other in the direction perpendicular to the semiconductor substrate 1S is ensured as, for example, 30 nm even when the whole wiring W1 is formed inside the insulating film IL2. That is, the length L1 by which the wiring W1 and the plug PL1 are overlapped with each other in the direction perpendicular to the semiconductor substrate 1S is ensured even if the wiring W1 is formed so as not to be embedded inside the insulating film SO. Therefore, even if the microfabrication of the wiring structure is achieved, the state that the wiring W101 is formed inside the insulating film SO as the case of the manufacturing step of the above-described comparative example is not provided, and therefore, the increase in the inter-wiring capacitance between the wirings W1 due to the formation of the wiring W1 inside the insulating film SO can be avoided.

Still further, as described above, by forming the lowermost surface of the wiring trench WT1 so as to be separated from the gate electrode G1 by a predetermined distance (a certain distance) or farther, the shortening of the distance between the wiring W1 and the gate electrode G1 can be avoided, and therefore, the reduction in the reliability between the wiring W1 and the gate electrode G1 can be avoided. In the third embodiment, the case that the insulating film IL2 is formed of the low dielectric constant film has been explained. However, regarding the effect of avoiding the reduction in the reliability between the wiring W1 and the gate electrode G1, it is not always required to form the insulating film IL2 by the low dielectric constant film. In this case, the insulating film IL2 can be formed of, for example, a silicon oxide film as an insulating film.

In the third embodiment, as similar to the above-described first and second embodiments, the above-described effect can be obtained by forming the upper surface of the plug PL1 so as to be even slightly higher than the upper surface of the insulating film SO. Here, a more preferable condition used when the plug PL1 and the wiring W1 are formed will be explained.

Figure 38:
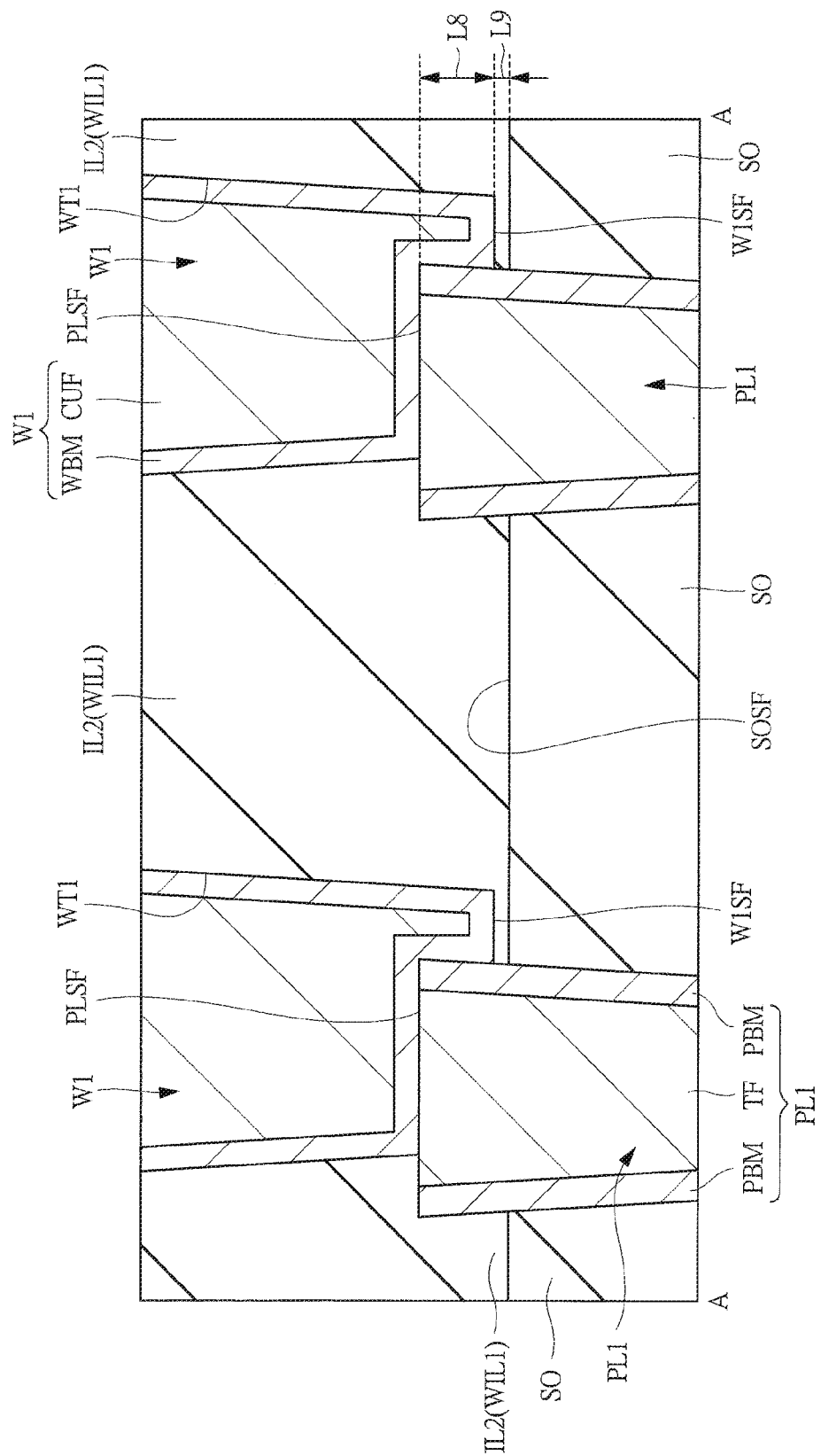
FIG. 38 is an enlarged cross-sectional view of a principal part of an enlarged periphery of a region where a plug and a wiring are connected in FIG. 34.

FIG. 38 is an enlarged cross-sectional view of a principal part (a partially-enlarged cross-sectional view) of an enlarged periphery of a region where the plug PL1 and the wiring W1 are connected to each other in FIG. 34. Hereinafter, with reference to FIG. 38, a more preferable condition for the formation of the plug PL1 and the wiring W1 will be explained.

As illustrated in FIG. 38, a distance from the lowermost surface of the wiring W1 to the upper surface of the plug PL1 is set as a length L8. Meanwhile, a distance from the upper surface of the insulating film SO to the lowermost surface of the wiring W1 is set as a length L9. Here, in the third embodiment, the length L8 corresponds to the above-described length L1 (that is, "L8=L1"). Note that, for easily understanding, in FIG. 38, the upper surface of the insulating film SO is provided with a reference symbol SOSF so as to be represented as an upper surface SOSF of the insulating film SO, the upper surface of the plug PL1 is provided with a reference symbol PLSF so as to be represented as an upper surface PLSF of the plug PL1, and the lowermost surface of the wiring W1 is provided with a reference symbol W1SF so as to be represented as the lowermost surface W1SF of the wiring W1.

At this time, it is desired that a relation of "L8>L9" is established between the length L8 and the length L9 (that is, it is desired that the length L8 is larger than the length L9). By forming the plug PL1 and the wiring W1 so as to establish the relation of "L8>L9", the whole wiring W1 can be formed inside the insulating film IL2 which is the low dielectric constant film so that the receding amount of the insulating film SO is not increased in the step of making the insulating film SO illustrated in the above-described FIG. 35 to recede, and besides, that the connection between the plug PLI1 and the wiring W1 in the direction perpendicular to the semiconductor substrate 1S is ensured in a later step. In the step illustrated in FIG. 35, if a receding distance of the insulating film SO is too large, controllability and repeatability of the etching of the insulating film SO or the polishing thereof is reduced accordingly, and therefore, this is not preferable. Therefore, it is preferred to suppress the receding distance as small as possible, and therefore, it is preferred to apply the above-described condition (the relation of "L8>L9"). More particularly, by shortening the length L9 as short as possible, the receding amount of the upper surface of the insulating film SO in the step illustrated in FIG. 35 is decreased, and therefore, the characteristics of the semiconductor device can be stabilized without the reduction in the controllability and repeatability in the step of making the insulating film SO to recede. Also, as different from the above-described first and second embodiments, the whole wiring W1 is formed inside the insulating film IL2 which is the low dielectric constant film in the third embodiment, and therefore, the inter-wiring capacitance can be effectively reduced. In the third embodiment, by setting relations of, for example, "L8=30 nm" and "L9=5 nm", the above-described condition (relation of "L8>L9") is satisfied.

Steps after that (after the formation of the wiring W1) are similar to those of the above-described first embodiment so as to form a second-layer wiring. However, illustration and explanation thereof are omitted here.

Also in the third embodiment, as similar to the above-described first and second embodiments, the explanation has been made based on the case that the diameter of the upper surface of the plug PL1 and the width of the lower surface of the wiring are formed so as to be almost equal to each other. However, their relation is not limited to such a case, and a case that the diameter of the plug PL1 is larger than the width of the lower surface of the wiring W1 and a case that the diameter of the plug PL1 is smaller than the width of the lower surface of the wiring can be also applied.

According to the third embodiment, after the polishing for forming the plug PL1 ends, the upper surface (the surface) of the insulating film SO is made to recede so that the upper surface of the plug PL1 is higher than the upper surface of the insulating film SO. By making the upper surface (the surface) of the insulating film SO to recede, the connection between the plug PL1 and the wiring W1 in the direction perpendicular to the semiconductor substrate 1S can be ensured even if the wiring W1 to be formed later is not embedded inside the insulating film SO. Further, by forming the wiring W1 so as not to be embedded inside the insulating film SO, the surface area of the wiring W1 formed inside the insulating film IL2 which is the low dielectric constant film is increased, and therefore, the increase in the inter-wiring capacitance can be avoided even if the microfabrication of the wiring structure is achieved. Still further, by forming the interlayer insulating film WIL1 by one layer of the insulating film IL2, the whole wiring W1 is formed inside the insulating film IL2 which is the low dielectric constant film, and therefore, the inter-wiring capacitance can be further effectively reduced.

Fourth Embodiment

In the above-described third embodiment, the interlayer insulating film WIL1 is formed of one layer of the insulating film IL2 without forming the insulating film IL1 as a part of the interlayer insulating film WIL, and the whole wiring W1 is formed inside the insulating film IL2. In a fourth embodiment, the formation of the interlayer insulating film WIL1 by one layer of the insulating film IL2 is similar to that of the above-described third embodiment, but the wiring W1 is formed not only inside the insulating film IL2 but also inside the interlayer insulating film SO. That is, the lowermost surface of the wiring W1 is formed inside the insulating film SO.

Figure 39:
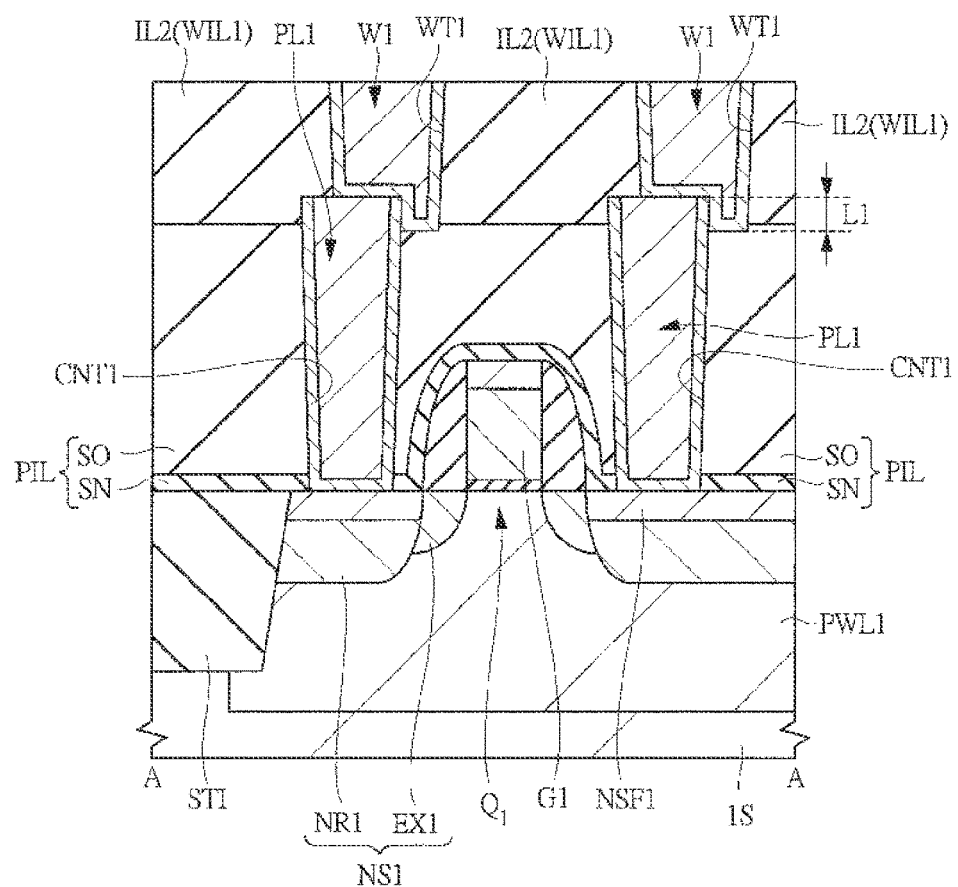
FIG. 39 is a cross-sectional view of a principal part (cross-sectional view taken along a line A-A) of a semiconductor device according to a fourth embodiment of the present invention.

FIG. 39 is a cross-sectional view of a principal part of a semiconductor device according to the fourth embodiment, and illustrates a cross section corresponding to the cross section A (the cross section taken along the line A-A) illustrated in the above-described FIG. 2 of the above-described first embodiment.

As illustrated in FIG. 39, in the semiconductor device according to the fourth embodiment, as similar to the semiconductor devices of the above-described first to third embodiments, the upper surface of the plug PL1 is formed higher than the upper surface of the insulating film SO, that is, the upper surface of the interlayer insulating film PIL. Also, in the semiconductor device according to the fourth embodiment, as similar to the above-described third embodiment, the insulating film IL1 is not formed, and the interlayer insulating film WIL1 is formed of one layer of the insulating film IL2. Further, in the semiconductor device according to the fourth embodiment, as similar to the above-described first embodiment, the wiring W1 is formed not only inside the interlayer insulating film WIL1 but also inside the insulating film SO, that is, the interlayer insulating film PIL. That is, the lowermost surface of the wiring W1 is formed inside the insulating film SO, that is, the interlayer insulating film PIL.

In the fourth embodiment, by forming the plug PL1 so as to protrude from the upper surface of the insulating film SO, that is, the upper surface of the interlayer insulating film PIL, the connection between the plug PL1 and the wiring W1 can be ensured even if an embedding amount of the wiring W1 inside the insulating film SO, that is, the interlayer insulating film PIL is decreased. Also, by decreasing the embedding amount of the wiring trench WT1 inside the insulating film SO, that is, the interlayer insulating film PIL, the surface area of the wiring W1 which is formed inside the insulating film IL2 which is the low dielectric constant film is increased. Therefore, for example, the inter-wiring capacitance between the wirings W1 can be reduced. In the fourth embodiment, since the interlayer insulating film WIL1 is formed of one layer of the insulating film IL2 which is the low dielectric constant film, the effect of reducing the inter-wiring capacitance can be expected further than the above-described first embodiment.

Figure 41:
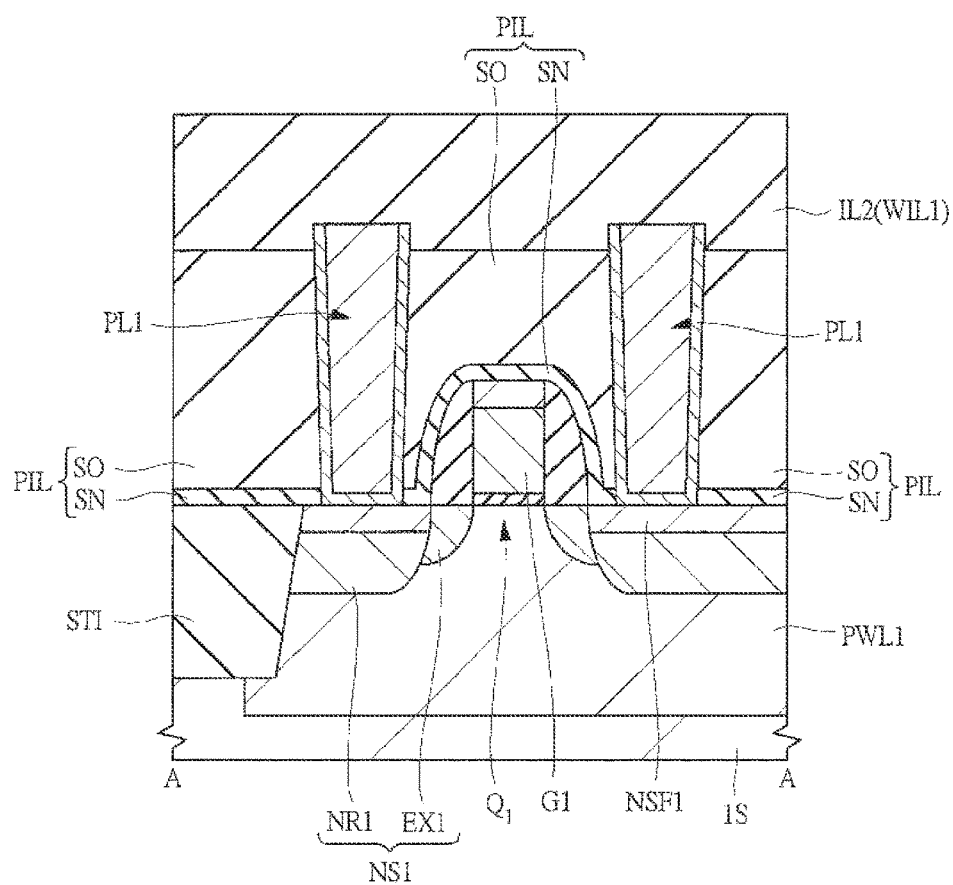
FIG. 41 is a cross-sectional view of the principal part (cross-sectional view taken along the line A-A) of the semiconductor device in a manufacturing step thereof continued from FIG. 40.
Figure 42:
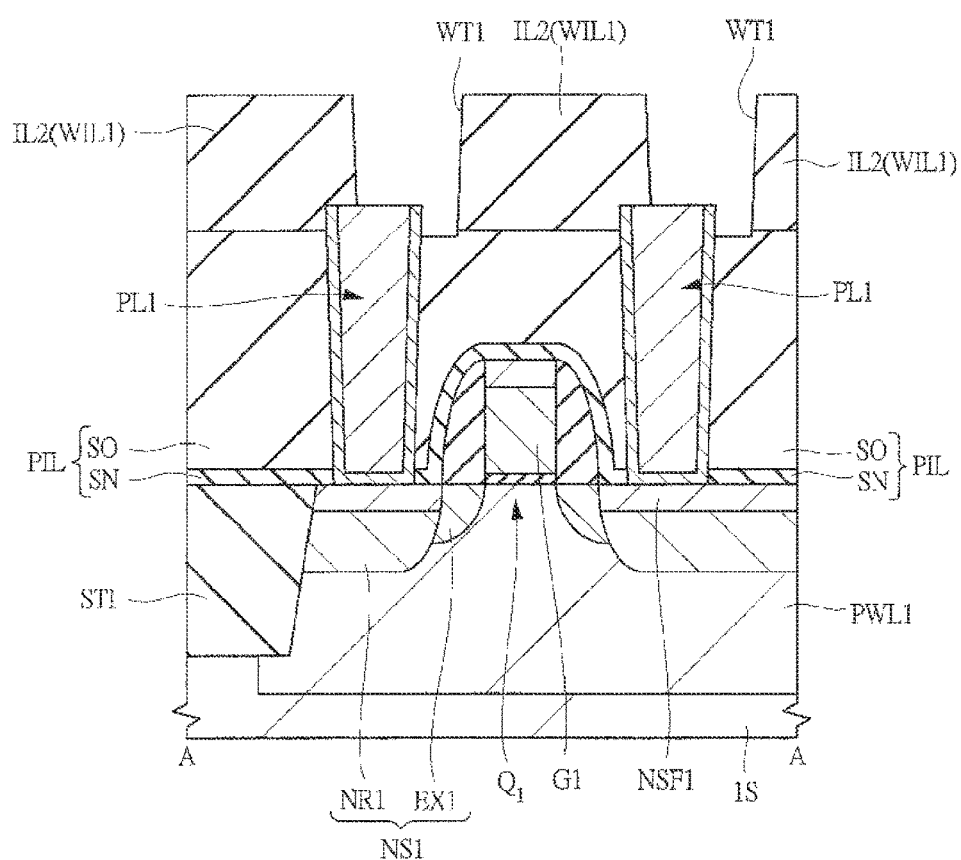
FIG. 42 is a cross-sectional view of the principal part (cross-sectional view taken along the line A-A) of the semiconductor device in a manufacturing step thereof continued from FIG. 41.

Hereinafter, a method of manufacturing the semiconductor device according to the fourth embodiment will be explained with reference to the drawings. Each of FIGS. 40 to 42 is a cross-sectional view of a principal part of the semiconductor device of the fourth embodiment in a manufacturing step, and illustrates a cross section corresponding to the above-described cross section A.

The steps illustrated in the above-described FIGS. 4 to 8 of the above-described first embodiment also similarly performed in the fourth embodiment.

Note that, also in the fourth embodiment, in the following steps, an upper surface of the insulating film SO is synonymously used with an upper surface of the interlayer insulating film PIL, and an inside of the insulating film SO is synonymously used with an inside of the interlayer insulating film PIL.

Figure 40:
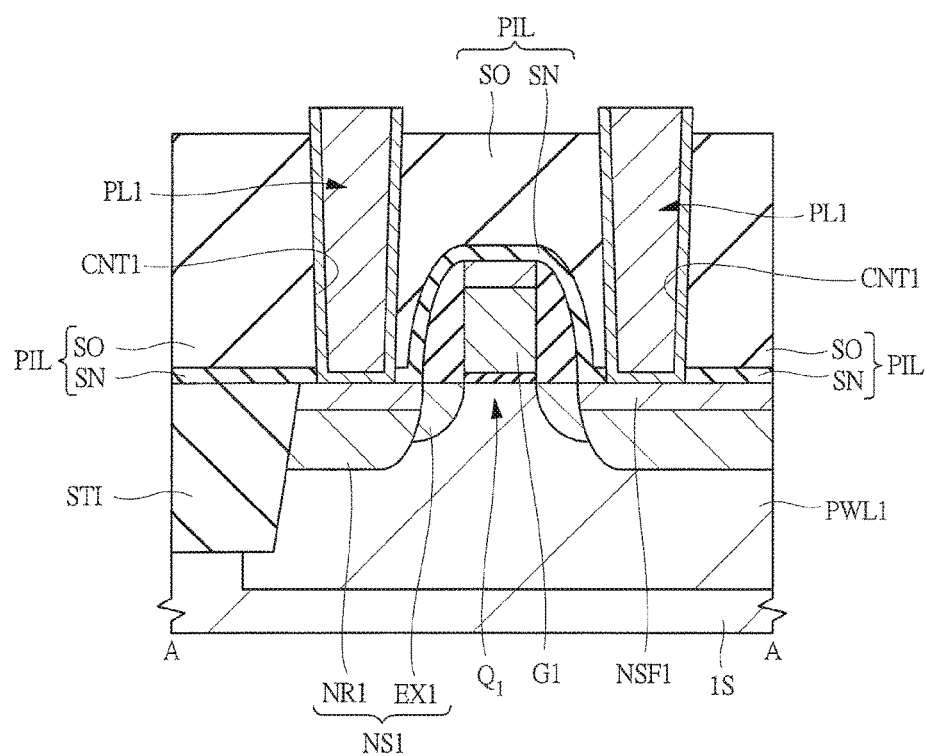
FIG. 40 is a cross-sectional view of the principal part (cross-sectional view taken along the line A-A) of the semiconductor device according to the fourth embodiment of the present invention in a manufacturing step thereof.

After the step illustrated in the above-described FIG. 8 of the above-described first embodiment, the upper surface of the insulating film SO is made to recede in the fourth embodiment as illustrated in FIG. 40. A receding amount of the upper surface of the insulating film SO is, for example, 25 nm. As described in the above-described first embodiment, the method of making the insulating film SO to recede can be performed by dry etching, wet etching, or a CMP method by using a polishing liquid having a high selectivity for the insulating film SO. After the insulating film SO is made to recede, the upper surface of the insulating film SO is lower than the upper surface of the plug PL1 as illustrated in FIG. 40. That is, the upper surface (the surface) of the insulating film SO is made to recede so that the plug PL1 protrudes from the upper surface of the insulating film SO.

Next, a first-layer wiring is formed by a single damascene method. Hereinafter, a method of forming the first-layer wiring will be explained.

First, as illustrated in FIG. 41, the insulating film IL2 is formed on the interlayer insulating film PIL (the insulating film SO) and on the plug PL1. The insulating film IL2 is formed on the interlayer insulating film PIL (the insulating film SO) so as to cover a portion of the plug PL1 protruding from the upper surface of the interlayer insulating film PIL (the insulating film SO). The insulating film IL2 is formed of, for example, a SiOC film as a low dielectric constant film in order to reduce the inter-wiring capacitance. A thickness of the insulating film IL2 is, for example, 85 nm.

In the fourth embodiment, as similar to the above-described third embodiment, it is assumed when there is no risk of the abnormal electrical discharge upon the formation of the SiOC film, when there is no requirement to form the insulating film IL2 by a low dielectric constant film other than the SiOC film or others so as to prevent the abnormal electrical discharge, or when there is no requirement to form the insulating film IL1 even as the etching stopper. Therefore, also in the fourth embodiment, the insulating film IL1 is not formed before the formation of the insulating film IL2, the interlayer insulating film WIL1 is formed of one layer of the insulating film IL2, and the insulating film IL2 indicates the interlayer insulating film WIL1 in the following steps.

Next, as illustrated in FIG. 42, the wiring trench WT1 is formed in the insulating film IL2. Because of the wiring trench WT1, at least a part of the upper surface (the upper portion) of the plug PL1 and a part of the side surfaces thereof are exposed. A depth of the wiring trench WT1 is, for example, 90 nm. The lowermost surface of the wiring trench WT1 is formed inside the insulating film SO. That is, the wiring trench WT1 is formed inside the insulating film IL2 and inside the insulating film SO. The lowermost surface of the wiring trench WT1 is positioned lower than the upper surface of the plug PL1, and besides, for example, 5 nm lower than the upper surface of the insulating film SO. In the fifth embodiment, since the lowermost surface of the wiring trench WT1 is formed inside the insulating film SO, the lowermost surface of the wiring trench WT1 is formed of the exposed surface of the insulating film SO, and the lowermost surface of the wiring W1 to be buried in this wiring trench WT1 later is in contact with this exposed surface of the insulating film SO. Note that FIG. 42 illustrates a case that the wiring trench WT1 is formed at a position shifted from the plug PL1 in a direction parallel to the cross section A as similar to the above-described FIG. 19 in the above-described first embodiment.

As described in the above-described first embodiment, in order to form the wiring trench WT1, the insulating film IL2 is dry-etched by using a photoresist pattern (a patterned photoresist film) formed by a photolithography technique as a mask (an etching mask). In this etching step, an etching endpoint of the insulating film IL2 is detected in, for example, a scribe region at the time when the etching of the insulating film IL2 reaches the surface of the insulating film SO (that is, at the time when a part of the surface of the insulating film SO is exposed). In the fourth embodiment, the insulating film IL2 is formed of the SiOC film as the low dielectric constant film, the insulating film SO is formed of the silicon oxide film as the insulating film, and the insulating film IL2 and the insulating film SO are formed of different materials (insulating materials) from each other, and therefore, the etching endpoint can be detected at a boundary between the insulating film IL2 and the insulating film SO. Even after the endpoint is detected, the etching for a predetermined time (a certain time) (the etching of the insulating film SO) is performed similarly to the above-described first embodiment, so that the wiring trench WT1 is completed. Finally, at least a part of the upper surface (the upper portion) of the plug PL1 and a part of the side surfaces thereof are exposed because of the wiring trench WT1.

Therefore, the step of forming the wiring trench WT1 includes: a first step of etching the insulating film IL2; a second step of detecting the etching endpoint of the insulating film IL2 when the etching in the first step reaches the upper surface of the insulating film SO; and a third step of etching the insulating film SO after the second step.

In this manner, in the process of the dry etching for forming the wiring trench WT1, the wiring trench WT1 is formed by dividing the dry etching step into two stages (the first step and the third step) by the endpoint detection, so that it can be avoided to form the lowermost surface of the wiring trench WT1 at a position close to the gate electrode G1 of the n-channel-type MISFET Q due to the excessively-performed etching. Also, the processing accuracy of the etching can be improved.

Also, if the insulating film IL2 or the insulating film SO remains on the side surfaces of the plug PL1 to be exposed from the wiring trench WT1 after this dry etching (that is, after the dry-etching step for forming the wiring trench WT1), it is preferred to further perform wet etching or others after this dry etching so as to remove the insulating film IL2 or the insulating film SO remaining on the side surfaces of the plug PL1 and expose the side surfaces of the plug PL1 from the wiring trench WT1. In this manner, the exact connection between the wiring W1 to be formed in a later step and the plug PL1 can be ensured.

Also in the fourth embodiment, since the insulating film SO is made to recede by the step illustrated in FIG. 40, the upper surface of the plug PL1 is formed at a position higher than the upper surface of the insulating film SO. On the other hand, the lowermost surface of the wiring trench WT1 is formed inside the insulating film SO, and besides, the lowermost surface of the wiring trench WT1 is formed at a position lower than the upper surface of the plug PL1. Therefore, at least a part of the upper surface of the plug PL1 and a part of the side surfaces of the plug PL1 are exposed because of the wiring trench WT1, so that, when a conductive film is buried in the wiring trench WT1 in a later step, the conductive film buried in this wiring trench WT1 and the plug PL1 can be reliably connected to each other.

Next, as similar to the above-described first embodiment, the wiring W1 is formed as illustrated in the above-described FIG. 39 by forming the barrier conductor film WBM on the insulating film IL2 including the portion on the inner wall (the side surfaces and the bottom portion) of the wiring trench WT1, forming the conductor film CUF on the barrier conductor film WBM so as to be buried (be filled) inside the wiring trench WT1, and then, polishing and removing unnecessary portions of the conductor film CUF and the barrier conductor film WBM formed outside the wiring trench WT1 by using a CMP method. The wiring W1 is formed of the conductor film CUF and the barrier conductor film WBM buried and remaining inside the wiring trench WT1. A depth of the wiring W1 is similar to a depth of the wiring trench WT1, which is, for example, 90 nm. Also, a position of the lowermost surface of the wiring W1 is similar to a position of the lowermost surface of the wiring trench WT1 as illustrated in FIG. 42.

The wiring trench WT1 is formed inside the insulating film IL2 and the insulating film SO, that is, the lowermost surface of the wiring trench WT1 is formed inside the insulating film SO, and therefore, the wiring W1 formed by burying the barrier conductor film WBM and the conductor film CUF in the wiring trench WT1 is also formed inside the insulating film IL2 and the insulating film SO, and the lowermost surface of the wiring W1 is formed inside the insulating film SO. Further, as illustrated in the above-described FIG. 39, the upper surface of the plug PL1 is formed at a position higher than the upper surface of the insulating film SO, and besides, the lowermost surface of the wiring W1 is formed at a position lower than the upper surface of the plug PL1, and therefore, at least each of a part of the upper surface of the plug PL1 and a part of the side surfaces thereof are covered with the wiring W1. In this manner, the connection between the plug PL1 and the wiring W1 can be ensured, so that the reliability of the connection between the plug PL1 and the wiring W1 can be improved.

Further, in the fourth embodiment, the wiring W1 is formed even inside the insulating film SO as similar to the above-described first embodiment. However, as different from the above-described first embodiment, the interlayer insulating film WIL1 is formed of one layer of the insulating film IL2. Therefore, the ratio of the portion of the wiring W1 which is formed inside the insulating film IL2 which is the low dielectric constant film is larger in the fourth embodiment than that in the case that the interlayer insulating film WIL1 is formed of two layers of the insulating film IL1 and the insulating film IL2. Therefore, the inter-wiring capacitance can be further effectively reduced in the fourth embodiment than the above-described first embodiment.

On the other hand, in the above-described third embodiment, the whole wiring W1 is formed inside the insulating film IL2 which is the low dielectric constant film, and therefore, the inter-wiring capacitance can be further effectively reduced than the fourth embodiment. However, in the above-described third embodiment, in order to form the whole wiring W1 inside the insulating film IL2, it is required to increase the receding amount of the insulating film SO in the step of the above-described FIG. 35 so as to be larger than that of the fourth embodiment in consideration of the need of ensuring the connection between the plug PL1 and the wiring W1 in the direction perpendicular to the semiconductor substrate 1S. On the other hand, if the structure as described in the fourth embodiment is used, the connection between the plug PL1 and the wiring W1 in the direction perpendicular to the semiconductor substrate 1S is ensured by forming a part of the wiring W1 even inside the insulating film SO, and therefore, the receding amount of the insulating film SO in the step of FIG. 42 can be smaller than that of the above-described third embodiment. Therefore, in the fourth embodiment, controllability of the step of making the insulating film SO to recede (the step of FIG. 42) and repeatability thereof are increased, so that the characteristics of the semiconductor element can be stabilized.

Also, in the fourth embodiment, by forming the upper surface of the plug PL1 so as to be higher than the upper surface of the insulating film SO, the length L1 by which the wiring W1 and the plug PL1 are overlapped with each other in the direction perpendicular to the semiconductor substrate 1S can be ensured even if the wiring W1 is not embedded inside the insulating film SO deeper than that in the case of the manufacturing step of the above-described comparative example. Therefore, even if the microfabrication of wirings is achieved, the increase in the inter-wiring capacitance between the wirings W1 due to the increase in the ratio of the portion of the wiring W1 which is formed inside the insulating film SO can be avoided.

Further, in the fourth embodiment, by avoided the formation of the lowermost surface of the wiring trench WT1 at the position close to the gate electrode G1 of the n-channel-type MISFET $Q_1$, the shortening of the distance between the wiring W1 and the gate electrode G1 can be avoided, so that the reduction in the reliability between the wiring W1 and the gate electrode G1 can be avoided. In the fourth embodiment, the case that the insulating film IL2 is formed of the low dielectric constant film has been explained. However, regarding the effect of avoiding the reduction in the reliability between the wiring W1 and the gate electrode G1, it is not always required to form the insulating film IL2 by the low dielectric constant film. In this case, the insulating film IL2 can be formed of, for example, a silicon oxide film as an insulating film.

In the fourth embodiment, as similar to the above-described first and third embodiments, the above-described effect can be obtained by forming the upper surface of the plug PL1 so as to be even slightly higher than the upper surface of the insulating film SO. Here, a more preferable condition used when the plug PL1 and the wiring W1 are formed will be explained.

Figure 43:
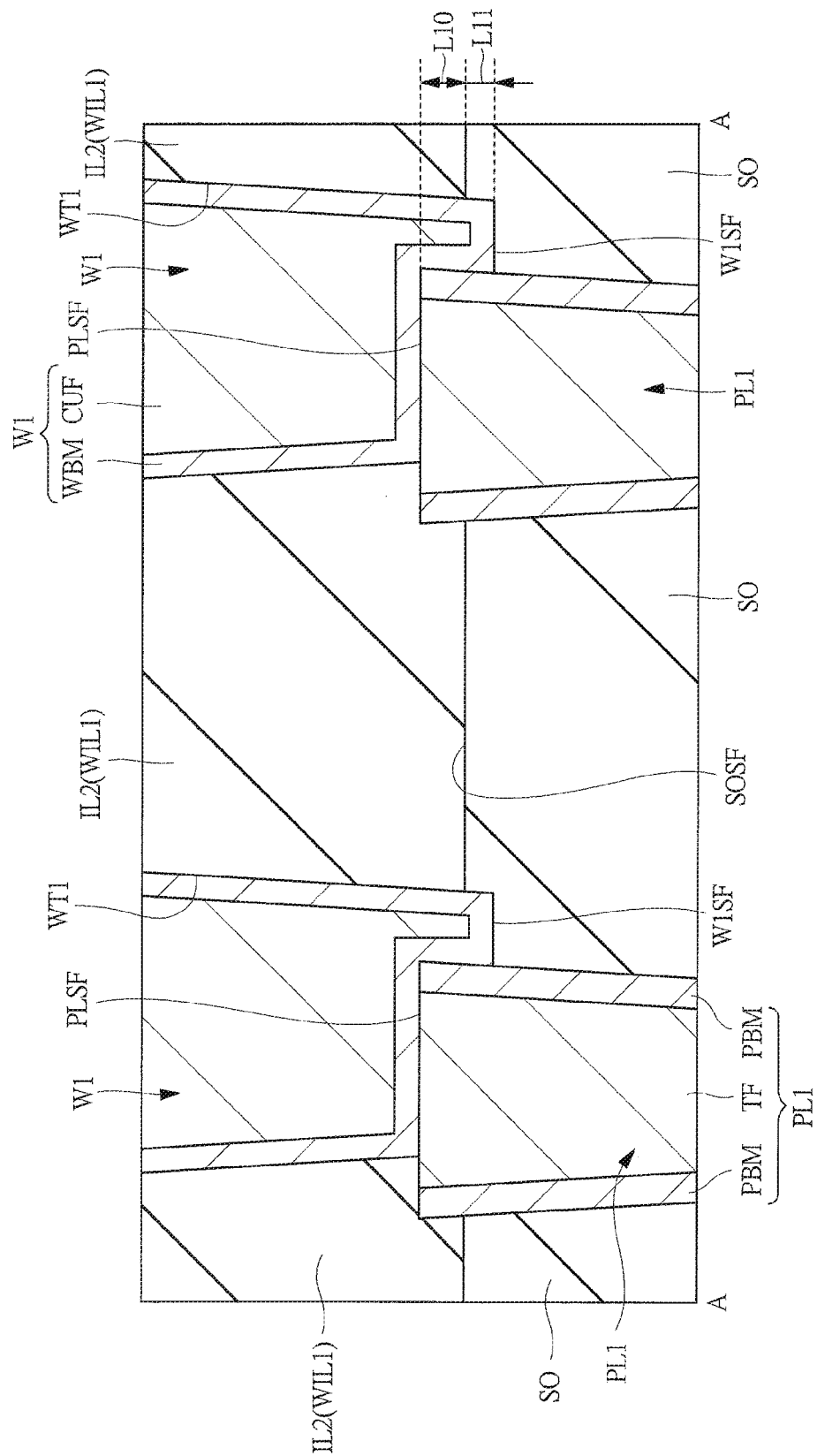
FIG. 43 is an enlarged cross-sectional view of a principal part of an enlarged periphery of a region where a plug and a wiring are connected in FIG. 39.

FIG. 43 is an enlarged cross-sectional view of a principal part (a partially-enlarged cross-sectional view) of an enlarged periphery of a region where the plug PL1 and the wiring W1 are connected to each other in FIG. 39. Hereinafter, with reference to FIG. 43, a more preferable condition for the formation of the plug PL1 and the wiring W1 will be explained.

As illustrated in FIG. 43, a distance from the upper surface of the insulating film SO to the upper surface of the plug PL1 is set as a length L10. Meanwhile, a distance from the lowermost surface of the wiring W1 to the upper surface of the insulating film SO is set as a length L11. Here, in the fourth embodiment, addition of the length L10 and the length L11 corresponds to the above-described length L1 (that is, "L1=L10+L11"). Note that, for easily understanding, in FIG. 43, the upper surface of the insulating film SO is provided with a reference symbol SOSF so as to be represented as an upper surface SOSF of the insulating film SO, the upper surface of the plug PL1 is provided with a reference symbol PLSF so as to be represented as an upper surface PLSF of the plug PL1, and the lowermost surface of the wiring W1 is provided with a reference symbol W1SF so as to be represented as the lowermost surface W1SF of the wiring W1.

At this time, it is desired that a relation of "L10>L11" is established between the length L10 and the length L11 (that is, it is desired that the length L10 is larger than the length L11). By forming the plug PL1 and the wiring W1 so as to establish the relation of "L10>L11", the connection between the plug PL1 and the wiring W1 in the direction perpendicular to the semiconductor substrate 1S can be ensured as avoiding the increase in the forming amount of the wiring W1 so as to be embedded inside the insulating film SO (that is, an amount corresponding to the length L11). Also, by avoiding the increase in the embedding amount of the wiring W1 inside the insulating film SO (that is, the amount corresponding to the length L11), the ratio of the portion of the wiring W1 which is formed inside the insulating film IL2 which is the low dielectric constant film is increased. In other words, by avoiding the increase in the embedding amount of the wiring W1 inside the insulating film SO (that is, the amount corresponding to the length L11), an area where the wiring W1 and the insulating film IL2 which is the low dielectric constant film are in contact with each other can be increased. Therefore, for example, the inter-wiring capacitance between adjacent wirings W1 can be reduced. Also, by avoiding the formation of the lowermost surface of the wiring W1 at the position close to the gate electrode G1 of the n-channel-type MISFET $Q_1$, the reduction in the reliability between the wiring W1 and the gate electrode G1 can be avoided. More particularly, by shortening the length L11 as small as possible, the forming amount of the wiring W1 inside the insulating film SO (that is, the amount corresponding to the length L11) can be decreased, and therefore, the inter-wiring capacitance can be further effectively reduced, and the reduction in the reliability between the wiring W1 and the gate electrode G1 can be avoided. In the fourth embodiment, by setting relations of, for example, "L10=25 nm" and "L11=5 nm", the above-described condition (the relation of "L10>L11") is satisfied.

Steps after that (after the formation of the wiring W1) are similar to those of the above-described first embodiment so as to form a second-layer wiring. However, illustration and explanation thereof are omitted here.

Also in the fourth embodiment, as similar to the above-described first to third embodiments, the explanation has been made based on the case that the diameter of the upper surface of the plug PL1 and the width of the lower surface of the wiring are formed so as to be almost equal to each other. However, their relation is not limited to such a case, and a case that the diameter of the plug PL1 is larger than the width of the lower surface of the wiring W1 and a case that the diameter of the plug PL1 is smaller than the width of the lower surface of the wiring W1 can be also applied.

According to the fourth embodiment, after the polishing for forming the plug PL1 ends, the surface of the insulating film SO is made to recede so that the upper surface of the plug PL1 is higher than the upper surface of the insulating film SO. By making the surface of the insulating film SO to recede, even if the embedding amount of the wiring W1 to be formed inside the insulating film SO later is decreased further than that in the case of the manufacturing step of the above-described comparative example, the connection between the plug PL1 and the wiring W1 in the direction perpendicular to the semiconductor substrate 1S can be ensured. Further, by decreasing the embedding amount of the wiring W1 inside the insulating film SO, the surface area of the wiring W1 to be formed inside the insulating film IL2 which is the low dielectric constant film is increased, and therefore, the increase in the inter-wiring capacitance can be avoided even if the microfabrication of the wiring structure is achieved. Still further, by forming the interlayer insulating film WIL1 by one layer of the insulating film IL2, the surface area of the wiring W1 to be formed inside the insulating film IL2 which is the low dielectric constant film is further increased, and therefore, the inter-wiring capacitance can be further effectively reduced.

Fifth Embodiment

In the above-described first to fourth embodiments, the interlayer insulating film PIL is formed of the insulating film SN and the insulating film SO thereon, and the insulating film SO may be formed of any of an $O_3$-TEOS film, a P-TEOS film, and a stacked film of the $O_3$-TEOS film and the P-TEOS film. On the other hand, in a fifth embodiment, the insulating film SO is formed of the stacked film of the $O_3$-TEOS film and the P-TEOS film thereon.

Figure 44:
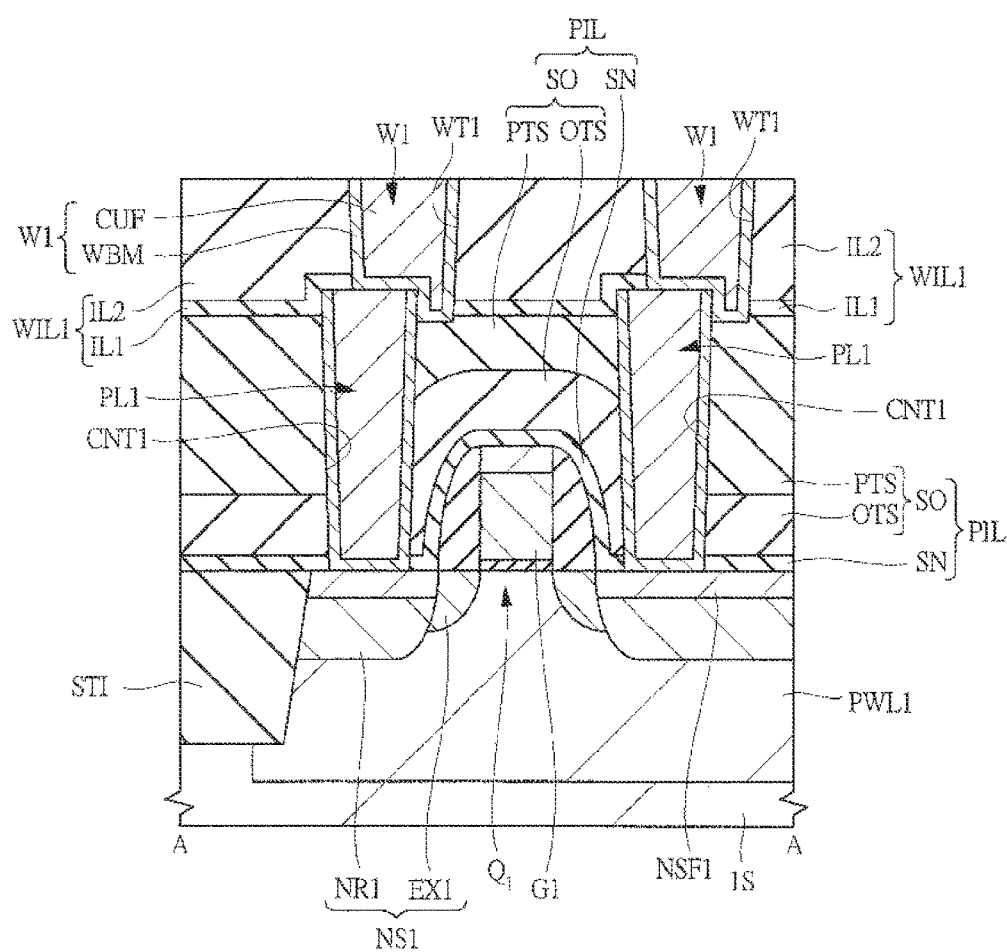
FIG. 44 is a cross-sectional view of a principal part (cross-sectional view taken along a line A-A) of a semiconductor device according to a fifth embodiment of the present invention.

FIG. 44 is a cross-sectional view of a principal part of a semiconductor device according to the fifth embodiment, and illustrates a cross section corresponding to the cross section A (the cross section taken along the line A-A) illustrated in the above-described FIG. 2 of the above-described first embodiment.

In the semiconductor device of the present embodiment illustrated in FIG. 44, the interlayer insulating film PIL is formed of the insulating film SN and the insulating film SO thereon, and this silicon oxide film SO is formed of a stacked film of an $O_3$-TEOS film OTS and a P-TEOS film PTS. The semiconductor device in the fifth embodiment has a structure similar to that of the semiconductor device in the above-described first embodiment except that the silicon oxide film SO is formed of the stacked film of the $O_3$-TEOS film OTS and the P-TEOS film PTS, and therefore, repetitive description thereof is omitted here.

Hereinafter, a method of manufacturing the semiconductor device according to the fifth embodiment will be explained with reference to the drawings. Each of FIGS. 45 to 49 is a cross-sectional view of a principal part of the semiconductor device of the fifth embodiment in a manufacturing step, and illustrates a cross section corresponding to the above-described cross section A.

The steps up to the one illustrated in the above-described FIG. 4 of the above-described first embodiment also similarly performed in the fifth embodiment.

Figure 45:
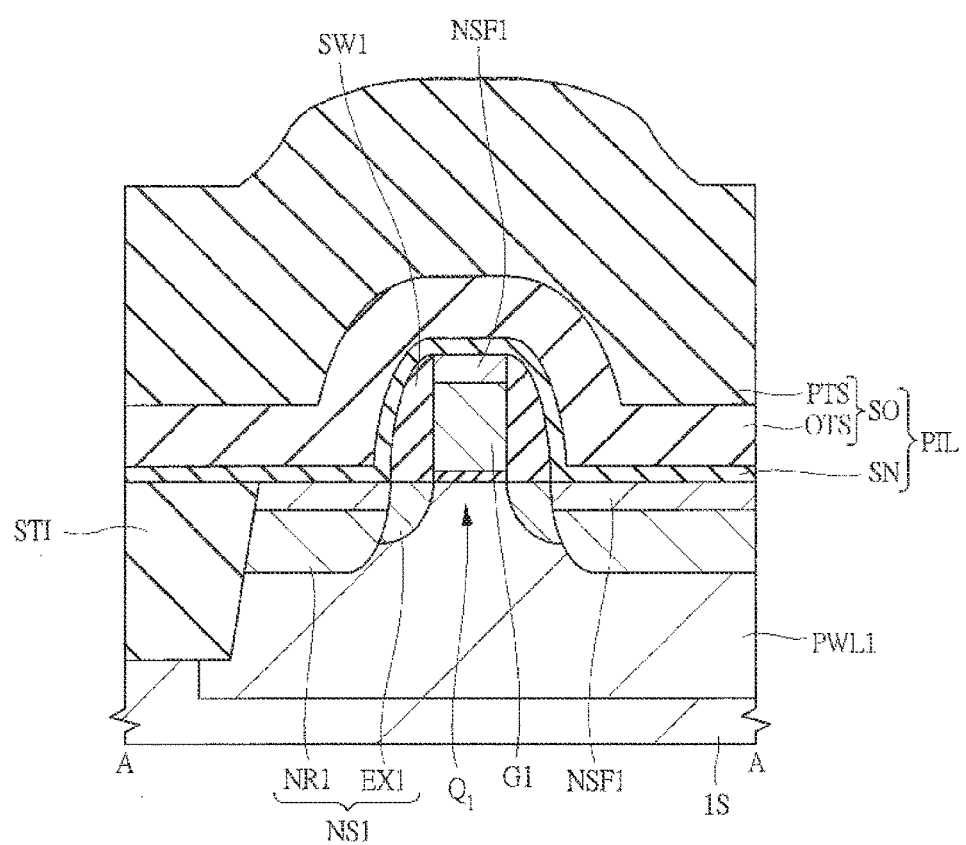
FIG. 45 is a cross-sectional view of the principal part (cross-sectional view taken along the line A-A) of the semiconductor device according to the fifth embodiment of the present invention in a manufacturing step thereof.

After the step illustrated in the above-described FIG. 4 of the above-described first embodiment, in the fifth embodiment, the insulating film SN is formed on the semiconductor substrate 1S in which the n-channel-type MISFET $Q_1$ is formed as illustrated in FIG. 45. That is, the insulating film SN is formed on the semiconductor substrate 1S including a portion on the metal silicide layer NSF1 so as to cover the gate electrode G1 and the side walls SW1. As similar to the above-described first embodiment, the insulating film SN is formed of a silicon nitride film as an insulating film.

Then, in the fifth embodiment, the $O_3$-TEOS film OTS is formed on the insulating film SN. A reason why the $O_3$-TEOS film OTS is formed that the $O_3$-TEOS film OTS is preferable as a film to be buried between semiconductor elements such as the n-channel-type MISFETs $Q_1$ (for example, between adjacent gate electrodes) formed on the semiconductor substrate 1S because the $O_3$-TEOS film OTS indicates excellent fluidity. However, the $O_3$-TEOS film has a slow growth rate and a weak mechanical strength. Therefore, in the fifth embodiment, after the $O_3$-TEOS film OTS is buried between semiconductor elements (for example, between adjacent gate electrodes), the P-TEOS film PTS having a stronger mechanical strength and lower moisture absorption characteristics than those of the $O_3$-TEOS film OTS is formed on the $O_3$-TEOS film OTS. The P-TEOS film PTS has a lower fluidity than that of the $O_3$-TEOS film OTS, and therefore, is formed so as to have an almost uniform thickness along a shape of the $O_3$-TEOS film OTS which is a base film. Therefore, as illustrated in FIG. 45, when the P-TEOS film PTS is formed, the P-TEOS film PTS formed above the semiconductor element such as the n-channel-type MISFET $Q_1$ is swelled. In the fifth embodiment, for example, a depositing thickness of the $O_3$-TEOS film OTS is 45 nm, and a depositing thickness of the P-TEOS film PTS is 100 nm.

Figure 46:
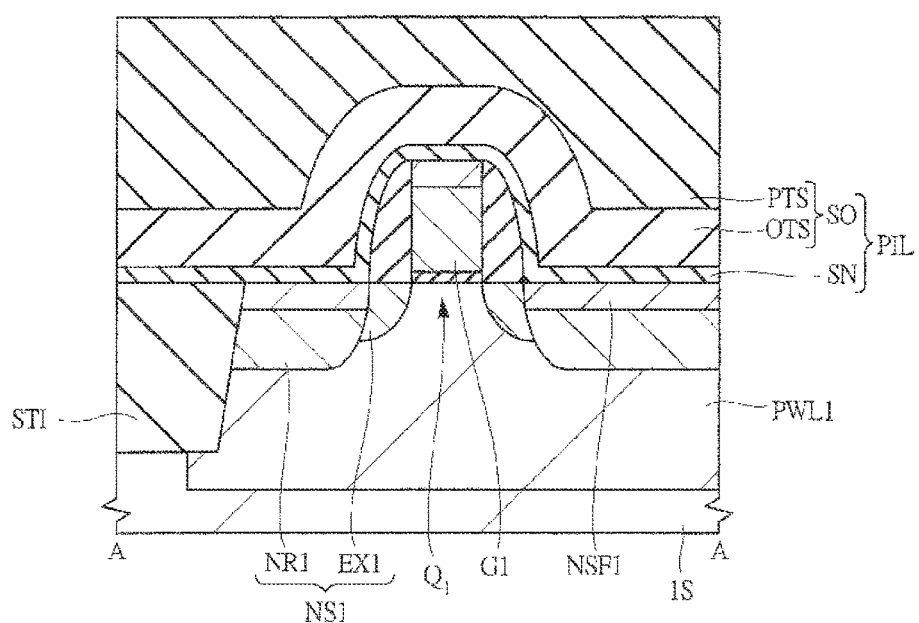
FIG. 46 is a cross-sectional view of the principal part (cross-sectional view taken along the line A-A) of the semiconductor device in a manufacturing step thereof continued from FIG. 45.

Next, as illustrated in FIG. 46, a surface (an upper surface) of the P-TEOS film PTS is polished by using a CMP method so as to be planarized. In this polishing, at the stage of the end of the polishing, it is required that the P-TEOS film PTS having a certain thickness remains above the semiconductor element such as the n-channel-type MISFET $Q_1$. This is because of the following reason. That is, the $O_3$-TEOS film has an excellent filling performance but higher moisture absorption characteristics (is easier to absorb moisture) than that of the P-TEOS film, and has a high moisture content at the stage of film formation, and therefore, tends not to be excellent in an insulation property. That is, it can be said that the $O_3$-TEOS film OTS is an insulating film having higher moisture absorption characteristics than that of the P-TEOS film PTS, and the P-TEOS film PTS is an insulating film having lower moisture absorption characteristics than that of the $O_3$-TEOS film OTS. Therefore, if the P-TEOS film PTS formed on the n-channel-type MISFET Q is too thin or is totally polished, when the wiring W1 (the first-layer wiring) is formed inside the interlayer insulating film (the interlayer insulating film WIL1) of the first-layer wiring, there is a risk that a distance between the wiring W1 and the $O_3$-TEOS film OTS becomes close to each other or the wiring W1 and the $O_3$-TEOS film OTS becomes in contact with each other, which results in the reduction in the reliability of the wiring W1 with respect to the $O_3$-TEOS film OTS. Therefore, in this step (the step of polishing the P-TEOS film PTS), it is required to set the thickness of the P-TEOS film PTS to be deposited and set the polishing amount of the P-TEOS film PTS to be subsequently performed so that the P-TEOS film PTS having a desired thickness remains even after the polishing on the semiconductor element such as the n-channel-type MISFET $Q_1$.

While the interlayer insulating film PIL is formed of the insulating film SN and the insulating film SO thereon, the insulating film SO is formed of the $O_3$-TEOS film OTS and the P-TEOS film PTS formed thereon in the fifth embodiment. Therefore, in the following steps, an upper surface of the P-TEOS film PTS is synonymously used with an upper surface of the insulating film SO or an upper surface of the interlayer insulating film PIL, and an inside of the P-TEOS film PTS is synonymously used with an inside of the interlayer insulating film PIL or an inside of the insulating film SO.

Figure 47:
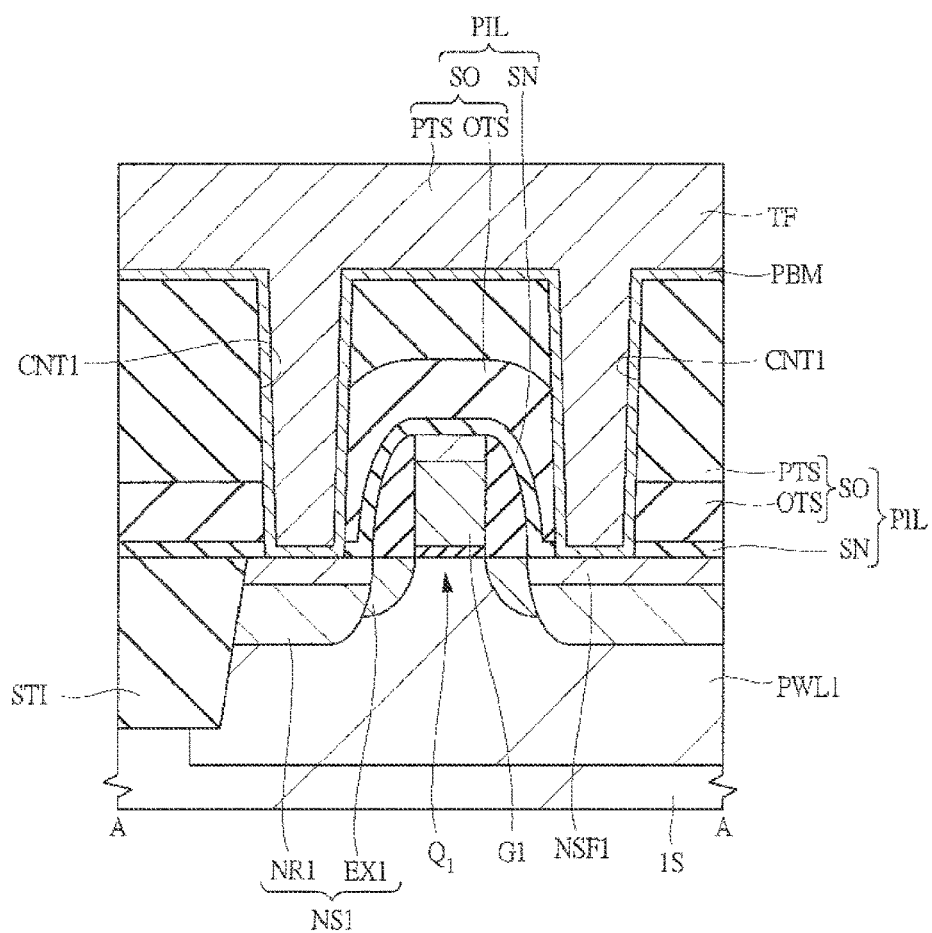
FIG. 47 is a cross-sectional view of the principal part (cross-sectional view taken along the line A-A) of the semiconductor device in a manufacturing step thereof continued from FIG. 46.

Next, as similar to the step illustrated in the above-described FIG. 6 of the above-described first embodiment, the interlayer insulating film PIL is dry-etched by using a photoresist pattern (a patterned photoresist film) formed on the interlayer insulating film PIL by a photolithography technique as a mask (an etching mask) as illustrated in FIG. 47, so that the contact hole CNT1 is formed in the interlayer insulating film PIL. Then, as similar to the step illustrated in the above-described FIG. 7 of the above-described first embodiment, the barrier conductor film PBM is formed on the interlayer insulating film PIL including inner walls (side surfaces and a bottom portion) of the contact hole CNT1 as illustrated in FIG. 47. Subsequently, the conductor film TF is formed on the barrier conductor film PBM. The contact hole CNT1 is filled with the barrier conductor film PBM and the conductor film TF.

Figure 48:
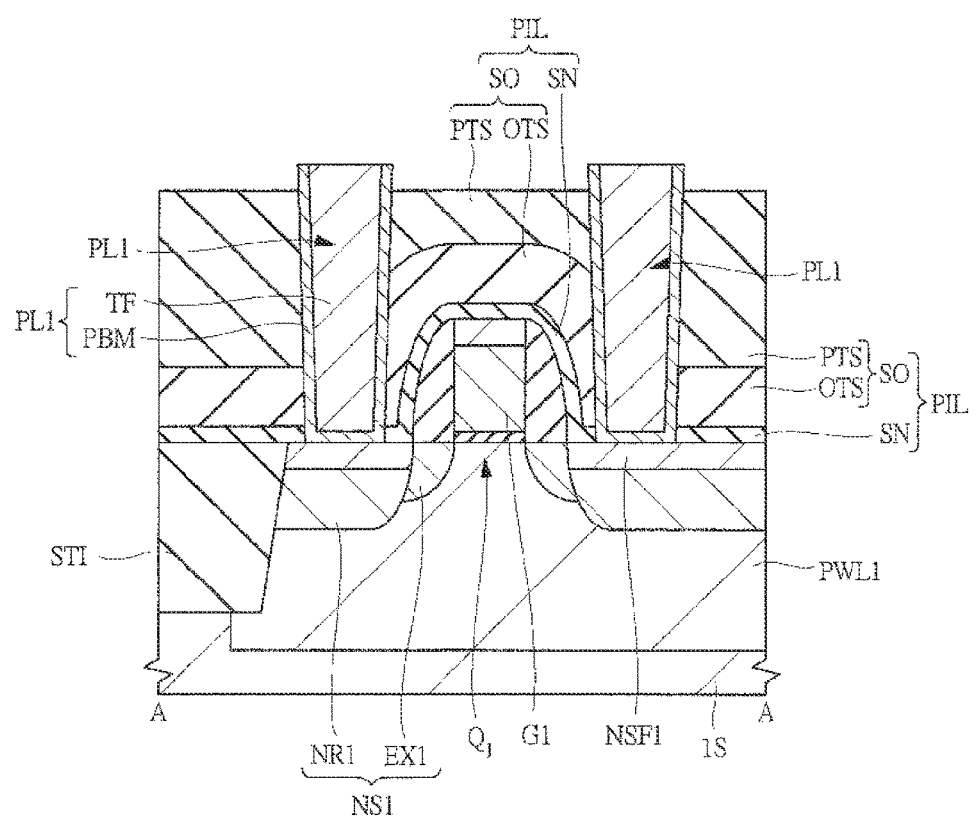
FIG. 48 is a cross-sectional view of the principal part (cross-sectional view taken along the line A-A) of the semiconductor device in a manufacturing step thereof continued from FIG. 47.

Next, as similar to the steps illustrated in the above-described FIGS. 8 and 9 of the above-described first embodiment, unnecessary portions of the conductor film TF and the barrier conductor film PBM formed outside the contact hole CNT1 are removed so as to form the plug PL1, and then, the upper surface of the P-TEOS film PTS is made to recede so that the upper surface of the P-TEOS film PTS is lower than the upper surface of the plug PL1 as illustrated in FIG. 48. That is, the upper surface of the P-TEOS film PTS is made to recede so that the upper surface of the plug PL1 protrudes from the upper surface of the P-TEOS film PTS. Also in the fifth embodiment as similar to the above-described first embodiment, as the method of making the upper surface of the P-TEOS film PTS (the interlayer insulating film PIL) to recede, dry etching, wet etching, or polishing by a CMP method may be applied as long as the upper surface of the P-TEOS film PTS can be selectively made to recede from the plug PL1. Also in this step (the step of making the upper surface of the P-TEOS film PTS to recede), it is required that the P-TEOS film PTS having a desired thickness remains on the semiconductor element such as the n-channel-type MISFET Q when the upper surface of the P-TEOS film PTS is made to recede. This is for avoiding the reduction in the reliability of the wiring W1 due to the $O_3$-TEOS film OTS.

Figure 49:
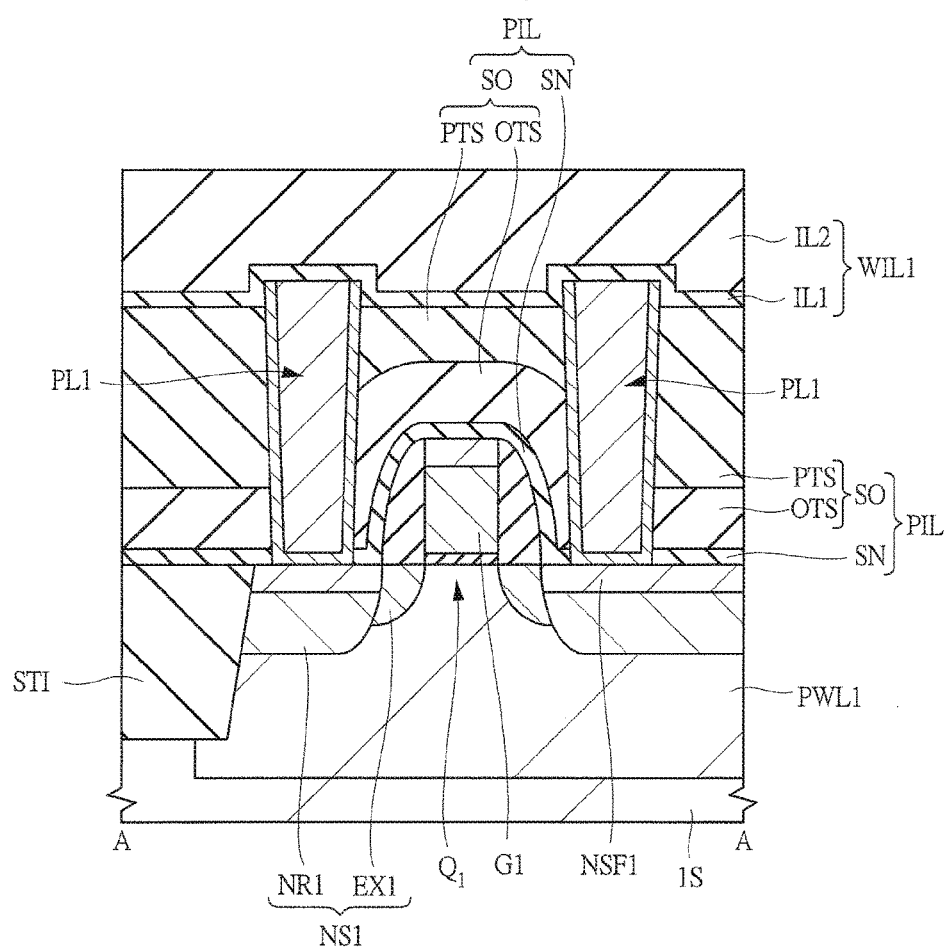
FIG. 49 is a cross-sectional view of the principal part (cross-sectional view taken along the line A-A) of the semiconductor device in a manufacturing step thereof continued from FIG. 48.

Next, as similar to the step illustrated in the above-described FIG. 10 of the above-described first embodiment, the insulating film IL1 and the insulating film IL2 are formed as the interlayer insulating film WIL1 of the first-layer wiring as illustrated in FIG. 49. The insulating film IL2 is formed as a low dielectric constant film. In the fifth embodiment, the insulating film IL1 is formed. However, as in the above-described third and fourth embodiments, if it is not required to form the insulating film IL1, the interlayer insulating film WIL1 can be formed of one layer of the insulating film IL2 which is the low dielectric constant film.

Next, as similar to the steps illustrated in FIGS. 19, 20, and 21A of the above-described first embodiment, the wiring W1 is formed as illustrated in the above-described FIG. 44 by forming the wiring trench WT1 inside the interlayer insulating film WIL1, forming the barrier conductor film WBM and the conductor film CUF so as to be buried inside the wiring trench WT1, and removing unnecessary portions of the barrier conductor film WBM and the conductor film CUF by using a CMP method.

In the step illustrated in FIG. 48, since the upper surface of the P-TEOS film PTS is made to recede so that the upper surface of the plug PL1 is higher than the upper surface of the P-TEOS film PTS, the embedding amount of the wiring W1 inside the insulating film SO can be decreased further than that in the case of the manufacturing step of the above-described comparative example even if the wiring W1 is formed so that the connection between the plug PL1 and the wiring W1 in the direction perpendicular to the semiconductor substrate 1S is ensured by the length L1. Therefore, the wiring W1 can be formed in the state that the distance between the wiring W1 and the $O_3$-TEOS film OTS is not shortened, and therefore, the reduction in the reliability of the wiring W1 due to the $O_3$-TEOS film OTS can be avoided. Further, in the fifth embodiment, when the wiring trench WT1 is formed, the etching with using the endpoint detection is performed as described in the above-described first embodiment, and therefore, it is possible to avoid the formation of the lowermost surface of the wiring trench WT1 at a position close to the gate electrode G1 of the n-channel-type MISFET Q due to the excessively-large etching amount of the P-TEOS film PTS. As a result, the formation of the wiring W1 at a position close to the gate electrode G1 can be avoided, so that the reduction in the reliability between the gate electrode G1 and the wiring W1 can be avoided.

In the fifth embodiment, the case that the insulating film SO forming the interlayer insulating film PIL in the above-described first embodiment is further formed of the $O_3$-TEOS film OTS and the P-TEOS film PTS formed thereon has been explained, and therefore, the effect of avoiding the reduction in the reliability of the wiring W1 due to the $O_3$-TEOS film OTS can be obtained, and besides, the effects similar to the effects described in the above-described first embodiment can be obtained.

Further, in the fifth embodiment, the case that the insulating film IL2 is formed of the low dielectric constant film has been explained. However, regarding the effect of avoiding the reduction in the reliability between the wiring W1 and the gate electrode G1 or avoiding the reduction in the reliability between the wiring W1 and the $O_3$-TEOS film OTS, it is not always required to form the insulating film IL2 by the low dielectric constant film. In this case, the insulating film IL2 can be formed of, for example, a silicon oxide film as an insulating film.

By also configuring the preferable condition used when the plug PL1 and the wiring W1 are formed as the condition similar to that of the above-described first embodiment, the effects similar to those of the above-described first embodiment can be obtained, and besides, the reduction in the reliability between the $O_3$-TEOS film OTS and the wiring W1 can be avoided.

Steps after that (after the formation of the wiring W1) are similar to those of the above-described first embodiment so as to form a second-layer wiring. However, illustration and explanation thereof are omitted here.

In the fifth embodiment, the case that the semiconductor device according to the fifth embodiment is manufactured in line with the manufacturing steps of the above-described first embodiment has been explained. However, the fifth embodiment can be also applied to not only the case that the insulating film SO of the above-described first embodiment is formed of the stacked film of the $O_3$-TEOS film OTS and the P-TEOS film PTS but also the case that the insulating film SO is formed of the stacked film of the $O_3$-TEOS film OTS and the P-TEOS film in the above-described second to fourth embodiments. When the insulating film SO is formed of the stacked film of the $O_3$-TEOS film OTS and the P-TEOS film thereon in the above-described second to fourth embodiments, the above-described effects in the above-described second to fourth embodiments can be obtained, and besides, the effect of avoiding the reduction in the reliability of the wiring W1 due to the $O_3$-TEOS film OTS can be obtained.

Sixth Embodiment

In the above-described first to fifth embodiments, a wiring width of the first-layer wiring (the wiring W1) is one type. On the other hand, in a sixth embodiment, the wiring width of the first-layer wiring (wirings W1 and W1a) is two types or more. Here, the wiring width refers to a width (a dimension in a direction parallel to a main surface of the semiconductor substrate 1S) of a wiring obtained to be cut in a direction perpendicular to a direction of current flow.

The sixth embodiment will be explained below as a case that wirings having different wiring widths from each other are formed in addition to the first embodiment. Therefore, while the explanation has been made in the above-described first embodiment with reference to only the cross section A, explanations of a semiconductor device according to the sixth embodiment and a method of manufacturing the same have been explained in the sixth embodiment with reference to not only the cross section A but also a cross-sectional view taken along the line C-C illustrated in the above-described FIG. 2. Hereinafter, a cross section taken along the line C-C illustrated in the above-described FIG. 2 is referred to as a cross section C.

Figure 50:
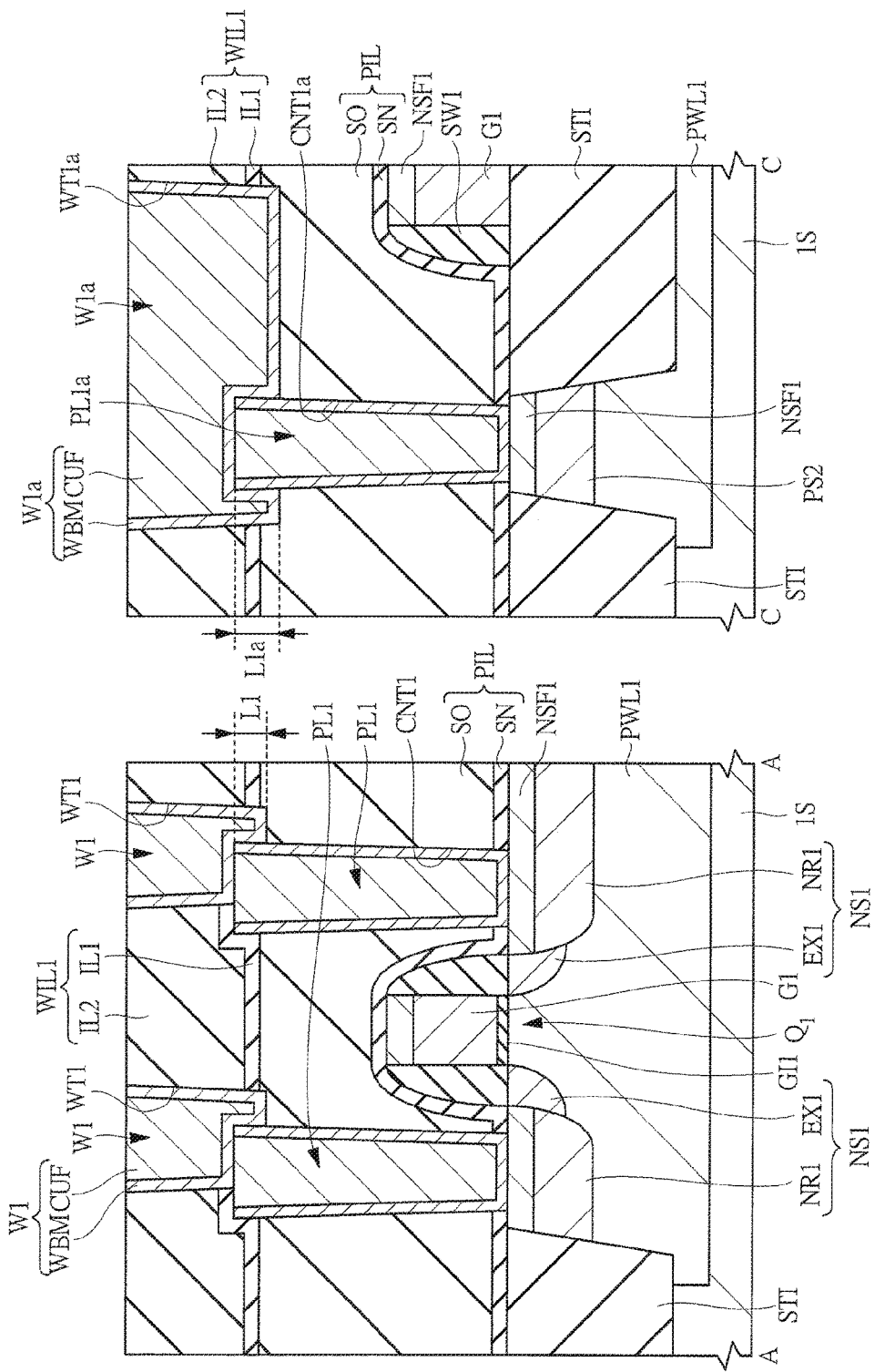
FIG. 50 is cross-sectional views of principal parts (cross-sectional views taken along a line A-A and a line C-C) of a semiconductor device according to a sixth embodiment of the present invention.

FIG. 50 is cross-sectional views of principal parts of the semiconductor device according to the sixth embodiment, and illustrates not only the cross section A (the cross section taken along the line A-A) of the above-described first embodiment illustrated in the above-described FIG. 3 but also a cross-sectional view of the cross section C (a cross-sectional view taken along the line C-C). In FIG. 50, a structure of the semiconductor device illustrated in the cross-sectional view of the cross section A (the cross section taken along the line A-A) is similar to a structure of the semiconductor device of the above-described first embodiment, and therefore, explanation thereof is omitted.

Hereinafter, the structure of the semiconductor device illustrated in the cross-sectional view of the cross section C (the cross-sectional view taken along the line C-C) in FIG. 50 will be explained.

In the cross section C, as illustrated in FIG. 50, an end portion of the gate electrode G1 of the n-channel-type MISFET $Q_1$ formed in the cross section A is formed on the element isolation region STI, and the metal silicide layer (the metal silicide film) NSF1 is formed above the gate electrode G1. Also, a p-type semiconductor region PS2 is formed so as to be interposed between the element isolation regions STI, and the metal silicide layer NSF1 is formed above the p-type semiconductor region PS2. The p-type semiconductor region PS2 is formed inside a p-type well PWL1, and therefore, the p-type well PWL1 and the p-type semiconductor region PS2 are electrically connected to each other. A plug PL1a (and a contact hole PL1a) is arranged above the metal silicide layer NSF1 formed above the p-type semiconductor region PS2, and a bottom portion of this plug PL1a is connected to the metal silicide layer NSF1 formed above the p-type semiconductor region PS2. Via this plug PL1a, a predetermined potential is supplied to the p-type semiconductor region PS2 and the p-type well PWL1. Here, the plug PL1a is a plug formed on the same layer (the interlayer insulating film PIL) in the same step as the plug PL1, and is formed inside the interlayer insulating film PIL. More specifically, a contact hole (through hole, hole) CNT1a is formed in the interlayer insulating film PIL in the same step as the contact hole CNT1a, and the plug PL1a is formed inside this contact hole CNT1a in the same step as the plug PL1. As similar to the plug PL1, the plug PL1a is also formed of the barrier conductor film PRIM and the conductor film TF.

In the sixth embodiment, as described above, the wiring width of the first-layer wiring is configured of two types or more. FIG. 50 illustrates the case that the wiring width of the first-layer wiring is two types in which the width of the wiring W1a is larger than the width of the wiring W1. Here, the wiring W1a is a wiring formed on the same layer (the first-layer wiring) in the same step as the wiring W1. Note that, for easily understanding, in the above-described FIGS. 2 and 24, the width of the wiring W1a is provided with a reference symbol W1aW so as to be represented as a width W1aW of the wiring W1a, the width of the wiring W1 is provided with a reference symbol W1W so as to be represented as a width W1W of the wiring W1, and the width W1aW of the wiring W1a is larger than the width W1W of the wiring W1 (that is, "W1aW>W1W"). In the sixth embodiment, a width (corresponding to the width W1W) of an upper surface of the wiring W1 is, for example, 50 nm, and a width (corresponding to the width W1aW) of an upper surface of the wiring W1a is, for example, 250 nm. As a wiring having a thick wiring width such as the wiring W1a, a power supply wiring for supplying a power supply voltage is exemplified. The wiring W1a is buried in the wiring trench WT1a, and is a so-called buried wiring (a damascene wiring, a single damascene wiring). The plug PL1a is partially exposed from the wiring trench WT1a, and the plug PL1a exposed from the wiring trench WT1a is in contact with and is electrically connected to the wiring W1a buried in the wiring trench WT1a. Therefore, the wiring W1a can be regarded as a buried wiring formed inside the interlayer insulating film WIL1, and a buried wiring connected to the plug PL1a.

Next, the depths of the wiring W1 and the wiring W1a will be explained. As similar to the wiring W1, the lowermost surface of the wiring W1a is formed inside the insulating film SO. However, as illustrated in FIG. 50, the lowermost surface of the wiring W1a is formed at a position lower than the lowermost surface of the wiring W1. That is, a depth of the wiring W1a is deeper than a depth of the wiring W1. The depth of the wiring W1 is, for example, 90 nm as similar to those of the above-described first to fifth embodiments. On the other hand, the depth of the wiring W1a is, for example, 105 to 110 nm.

Note that a lower surface (a bottom surface) of a portion of the wiring W1 which is not overlapped with the plug PL1 in plane forms the lowermost surface of the wiring W1, and, similarly, a lower surface (a bottom surface) of a portion of the wiring W1a which is not overlapped with the plug PL1a in plane forms the lowermost surface of the wiring W1a. Also, a lower surface (a bottom surface) of a portion of the wiring trench WT1 which is not overlapped with the plug PL1 in plane forms the lowermost surface of the wiring trench WT1, and, similarly, a lower surface (a bottom surface) of a portion of the wiring trench WT1a which is not overlapped with the plug PL1a in plane forms the lowermost surface of the wiring trench WT1a.

On the other hand, as similar to the plug PL1, the upper surface of the plug PL1a is formed at a position higher than the upper surface of the insulating film SO (the interlayer insulating film PIL). Also, as similar to the wiring W1 and the plug PL1, the lower surface of the wiring W1a (more specifically, the lowermost surface of the wiring W1a) is formed at a position lower than the upper surface of the plug PL1a. In this manner, the connection between the plug PL1a and the wiring W1a can be ensured further than that of the manufacturing step of the above-described comparative example even if the embedding amount of the wiring W1a inside the insulating film SO is decreased. Also, by increase in a surface area of the wiring W1a formed inside the insulating film IL2 which is the low dielectric constant film, the inter-wiring capacitance between the wiring W1a and other wiring can be reduced.

FIG. 50 illustrates not only the length L1 which is a length of overlap of the plug PL1 with the wiring W1 in the cross section A in the direction perpendicular to the semiconductor substrate 1S but also a length L1a which is a length of overlap of the plug PL1a with the wiring W1a in the cross section C in the direction perpendicular to the semiconductor substrate 1S. This length L1a is also a distance from the lower surface of the wiring W1a (more specifically, the lowermost surface of the wiring W1) to the upper surface of the plug PL1a.

The upper surface of the plug PL1a and the upper surface of the plug PL1 are formed at almost the same height while the lowermost surface of the wiring W1a is formed at a position lower than the lowermost surface of the wiring W1 (that is, at a position close to the semiconductor substrate 1S). Therefore, the length L1a is longer than the length L1 (that is, "L1a>L1"). That is, a distance (corresponding to the length L1) from the lower surface of the wiring W1 (more specifically, the lowermost surface of the wiring W1) to the upper surface of the plug PL1 is smaller than a distance (corresponding to the length L1a) from the lower surface of the wiring W1a (more specifically, the lowermost surface of the wiring W1) to the upper surface of the plug PL1a. Therefore, it can be said that the reliability of the connection between the plug PL1a and the wiring W1a is higher than the reliability of the connection between the plug PL1 and the wiring W1. However, since the depth of the wiring W1a formed inside the insulating film SO is deeper than the depth of the wiring W1 formed inside the insulating film SO, the distance between the gate electrode G1 and the wiring W1a is shorter than the distance between the gate electrode G1 and the wiring W1.

Figure 51:
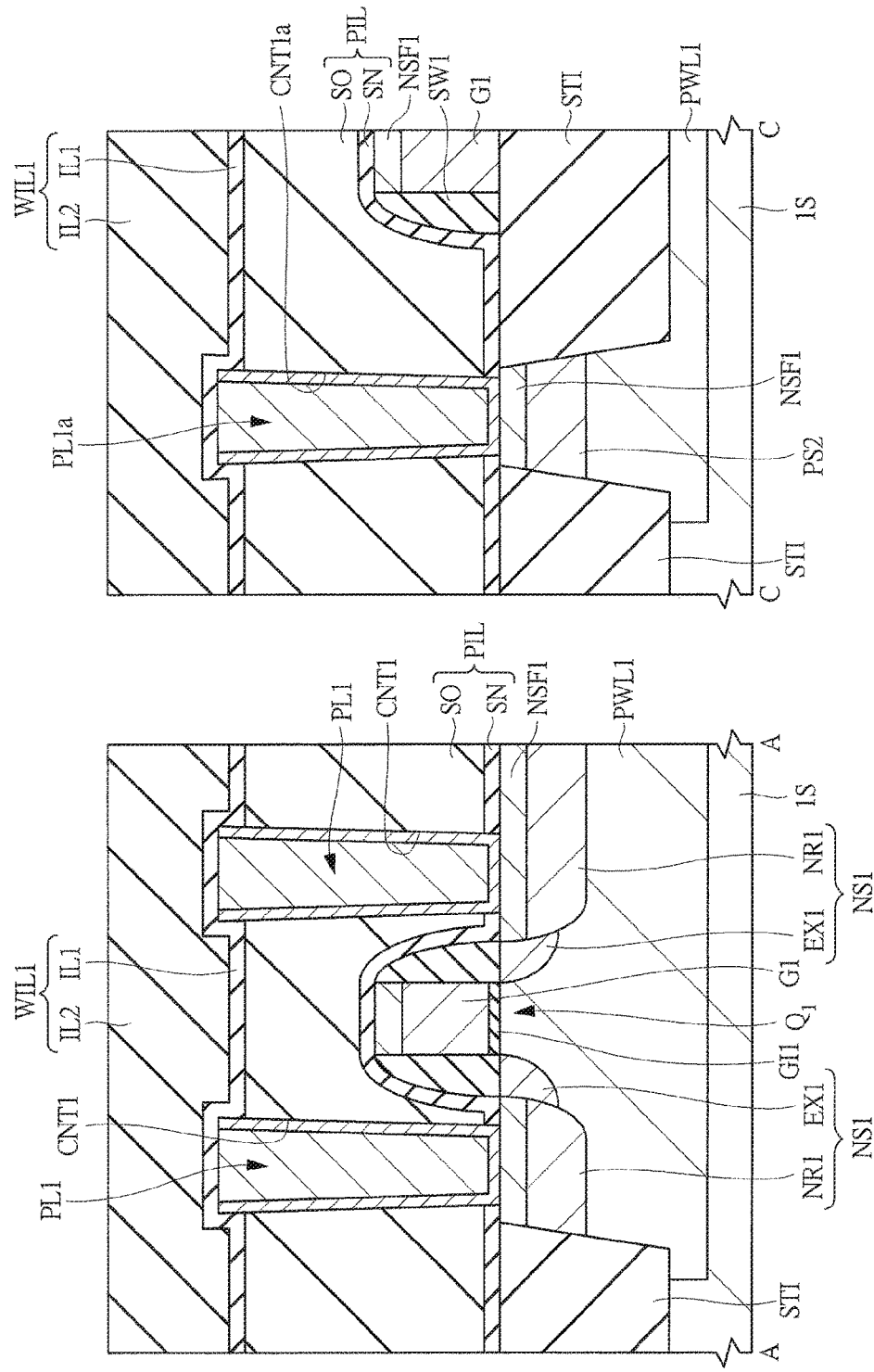
FIG. 51 is cross-sectional views of the principal parts (cross-sectional views taken along the line A-A and the line C-C) of the semiconductor device according to the sixth embodiment of the present invention in a manufacturing step thereof.
Figure 52:
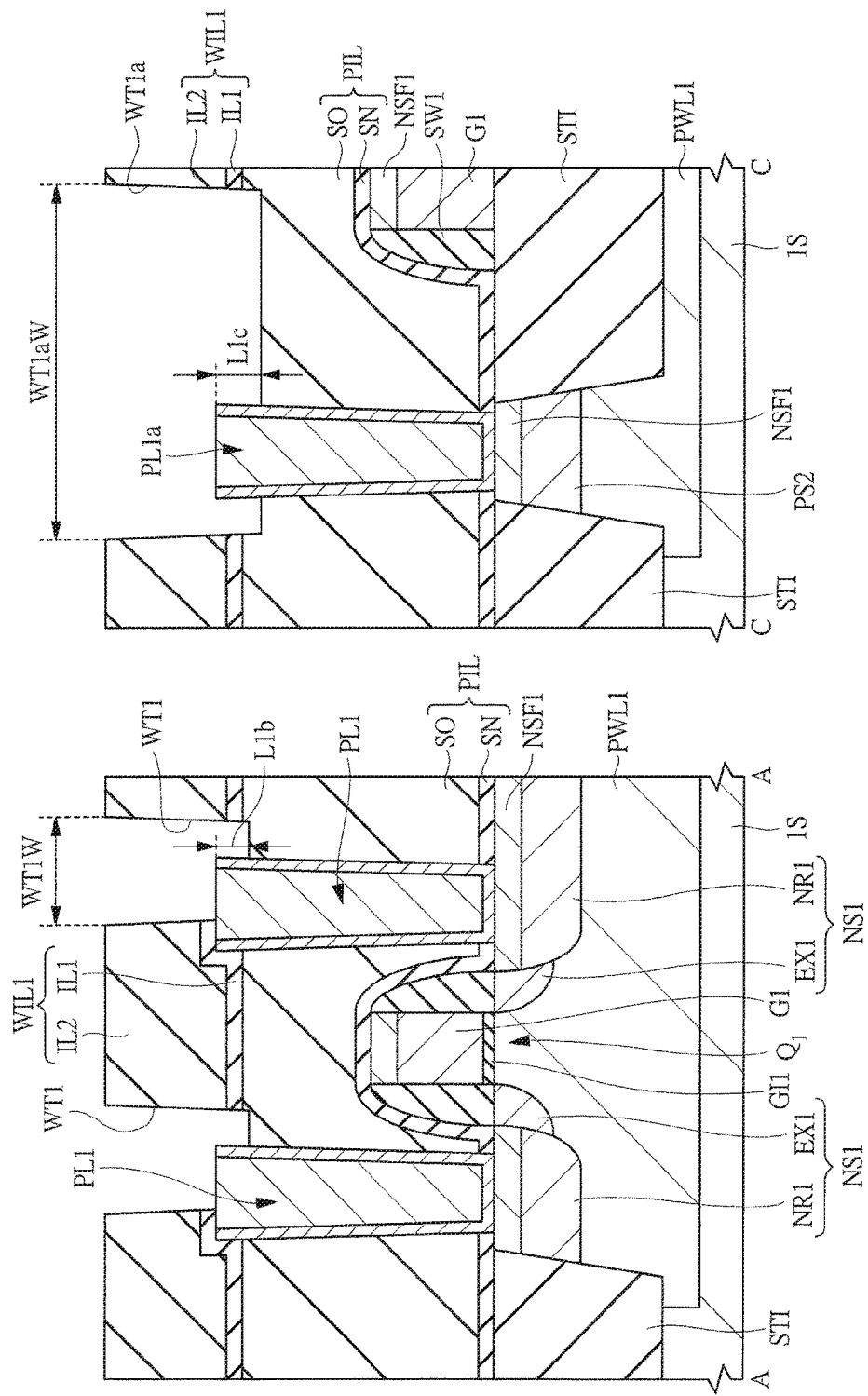
FIG. 52 is cross-sectional views of the principal parts (cross-sectional views taken along the line A-A and the line C-C) of the semiconductor device in a manufacturing step thereof continued from FIG. 51.

Hereinafter, a method of manufacturing the semiconductor device according to the sixth embodiment will be explained with reference to the drawings. FIGS. 51 and 52 are cross-sectional views of principal parts of the semiconductor device of the sixth embodiment in a manufacturing step, and illustrate cross sections corresponding to those of the above-described FIG. 50 (cross-sectional views of the cross section A and the cross section C).

Also in the sixth embodiment, the steps illustrated in FIGS. 4 to 10 of the above-described first embodiment are performed similarly to those of the above-described first embodiment. Note that not only the contact hole CNT1 but also the contact hole CNT1a are formed in the interlayer insulating film PIL in the step of the above-described FIG. 6, and the barrier conductor film PBM and the conductor film TF are formed so as to be buried inside the contact hole CNT1 and inside the contact hole CNT1a in the step of the above-described FIG. 7. Also, in the step of the above-described FIG. 8, unnecessary portions of the conductor film TF and the barrier conductor film PBM formed outside the contact holes CNT1 and CNT1a are removed by a CMP method so as to form the plug PL1 and the plug PL1a. At this time, the plug PL1a is formed of the barrier conductor film PBM and the conductor film TF buried and remaining inside the contact hole CNT1. Further, the upper surface of the insulating film SO (the interlayer insulating film PIL) is made to recede so that the upper surface of the insulating film SO (the interlayer insulating film PIL) is lower than the upper surface of the plug PL1 and the upper surface of the plug PL1a in the step illustrated in the above-described FIG. 9, and the interlayer insulating film WIL1 is formed on the interlayer insulating film PIL including portions on the plugs PL1 and PL1a in the step illustrated in the above-described FIG. 10.

Also in the sixth embodiment, note that, in the following steps, the upper surface of the insulating film SO is synonymously used with an upper surface of the interlayer insulating film PIL, and an inside of the insulating film SO is synonymously used with an inside of the interlayer insulating film PIL.

FIG. 51 illustrates the cross section A and the cross section C at the time when the step illustrated in the above-described FIG. 10 (the step of forming the interlayer insulating film WIL1) of the above-described first embodiment ends. As illustrated in FIG. 51, also in the cross section C as similar to the cross section A, the upper surface of the insulating film SO is made to recede (is lowered) from the upper surface of the plug PL1 and the upper surface of the plug PL1a, so that a part (an upper portion) of the plug PL1 and a part (an upper portion) of the plug PL1a protrude from the upper surface of the insulating film SO.

Also, the insulating film IL1 and the insulating film IL2 are formed as the interlayer insulating film WIL1 in which the first-layer wiring is formed. However, as similar to the above-described first embodiment, the insulating film IL2 is formed of a SiOC film which is a low dielectric constant film in order to reduce the inter-wiring capacitance, and the insulating film IL1 is formed of a silicon oxide film as an insulating film in order to prevent the abnormal electrical discharge caused when the insulating film IL2 is formed of the SiOC film.

In the sixth embodiment, the insulating film IL1 is formed because the manufacturing steps as similar to the manufacturing steps of the above-described first embodiment are applied. However, if it is not required to form the insulating film IL1 as in the above-described third and fourth embodiments, the interlayer insulating film WIL1 can be formed of one layer of the insulating film IL2 which is the low dielectric constant film.

Next, while wiring trenches (the wiring trenches WT1 and WT1a) are formed as similar to the step illustrated in the above-described FIG. 19 of the above-described first embodiment, not only the wiring trench WT1 in the cross section A but also the wiring trench WT1a in the cross section C are formed in the interlayer insulating film WIL1 as illustrated in FIG. 52. At this time, the wiring trenches WT1 and WT1a are formed so that the lower surface of the wiring trench WT1 (more specifically, the lowermost surface of the wiring trench WT1) is at a position lower than the upper surface of the plug PL1, and so that the lower surface of the wiring trench WT1a (more specifically, the lowermost surface of the wiring trench WT1a) is at a position lower than the upper surface of the plug PL1. A width of the wiring trench WT1a is larger than a width of the wiring trench WT1.

Note that, for easily understanding, in FIG. 52, the width of the wiring trench WT1a is provided with a reference symbol WT1aW so as to be represented as a width WT1aW of the wiring trench WT1a, the width of the wiring trench WT1 is provided with a reference symbol WT1W so as to be represented as a width WT1W of the wiring trench WT1, and the width WT1aW of the wiring trench WT1a is larger than the width WT1W of the wiring trench WT1 (that is, "WT1aW>WT1W"). Here, the width (WT1aW) of the wiring trench WT1a is equal to the width (the above-described width W1aW) of the wiring W1a buried inside the wiring trench WT1a (that is, "WT1aW=W1aW"), and the width (WT1W) of the wiring trench WT1 is equal to the width (the above-described width W1W) of the wiring W1 buried inside the wiring trench WT1 (that is, "WT1W=W1W"). Also, the lowermost surface of the wiring trench WT1a is at the same position as that of the lowermost surface W1aSF of the wiring W1a in FIG. 53 described later, and the lowermost surface of the wiring trench WT1 is at the same position as that of the lowermost surface W1SF of the wiring W1 in FIG. 53 described later.

As similar to the wiring trench WT1 in the cross section A in the above-described first embodiment, the lowermost surface of the wiring trench WT1a in the cross section C is formed inside the insulating film SO. That is, the wiring trench WT1a is formed inside the interlayer insulating film WIL1 and inside the insulating film SO. At this time, an embedding depth of a wiring trench WT1a inside the insulating film SO is larger than an embedding depth of the wiring trench WT1 inside the insulating film SO. It is considered that this is because of the following reasons.

That is, the wiring trenches WT1 and WT1a are formed by dry-etching the interlayer insulating film WIL1 and the insulating film SO by using a photoresist pattern (a patterned photoresist film) formed by a photolithography technique as a mask (an etching mask). In this dry etching step, if an opening area of a pattern to be formed is large, reactive gas used upon the dry etching tends to enter therein, and therefore, the etching tends to proceed. Also, in the process of the dry etching, because of adhesion of a polymer onto side walls of the pattern formed by the dry etching, side-wall etching is suppressed, and an opening area to be reacted is decreased as the dry-etching proceeding, and therefore, it is considered that an etching speed changes to be gradual in accordance with the opening area. However, if the opening area is large, this influence is relatively small, and therefore, it is considered that the etching tends to further proceed. That is, because the width of the wiring trench WT1a is larger than the width of the wiring trench WT1, the opening area of the wiring trench WT1a is larger than the opening area of the wiring trench WT1, and therefore, the depth of the wiring trench WT1a is deeper than the depth of the wiring trench WT1 as illustrated in FIG. 52. That is, a state that the wiring trench WT1a is embedded inside the insulating film SO deeper than the wiring trench WT1 is provided. Therefore, the lowermost surface of the wiring trench WT1a is positioned lower than the lowermost surface of the wiring trench WT1, and, when the lowermost surface of the wiring trench WT1a and the lowermost surface of the wiring trench WT1 are compared with each other, the lowermost surface of the wiring trench WT1a is formed at a position (a height) closer to the gate electrode G1. When a conductive film is buried in the wiring trench WT1 and the wiring trench WT1a in a later step so as to form the first-layer wiring, if a distance between the lower surface of the wiring trench WT1a and the gate electrode is too short, there is a possibility of the reduction in the reliability between the first-layer wiring and the gate electrode G1. Therefore, it is required to form the wiring trench WT1a so as to ensure the reliability between the first-layer wiring and the gate electrode G1 in consideration of the embedding depth inside the insulating film SO. The depth of the wiring trench WT1a is, for example, 105 to 110 nm. Also, the lowermost surface of the wiring trench WT1a is formed at a position lower than the upper surface of the plug PL1a, and besides, is formed at a position, for example, 20 to 25 nm lower than the upper surface of the insulating film SO.

The step of forming the wiring trenches WT1 and WT1a is performed similarly to the step of forming the wiring trench WT1 in the above-described first embodiment. As similar to the plug PL1, by the etching for forming the wiring trenches WT1 and WT1a, at least a part of an upper surface (an upper portion) of the plug PL1a and a part of side surfaces thereof are exposed. Note that the plug PL1 is exposed from the wiring trench WT1, and note that the plug PL1a is exposed from the wiring trench WT1a. Therefore, when the conductive film is buried in the wiring trench WT1a in a later step, the plug PL1a and the conductive film buried in the wiring trench WT1a can be reliably connected to each other.

On the other hand, by the step illustrated in the above-described FIG. 8 of the above-described first embodiment, the plug PL1 and the plug PL1a are formed at almost the same height as each other. However, as described above, when the lowermost surface of the wiring trench WT1a and the lowermost surface of the wiring trench WT1 are compared with each other, the lowermost surface of the wiring trench WT1a is formed at a position lower than the lowermost surface of the wiring trench WT1. Therefore, a distance of a portion of the side surfaces of the plug PL1a which is exposed from the wiring trench WT1a (although a distance in the direction perpendicular to the semiconductor device 1S) is larger than a distance of a portion of the side surfaces of the plug PL1 which is exposed from the wiring trench WT1 (although a distance in the direction perpendicular to the semiconductor device 1S). That is, a distance L1b from the lower surface of the wiring trench WT1 (more specifically, the lowermost surface of the wiring trench WT1) to the upper surface of the plug PL1 is smaller than a distance L1c from the lower surface of the wiring trench WT1a (more specifically, the lowermost surface of the wiring trench WT1a) to the upper surface of the plug PL1a (that is, "L1b<L1c"). This distance L1b indicates the above-described length L1 obtained after the formation of the wiring W1 (that is, "L1b=L1"), and this distance L1c corresponds to the above-described length L1a obtained after the formation of the wiring W1a (that is, "L1c=L1a").

In this step, after the dry etching for forming the wiring trenches WT1 and WT1a, there is a possibility that the insulating film IL1 remains on side walls of the plugs PL1 and PL1a to be exposed from the wiring trenches WT1 and WT1a. However, if it remains, it is preferred to remove the insulating film IL1 remaining on the side walls of the plugs PL1 and PL1a by performing wet etching or others after this dry etching so as to expose the side surfaces of the plugs PL1 and PL1a from the wiring trenches WT1 and WT1a. In this manner, an exact connection between the wirings W1 and W1a to be formed in a later step and the plugs PL1 and PL1a can be ensured.

Next, as similar to the steps illustrated in the above-described FIGS. 20 and 21A of the above-described first embodiment, the wirings W1 and W1a are formed as illustrated in the above-described FIG. 50 by forming the barrier conductor film WBM and the conductor film CUF so as to be buried inside the wiring trenches WT1 and WT1a, and removing unnecessary portions of the conductor film CUF and the barrier conductor film WBM formed outside the wiring trenches WT1 and WT1a by using a CMP method. The wiring W1 is formed of the conductor film CUF and the barrier conductor film WBM buried and remaining inside the wiring trench WT1, and the wiring W1a is formed of the conductor film CUF and the barrier conductor film WBM buried and remaining in the wiring trench WT1a. Since a part of the plug PL1a is exposed from the wiring trench WT1a, the wiring W1a buried in that wiring trench WT1a is connected to the plug PL1a. Also, since a part of the plug PL1 is exposed from the wiring trench WT1, the wiring W1 buried in that wiring trench WT1 is connected to the plug PL1.

The depth of the wiring W1a is similar to the depth of the wiring trench WT1a, which is, for example, 105 to 110 nm, in which the lowermost surface of the wiring W1a is positioned lower than the upper surface of the plug PL1a, and besides, is positioned, for example, 20 to 25 nm lower than the upper surface of the insulating film SO. The lowermost surface of the wiring trench WT1a is formed at a position (height) closer to the gate electrode G1 than the lowermost surface of the wiring trench WT1, and therefore, the lowermost surface of the wiring W1a is formed at a position (height) closer to the gate electrode G1 than the lowermost surface of the wiring W1. However, also in the sixth embodiment, by forming the plug PL1 so as to protrude from the insulating film SO as similar to the above-described first embodiment, the connection between the plug PL1 and the wiring W1 can be ensured even if the depth of the portion of the wiring W1 which is formed inside the insulating film SO is decreased, and therefore, the depth of the portion of the wiring W1a formed in the same step as that of the wiring W1 and formed inside the insulating film SO is decreased. Therefore, also in the sixth embodiment, surface areas of the wirings W1 and W1a inside the insulating film IL2 which is the low dielectric constant film are larger than that in the case of the manufacturing step of the above-described comparative example, and therefore, the increase in the inter-wiring capacitance can be avoided.

Also, as similar to the wiring W1, the depth of the portion of the wiring W1a which is formed inside the insulating film SO is also decreased, and therefore, the shortening of the distance between the wiring W1 and the gate electrode G1 is avoided simultaneously with avoiding the shortening of the distance between the wiring W1a and the gate electrode G1. Therefore, the reduction in the reliability between the wiring W1 and the gate electrode G1 and the reduction in the reliability between the wiring W1a and the gate electrode G1 can be avoided. In the sixth embodiment, the case that the insulating film IL2 is formed of the low dielectric constant film has been explained. However, regarding the effect of avoiding the reduction in the reliability between the wiring W1 and the gate electrode G1 and the reduction in the reliability between the wiring W1a and the gate electrode G1, it is not always required to form the insulating film IL2 by the low dielectric constant film. In this case, the insulating film IL2 can be formed of, for example, a silicon oxide film as an insulating film.

In the sixth embodiment, the above-described effect can be obtained as long as the upper surfaces of the plug PL1 and the plug PL1a are formed so as to be even slightly higher than the upper surface of the insulating film SO as similar to those of the above-described first to fifth embodiments. Here, a more preferable condition used when the plugs PL1 and PL1a and the wirings W1 and W1a are formed will be explained.

Figure 53:
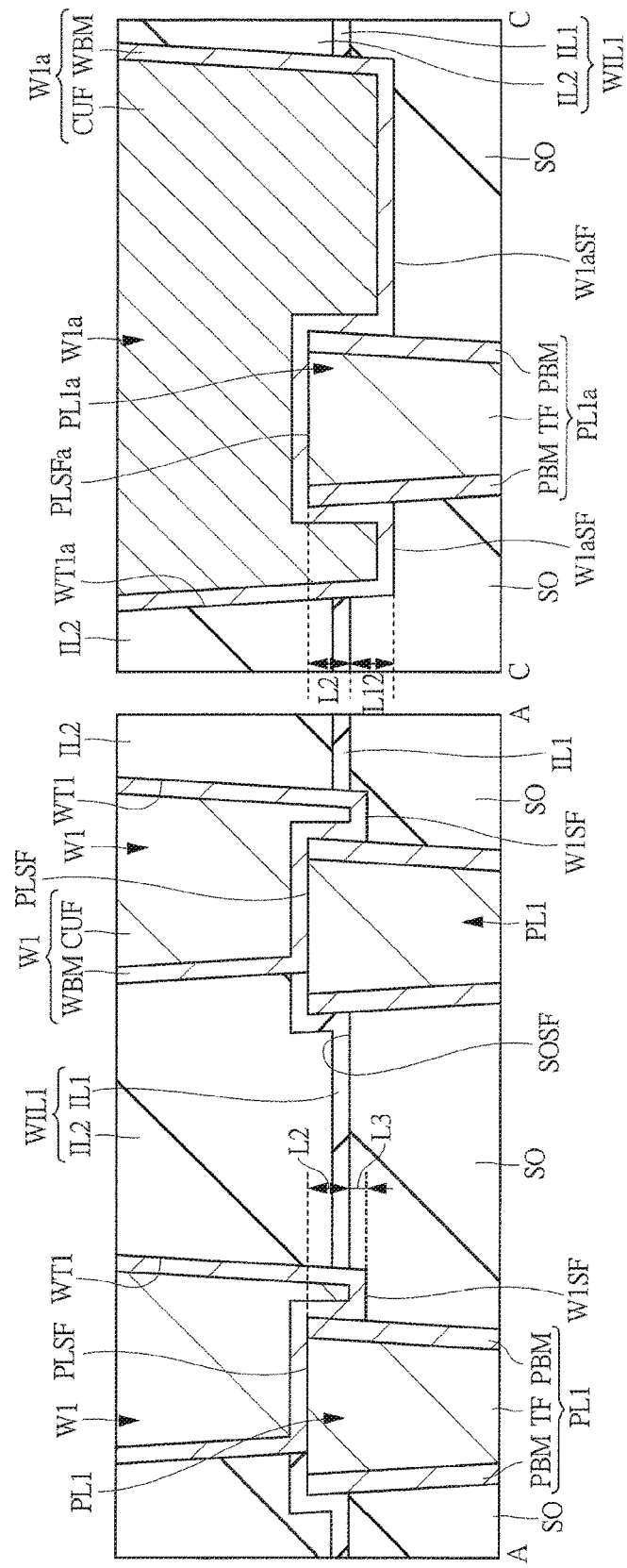
FIG. 53 is enlarged cross-sectional views of principal parts of an enlarged periphery of a region where a plug and a wiring are connected in FIG. 50.

FIG. 53 is enlarged cross-sectional views of principal parts (partially-enlarged cross-sectional views) of an enlarged periphery of a region in which the plug PL1 and the wiring W1 are connected to each other and an enlarged periphery of a region in which the plug PL1a and the wiring W1a are connected to each other in FIG. 50. Hereinafter, with reference to FIG. 53, a more preferable condition for the formation of the plugs PL1 and PL1a and the wirings W1 and W1a will be explained.

The conditions for the length L2 and the length L3 for the plug PL1 and the wiring W1 are similar to the conditions explained in the above-described first embodiment, and the similar effect can be achieved. Therefore, explanation thereof is omitted here.

For the plug PL1a and the wiring W1a, the length L2 is similar to the length L2 of the above-described first embodiment, and indicates a distance (a length) from the upper surface of the insulating film SO to the upper surface of the plug PL1a. That is, a distance (a length) by which the plug PL1a protrudes from the position of the upper surface of the insulating film SO is set as the length L2. That is, the length L2 is common between the plug PL1 and the plug PL1a. In the case of the plug PL1, the distance from the upper surface of the insulating film SO to the upper surface of the plug PL1 corresponds to the length L2. In the case of the plug PL1a, the distance from the upper surface of the insulating film SO to the upper surface of the plug PL1a corresponds to the length L2. Meanwhile, the length L12 is a distance (a length) from the lowermost surface of the wiring W1a to the upper surface of the insulating film SO. Here, in the sixth embodiment, addition of the length L2 and the length L3 corresponds to the above-described length L1 (that is, "L1=L2+L3"), and addition of the length L2 and the length L12 corresponds to the above-described length L1a (that is, "L1a=L2+L12").

Note that, for easily understanding, in FIG. 53, the upper surface of the insulating film SO is provided with a reference symbol SOSF so as to be represented as an upper surface SOSF of the insulating film SO, the upper surface of the plug PL1 is provided with a reference symbol PLSF so as to be represented as an upper surface PLSF of the plug PL1, and the upper surface of the plug PL1a is provided with a reference symbol PLSFa so as to be represented as an upper surface PLSFa of the plug PL1a. Further, in FIG. 53, the lowermost surface of the wiring W1 is provided with a reference symbol W1SF so as to be represented as the lowermost surface W1SF of the wiring W1, and the lowermost surface of the wiring W1a is provided with a reference symbol W1aSF so as to be represented as the lowermost surface W1aSF of the wiring W1a.

As described above, the lowermost surface of the wiring W1a is formed at a position lower than the lowermost surface of the wiring W1. However, also in this case, it is desired in the plug PL1a and the wiring W1a that a relation of "L2>L12" is established between the length L2 and the length L12 (that is, it is desired that the length L2 is larger than the length L12). By establishing the relation of "L2>L12", the connection between the plug PL1a and the wiring W1a in the direction perpendicular to the semiconductor substrate 1S can be ensured as avoiding the increase in the forming amount of the wiring W1a so as to be embedded inside the insulating film SO (that is, an amount corresponding to the length L12). Also, by avoiding the increase in the embedding amount of the wiring W1a inside the insulating film SO (that is, the amount corresponding to the length L12), the ratio of the portion of the wiring W1a which is formed inside the insulating film IL2 which is the low dielectric constant film is increased. In other words, by avoiding the increase in the forming amount of the wiring W1a inside the insulating film SO (that is, the amount corresponding to the length L12), an area where the wiring W1a and the insulating film IL2 which is the low dielectric constant film are in contact with each other can be increased. Therefore, for example, the inter-wiring capacitance between the wiring W1a and other wiring which is formed in vicinity of the wiring W1a can be reduced. Also, since the shortening of the distance between the wirings W1/W1a and the gate electrode G1 is avoided, the reduction in the reliability between the wirings W1/W1a and the gate electrode G1 can be avoided. More particularly, by shortening the length L12 as small as possible, the portion of the amount of the wiring W1a which is formed inside the insulating film SO can be decreased, and therefore, the inter-wiring capacitance can be further effectively reduced. In the sixth embodiment, by the formation under a condition of, for example, a relation of "L12=20 to 25 nm", the above-described condition (the relation of "L2>L12") is satisfied.

Steps after that (after the formation of the wirings W1 and W1a) are similar to those of the above-described first embodiment so as to form a second-layer wiring. However, illustration and explanation thereof are omitted here.

According to the sixth embodiment, after the polishing for forming the plug PL1 ends, the upper surface (the surface) of the insulating film SO is made to recede so that the upper surfaces of the plugs PL1 and PL1a are higher than the upper surface of the insulating film SO, so that the connection between the plug PL1 and the wiring W1 and the connection between the plug PL1a and the wiring W1a in the direction perpendicular to the semiconductor substrate 1S can be ensured even if the embedding amounts of the wirings W1 and W1a to be formed later inside the insulating film SO are less than that in the case of the manufacturing step of the above-described comparative example. Further, by forming the wiring W1 and the wiring W1a so as not to be embedded inside the insulating film SO deeper than those in the case of the manufacturing step of the above-described comparative example, the surface areas of the wiring W1 and the wiring W1a inside the insulating film IL2 which is the low dielectric constant film is increased, and therefore, the increase in the inter-wiring capacitance can be avoided even if the microfabrication of the wiring structure is achieved.

In the sixth embodiment, the case that the semiconductor device according to the sixth embodiment is manufactured in accordance with the manufacturing steps of the above-described first embodiment. However, the sixth embodiment can be also applied to not only a case that another wiring having a different wiring width (a wiring corresponding to the wiring W1a) is further formed in the above-described first embodiment but also a case that another wiring having a different wiring width (a wiring corresponding to the wiring W1a) is further formed in the above-described second to fourth embodiments.

Figure 54:
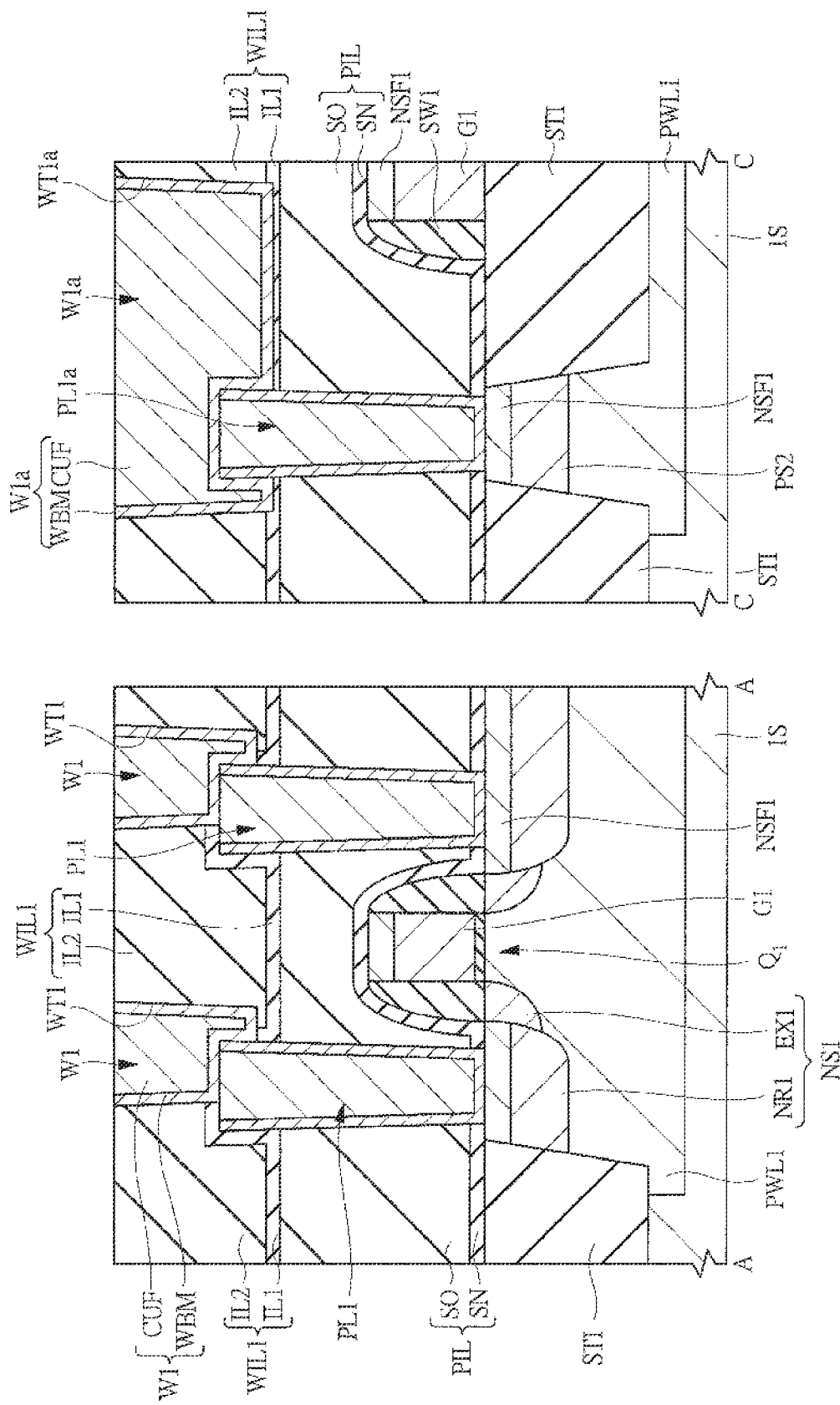
FIG. 54 is cross-sectional views of principal parts (cross-sectional views taken along a line A-A and a line C-C) of a semiconductor device according to the sixth embodiment of the present invention as a first modification example.
Figure 55:
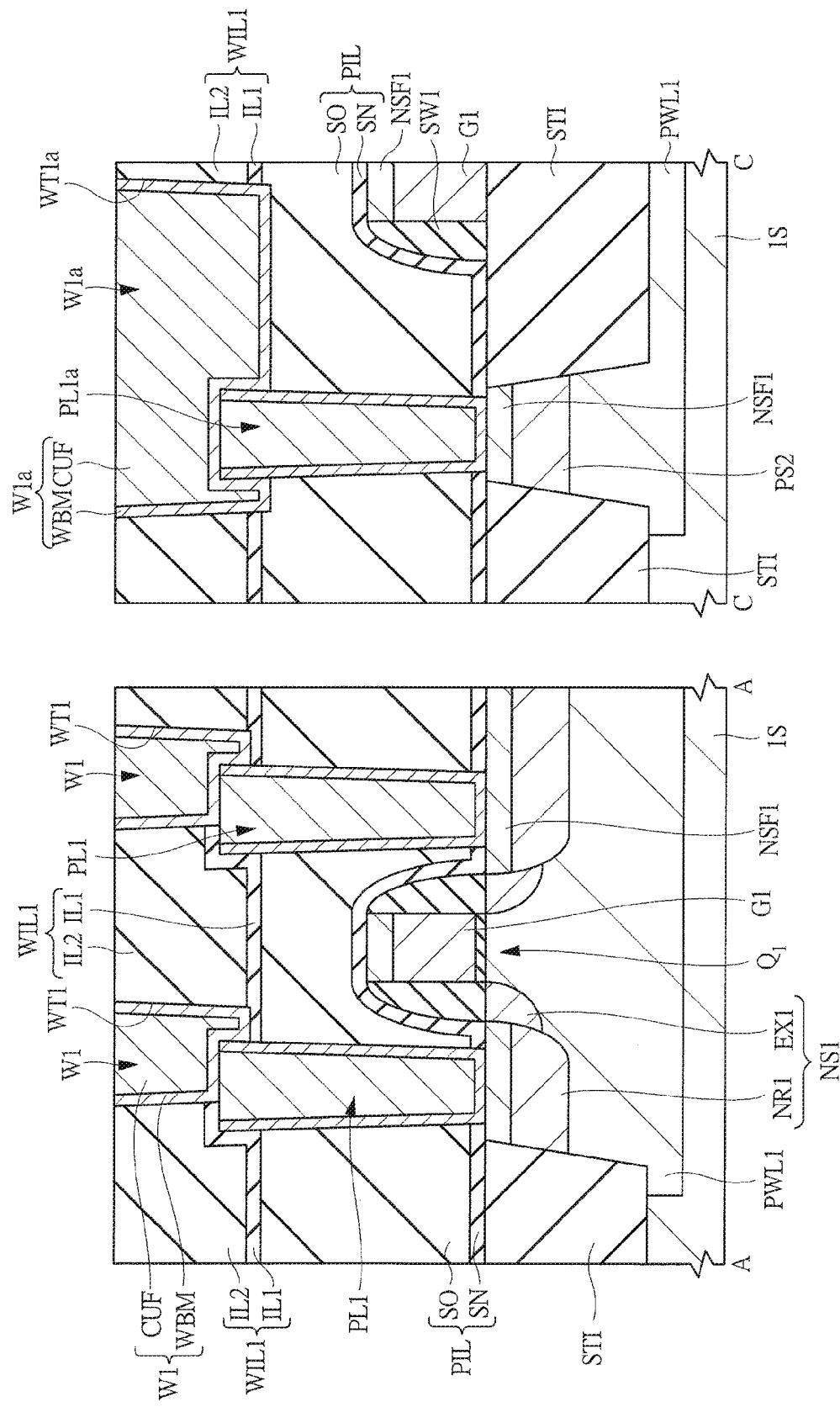
FIG. 55 is cross-sectional views of principal parts (cross-sectional views taken along a line A-A and a line C-C) of a semiconductor device according to the sixth embodiment of the present invention as a second modification example.

FIG. 54 is a cross-sectional view of a principal part of a semiconductor device of the sixth embodiment as a first modification example, and FIG. 55 is a cross-sectional view of a principal part of a semiconductor device of the sixth embodiment as a second modification example. Each of the semiconductor devices of FIGS. 54 and 55 corresponds to a semiconductor device which further has another wiring W1a with a larger wiring width than that of the wiring W1 and with the lowermost surface positioned so as to be lower than the lowermost surface of the wiring W1 in the semiconductor device of the above-described second embodiment. Both of FIGS. 54 and 55 illustrate not only the cross section A (the cross section taken along the line A-A) but also the cross-sectional view of the cross section C (the cross-sectional view taken along the line C-C), and a structure of the cross section A is the same as the structure of the cross section A of the semiconductor device of the above-described second embodiment (in the above-described FIG. 27 or 31).

In the semiconductor device of the first modification example illustrated in FIG. 54, in the cross section C, the upper surface of the plug PL1a is formed at a position higher than the upper surface of the insulating film SO, and the lowermost surface of the wiring W1a is formed at a position lower than the upper surface of the plug PL1a, and besides, is formed inside the insulating film IL1 as similar to the plug PL1 and the wiring W1 in the cross section A of the above-described second embodiment, so that effects similar to those of the above-described second embodiment can be obtained.

On the other hand, in the second semiconductor device illustrated in FIG. 55, in the cross section C, the upper surface of the plug PL1a is formed at a position higher than the upper surface of the insulating film SO, and the lowermost surface of the wiring W1a is formed at a position lower than the upper surface of the plug PL1a, and besides, is formed inside the insulating film SO as similar to the plug PL1 and the wiring W1 in the cross section A of the above-described first embodiment, so that effects similar to those of the above-described first embodiment can be obtained. Note that the structures of the cross section A in FIGS. 54 and 55 may be the same as the structure of the above-described FIG. 27 of the above-described second embodiment or the structure of the above-described FIG. 31 of the above-described second embodiment.

Figure 56:
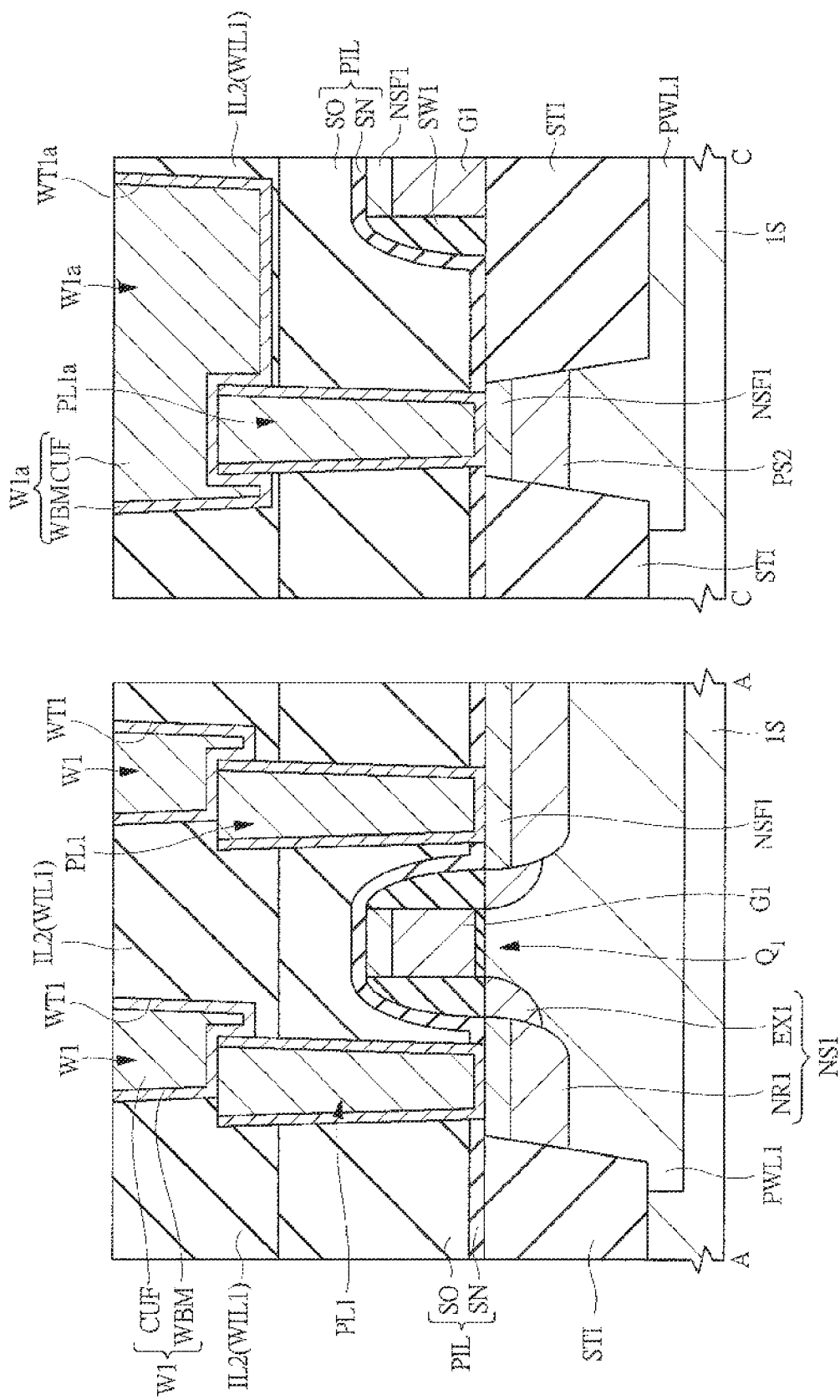
FIG. 56 is cross-sectional views of principal parts (cross-sectional views taken along a line A-A and a line C-C) of a semiconductor device according to the sixth embodiment of the present invention as a third modification example.
Figure 57:
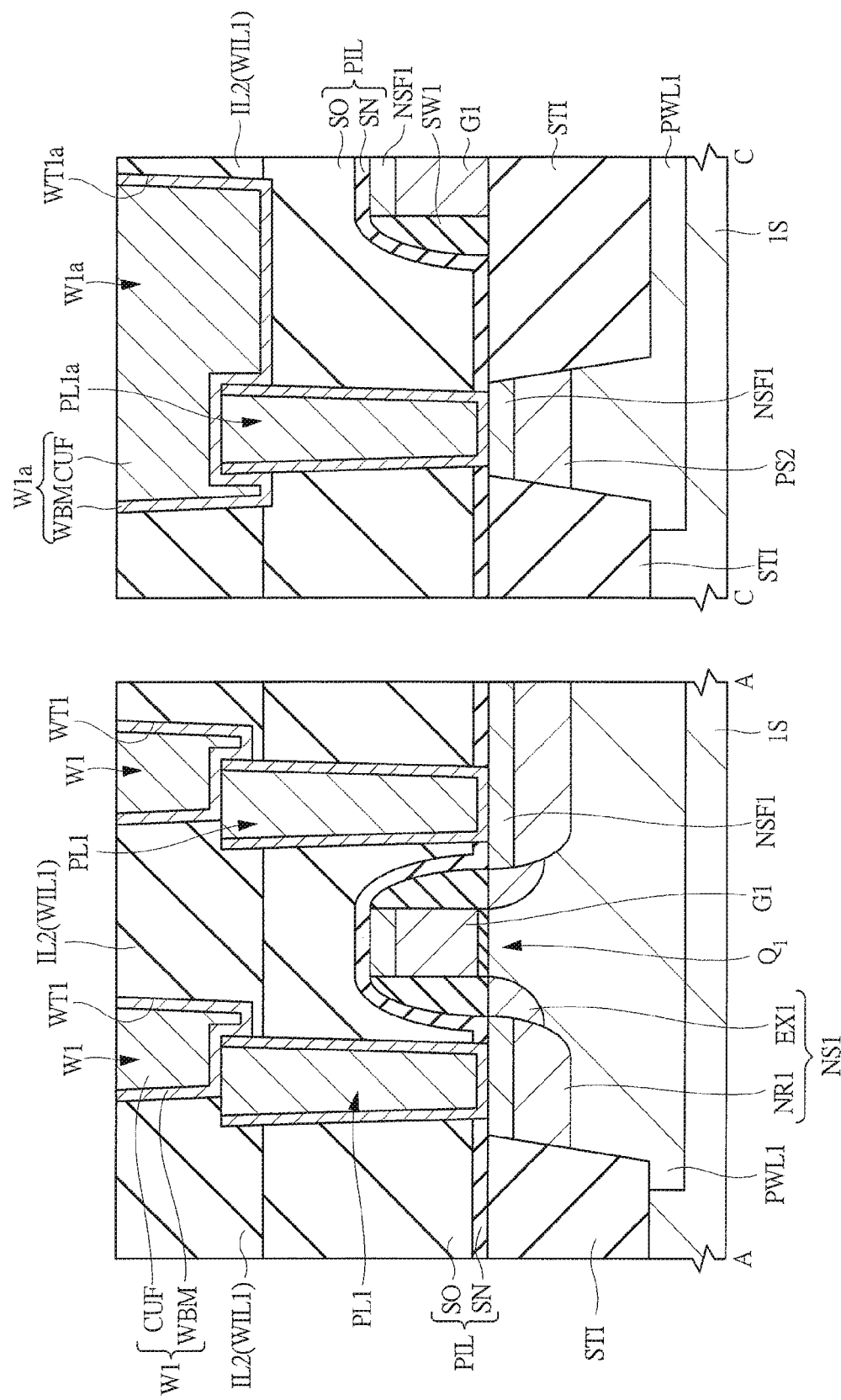
FIG. 57 is cross-sectional views of principal parts (cross-sectional views taken along a line A-A and a line C-C) of a semiconductor device according to the sixth embodiment of the present invention as a fourth modification example.

FIG. 56 is a cross-sectional view of a principal part of a semiconductor device of the sixth embodiment as a third modification example, and FIG. 57 is a cross-sectional view of a principal part of a semiconductor device of the sixth embodiment as a fourth modification example. Each of the semiconductor devices of FIGS. 56 and 57 corresponds to a semiconductor device which further has another wiring W1a with a larger wiring width than that of the wiring W1 and with the lowermost surface positioned so as to be lower than the lowermost surface of the wiring W1 in the semiconductor device of the above-described third embodiment. Both of FIGS. 56 and 57 illustrate not only the cross section A (the cross section taken along the line A-A) but also the cross-sectional view of the section C (the cross-sectional view taken along the line C-C), and a structure of the cross section A is the same as the structure of the cross section A of the semiconductor device of the above-described third embodiment (in the above-described FIG. 34).

In the semiconductor device of the third modification example illustrated in FIG. 56, in the cross section C, the upper surface of the plug PL1a is formed at a position higher than the upper surface of the insulating film SO, and the lowermost surface of the wiring W1a is formed at a position lower than the upper surface of the plug PL1a, and besides, is formed inside the insulating film IL2 as similar to the plug PL1 and the wiring W1 in the cross section A of the above-described third embodiment, so that effects similar to those of the above-described third embodiment can be obtained.

On the other hand, in the second semiconductor device illustrated in FIG. 57, in the cross section C, the upper surface of the plug PL1a is formed at a position higher than the upper surface of the insulating film SO, and the lowermost surface of the wiring W1b is formed at a position lower than the upper surface of the plug PL1a, and besides, is formed inside the insulating film SO as similar to the plug PL1 and the wiring W1 in the cross section A of the above-described fourth embodiment, so that effects similar to those of the above-described fourth embodiment can be obtained.

Figure 58:
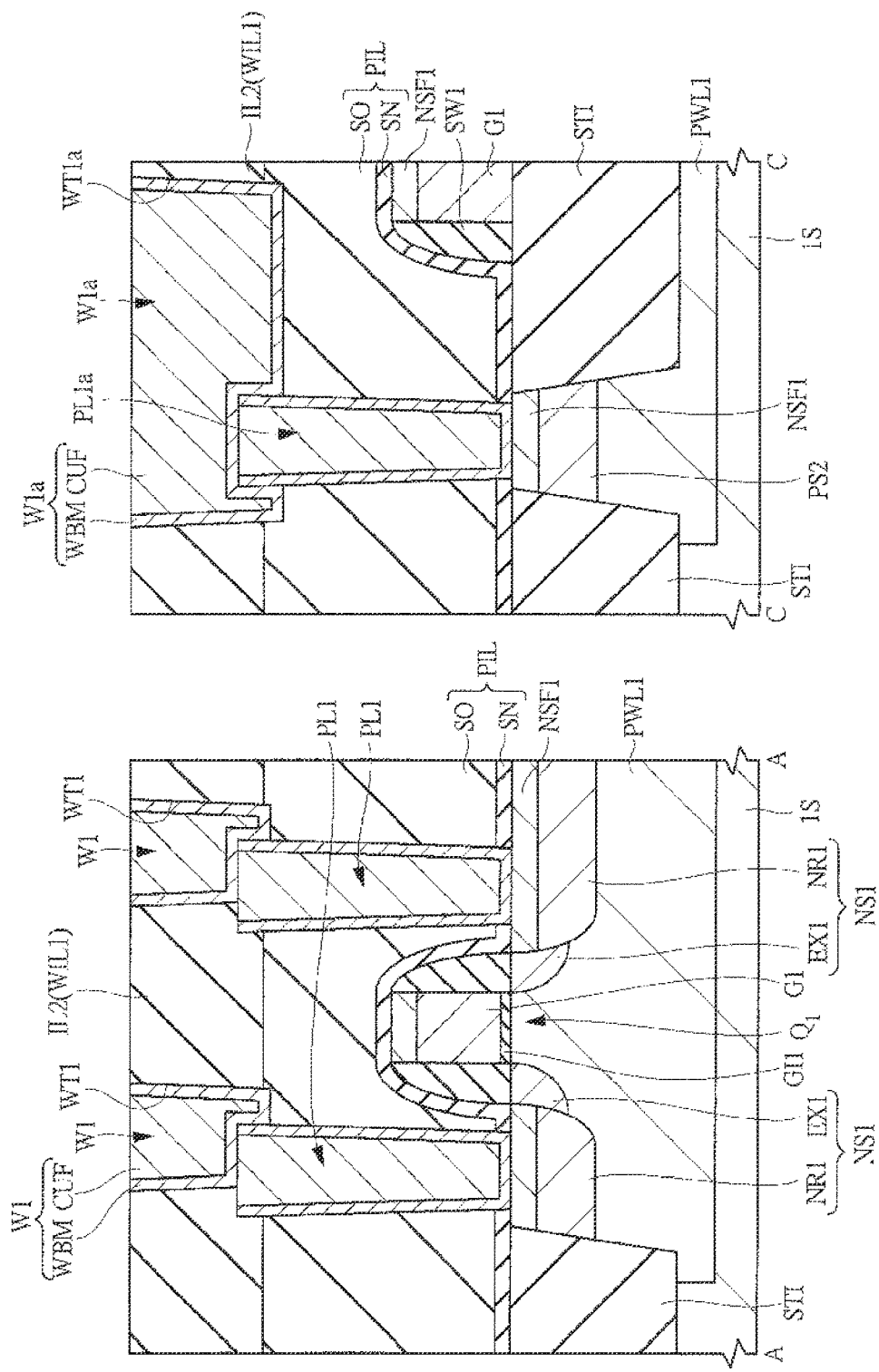
FIG. 58 is cross-sectional views of principal parts (cross-sectional views taken along a line A-A and a line C-C) of a semiconductor device according to the sixth embodiment of the present invention as a fifth modification example.

FIG. 58 is a cross-sectional view of a principal part of a semiconductor device of the sixth embodiment as a fifth modification example. The semiconductor device of FIG. 58 corresponds to a semiconductor device which further has another wiring W1a with a larger wiring width than that of the wiring W1 and with the lowermost surface positioned so as to be lower than the lowermost surface of the wiring W1 in the semiconductor device of the above-described fourth embodiment. FIG. 58 illustrates not only the cross section A (the cross section taken along the line A-A) but also the cross-sectional view of the section C (the cross-sectional view taken along the line C-C), and a structure of the cross section A is the same as the structure of the cross section A of the semiconductor device of the above-described fourth embodiment (in the above-described FIG. 39).

In the semiconductor device of the fifth modification example illustrated in FIG. 58, in the cross section C, the upper surface of the plug PL1a is formed at a position higher than the upper surface of the insulating film SO, and the lowermost surface of the wiring W1a is formed at a position lower than the upper surface of the plug PL1a, and besides, is formed inside the insulating film SO as similar to the plug PL1 and the wiring W1 in the cross section A of the above-described fourth embodiment, so that effects similar to those of the above-described fourth embodiment can be obtained.

Seventh Embodiment

In the above-described sixth embodiment, the interlayer insulating film PIL is formed of the insulating film SN and the insulating film SO thereon, and the insulating film SO may be formed of any of the $O_3$-TEOS film, the P-TEOS film, and the stacked film formed of the $O_3$-TEOS film and the P-TEOS film. On the other hand, in a seventh embodiment, the insulating film SO is formed of the stacked film of the $O_3$-TEOS film and the P-TEOS film thereon.

In the seventh embodiment, as similar to the above-described sixth embodiment, a semiconductor device and a method of manufacturing the same according to the seventh embodiment will be explained with reference to not only the cross section A but also the cross-sectional view of the cross section C.

Figure 59:
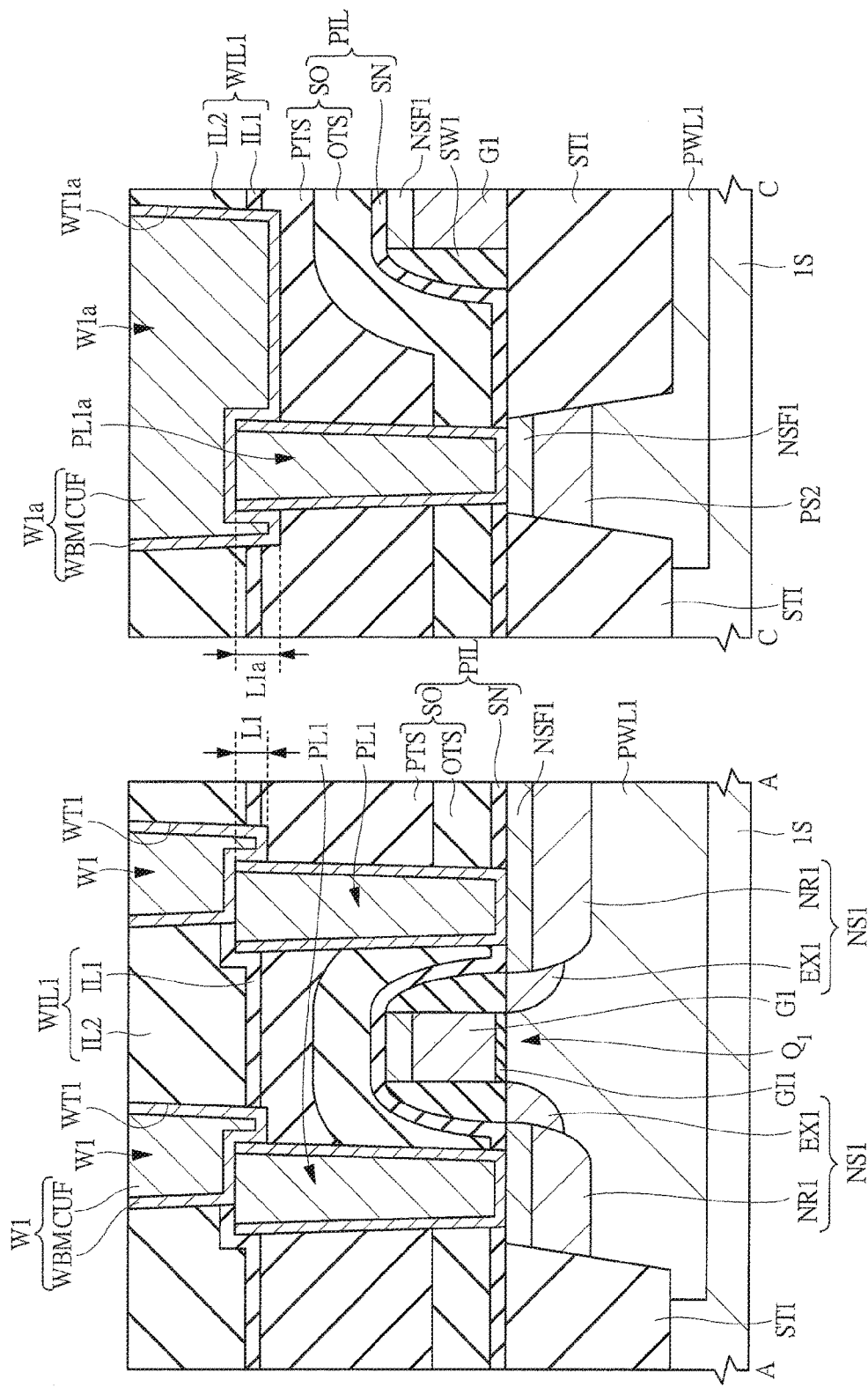
FIG. 59 is cross-sectional views of principal parts (cross-sectional views taken along a line A-A and a line C-C) of a semiconductor device according to a seventh embodiment of the present invention.

FIG. 59 is cross-sectional views of principal parts of the semiconductor device according to the seventh embodiment, and illustrates not only the cross section A (the cross section taken along the line A-A) but also the cross-sectional view of the cross section C (the cross-sectional view taken along the line C-C).

A structure of the semiconductor device of the seventh embodiment illustrated in the cross-sectional views of the cross section A and the cross section C of FIG. 59 is different from that of the semiconductor device illustrated in the cross-sectional views of the cross section A and the cross section C of the above-described FIG. 50 of the above-described sixth embodiment in that the insulating film SO is formed of the stacked film formed of the $O_3$-TEOS film OTS and the P-TEOS film PTS thereon. However, other structures of the semiconductor device of the seventh embodiment are similar to the structure of the semiconductor device of the above-described sixth embodiment.

However, as described in the above-described fifth embodiment, the insulation property of the $O_3$-TEOS film tends not to be excellent. Therefore, as illustrated in FIG. 59, it is required that the wiring W1a and the $O_3$-TEOS film OTS are not to be in contact with each other even if the lowermost surface of the wiring W1a is formed at a position (a height) closer to the $O_3$-TEOS film OTS formed on the gate electrode G1 of the n-channel-type MISFET $Q_1$ in comparing the lowermost surface of the wiring W1a with the lowermost surface of the wiring W1. By such a manner, the reliability between the wirings W1/W1a and the $O_3$-TEOS film OTS can be improved.

As the step of manufacturing the semiconductor device according to the seventh embodiment, upon the formation of the insulating film SO in the step of manufacturing the semiconductor device according to the above-described sixth embodiment, the $O_3$-TEOS film OTS is formed on the insulating film SN first, and this $O_3$-TEOS film OTS is buried between the semiconductor elements, and then, the P-TEOS film PTS is formed on the $O_3$-TEOS film OTS. By this manner, the insulating film SO is formed of the stacked film formed of the $O_3$-TEOS film OTS and the P-TEOS film PTS on the $O_3$-TEOS film OTS. Other steps are similar to the steps of manufacturing the semiconductor device of the above-described sixth embodiment, and therefore, explanation thereof is omitted here.

To the seventh embodiment, the manufacturing steps similar to those of the above-described sixth embodiment are applied, and therefore, the interlayer insulating film WIL1 of the first-layer wiring is formed of the insulating film IL1 and the insulating film IL2. However, if it is not required to form the insulating film IL1 as in the above-described third and fourth embodiments, the insulating film WIL1 can be formed of one layer of the insulating film IL2 which is the low dielectric constant film.

Also in the seventh embodiment, in a step corresponding to the above-described FIG. 48 of the above-described sixth embodiment, the upper surface of the P-TEOS film PTS is made to recede so that the upper surfaces of the plugs PL1 and PL1a are higher than the upper surface of the P-TEOS film PTS. Therefore, even if the wirings W1 and W1a are formed so that the connection length L1 between the plug PL1 and the wiring W1 in the direction perpendicular to the semiconductor substrate 1S is ensured and so that the connection length L1a between the plug PL1a and the wiring W1a in the direction perpendicular to the semiconductor substrate 1S is ensured, the embedding amounts of the wiring W1 and the wiring W1a inside the insulating film SO can be decreased further than that in the case of the manufacturing step of the above-described comparative example. Therefore, the surface areas of the wiring W1 and the wiring W1a inside the IL2 which is the low dielectric constant film are increased, and therefore, the inter-wiring capacitances for the wiring W1 and the wiring W1a can be reduced. Further, the wirings W1 and W1a can be formed so that the distance between the wirings W1/W1a and the gate electrode G1 or the distance between the wirings W1/W1a and the $O_3$-TEOS film OTS is not shortened as compared with the manufacturing step of the above-described comparative example, and therefore, the reduction in the reliability of the wirings W1/W1a for the gate electrode G1 and the $O_3$-TEOS film OTS can be avoided.

In the seventh embodiment, the case that the insulating film IL2 is formed of the low dielectric constant film has been explained. However, for achieving the effect of avoiding the reduction in the reliability between the wirings W1/W1a and the gate electrode G1 or avoiding the reduction in the reliability of the wirings W1/W1a for the gate electrode G1 and the $O_3$-TEOS film OTS, it is not always required that the insulating film IL2 is formed of the low dielectric constant film. In this case, the insulating film IL2 can be formed of, for example, a silicon oxide film as the insulating film.

By setting a preferable condition used when the wiring W1 is formed to the plug PL1 so as to be similar to the condition of the above-described sixth embodiment, effects similar to those of the above-described sixth embodiment can be obtained, and besides, the reduction in the reliability of the wirings W1/W1a with respect to the $O_3$-TEOS film OTS can be avoided.

In the seventh embodiment, the case that the insulating film SO of the semiconductor device corresponding to the above-described FIG. 50 of the above-described sixth embodiment is formed of the stacked film formed of the $O_3$-TEOS film OTS and the P-TEOS film PTS thereon has been exemplified. However, the insulating film SO of each of the semiconductor devices corresponding to the above-described FIG. 54 to 58 of the above-described sixth embodiment can be also formed of a stacked film formed of the $O_3$-TEOS film OTS and the P-TEOS film PTS thereon. Also in this case, the effects explained in the above-described sixth embodiment can be obtained, and besides, the reduction in the reliability of the wirings W1/W1a with respect to the $O_3$-TEOS film OTS can be avoided.

In the foregoing, the invention made by the present inventor has been concretely described based on the embodiments. However, it is needless to say that the present invention is not limited to the foregoing embodiments and various modifications and alterations can be made within the scope of the present invention.

INDUSTRIAL APPLICABILITY

The present invention is effectively applied to a semiconductor device and a method of manufacturing the same.

SYMBOL EXPLANATION 1S, 101S semiconductor substrate
CF101, CF102 conductive film
CNT1, CNT2, CNT101 contact hole
CUF, CUF2 conductor film
EX1, EX101 shallow impurity diffusion region
G1, G101 gate electrode
GI1, GI101 gate insulating film
IL1, IL2, IL3, IL4 insulating film
L1, L1a, L2, L3, L4, L5, L6 length
L7, L8, L9, L10, L11, L12, L101 length
L21 thickness
LM lower-layer material
ML middle layer
NR1, NR101 deep impurity diffusion region
NS1 n-type semiconductor region
NSF1, NSF101 metal silicide layer
OTS101 $O_3$-TEOS film
PBM barrier conductor film
PIL, PIL101 interlayer insulating film
PL1, PL1a, PL101, PL2 plug
PLSF, PLSFa upper surface
PS1 p-type semiconductor region
PS2 p-type semiconductor region
PTS101 plasma TEOS film
PWL1, PWL101 p-type well
$Q_1$ n-channel-type MISFET
$Q_2$ p-channel-type MISFET
SN insulating film
SN101 silicon nitride film
SO insulating film
SOSF upper surface
STI, STI101 element isolation region
SW1, SW101 sidewall
TF conductor film
TH1, TH2, TH3 through hole
UR upper-layer resist film
W1, W1a, W101 wiring
W1W, W1aW width
W1SF, W1aSF lowermost surface
WBM, WBP2 barrier conductor film
WIL1, WIL2, WIL101 interlayer insulating film
WT1, WT1a, WT2, WT101 wiring trench

What is claimed is:
1. A semiconductor device comprising;
a semiconductor substrate;
a first insulating film formed over a main surface of the semiconductor substrate;
a second insulating film formed over the first insulating film;
a first conductor formed in the first insulating film; and
a second conductor formed in the second insulating film,
wherein a part of an upper surface of the first conductor is connected to the second conductor in the second insulating film,
wherein a part of a side surface of the first conductor is connected to the second conductor in the first insulating film and the second insulating film, and
wherein a dielectric constant of the second insulating film is lower than a dielectric constant of the first insulating film.
2. The semiconductor device according to claim 1, wherein an upper surface of the first conductor is located in the second insulating film.
3. The semiconductor device according to claim 1, wherein an upper surface of the first conductor is formed higher than an upper surface of the first insulating film.

4. The semiconductor device according to claim 1,
wherein the part of the upper surface of the first conductor is connected to a part of a bottom surface of the second conductor in the second insulating film.

5. The semiconductor device according to claim 1,
wherein an entirety of the second conductor is formed in the second insulating film.

6. The semiconductor device according to claim 1,
wherein the second conductor is not formed in the first insulating film.

7. The semiconductor device according to claim 1,
wherein a dielectric constant of the second insulating film is lower than a dielectric constant of a silicon oxide.

8. The semiconductor device according to claim 1,
wherein the first conductor is formed so as to penetrate through the first insulating film,
wherein the second conductor is formed so as to be embedded a trench formed in the second insulating film, and
wherein the second conductor contains copper.

9. The semiconductor device according to claim 1,
wherein the second insulating film is formed as a single layer.

10. The semiconductor device according to claim 1,
wherein the second insulating film consists of two insulating films that are stacked and overlapped with each other.

11. The semiconductor device according to claim 1,
wherein the second insulating film extends over an entire horizontal surface of the first insulating film.

12. The semiconductor device according to claim 1,
wherein the first conductor is electrically connected with the second conductor.

* * * * *